(12) United States Patent
Hashimoto et al.

(10) Patent No.: US 7,215,567 B2
(45) Date of Patent: May 8, 2007

(54) FERROELECTRIC MEMORY DEVICE

(75) Inventors: Masami Hashimoto, Hino (JP);
Takeshi Kijima, Matsumoto (JP);
Junichi Karasawa, Shimosuwa-machi
(JP); Mayumi Ueno, Chino (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 11/216,078

(22) Filed: Sep. 1, 2005

(65) Prior Publication Data

US 2006/0056225 A1 Mar. 16, 2006

(30) Foreign Application Priority Data

Sep. 16, 2004 (JP) .............. 2004-269144

(51) Int. Cl.
*G11C 11/22* (2006.01)
(52) U.S. Cl. ...................... 365/145; 365/117
(58) Field of Classification Search ............... 365/117, 365/145
See application file for complete search history.

(56) References Cited

U.S. PATENT DOCUMENTS

| | | | |
|---|---|---|---|
| 5,515,311 A * | 5/1996 | Mihara ...................... 365/145 |
| 5,530,667 A * | 6/1996 | Omura et al. .............. 365/145 |
| 5,986,724 A * | 11/1999 | Akiyama et al. ............. 349/41 |
| 6,236,076 B1 | 5/2001 | Arita et al. |
| 6,356,475 B1 * | 3/2002 | Tamura et al. .............. 365/145 |
| 6,440,624 B2 * | 8/2002 | Nihei ........................... 430/51 |
| 6,812,509 B2 * | 11/2004 | Xu .............................. 257/295 |
| 2002/0125515 A1 * | 9/2002 | Joo et al. .................... 257/295 |
| 2004/0224180 A1 * | 11/2004 | Kijima et al. ............... 428/611 |

FOREIGN PATENT DOCUMENTS

| JP | A 2-198094 | 8/1990 |
| JP | A 5-82800 | 4/1993 |
| JP | A 11-39882 | 2/1999 |

\* cited by examiner

*Primary Examiner*—Hoai V. Ho
(74) *Attorney, Agent, or Firm*—Oliff & Berridge, PLC

(57) ABSTRACT

To provide a nondestructive-read ferroelectric memory capable of realizing high speed, high integration, and long service life.

The present invention is provided with an MFSFET 100 having a ferroelectric thin film at its gate portion, word line 104, bit line 105, and bit line 106 so as to apply voltage equal to or higher than the coercive electric field of the ferroelectric thin film between the bit line 105 and the word line 104 at first write timing and apply voltage equal to or higher than the coercive electric field between the bit line 106 and the word line 104 at second write timing, and applies voltage equal to or lower than the coercive electric field of the ferroelectric thin film between the bit line 105 and the word line 104 at first read timing to detect the current flowing between the both bit lines, and applies voltage equal to or lower than the coercive electric field between the bit line 106 and the word line 104 at second read timing to detect the current flowing between the both bit lines.

12 Claims, 33 Drawing Sheets

(0, 0)

(0, 1)

(1, 0)

(1, 1)

*F I G. 16*
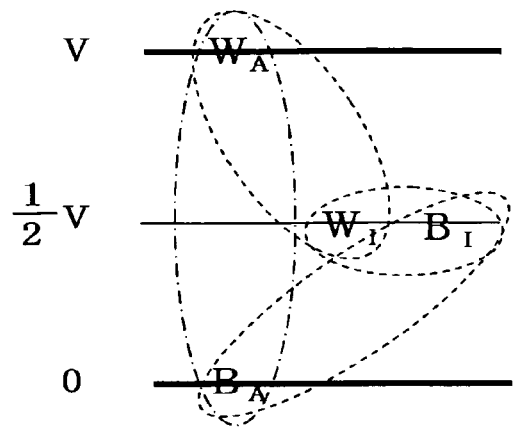
*F I G. 17*
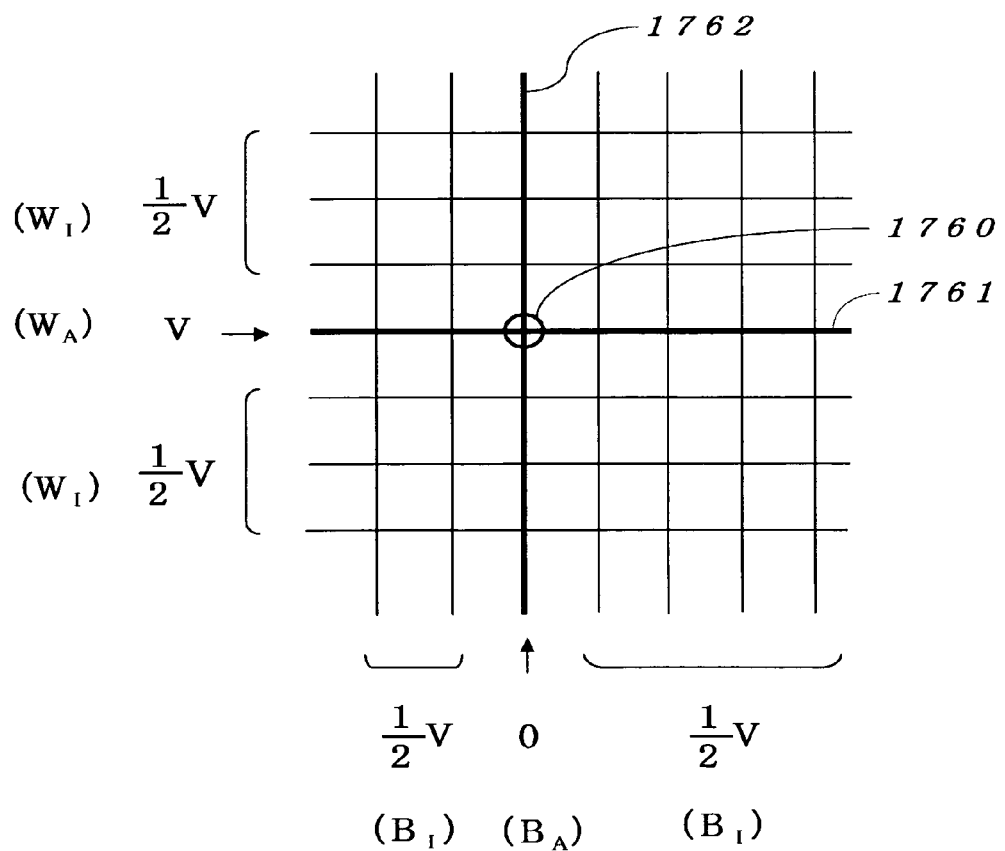

F I G. 18
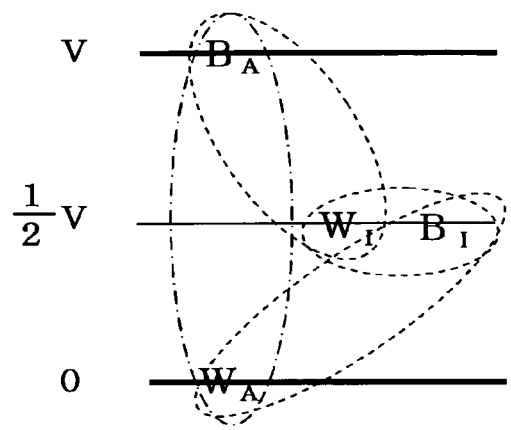
F I G. 19
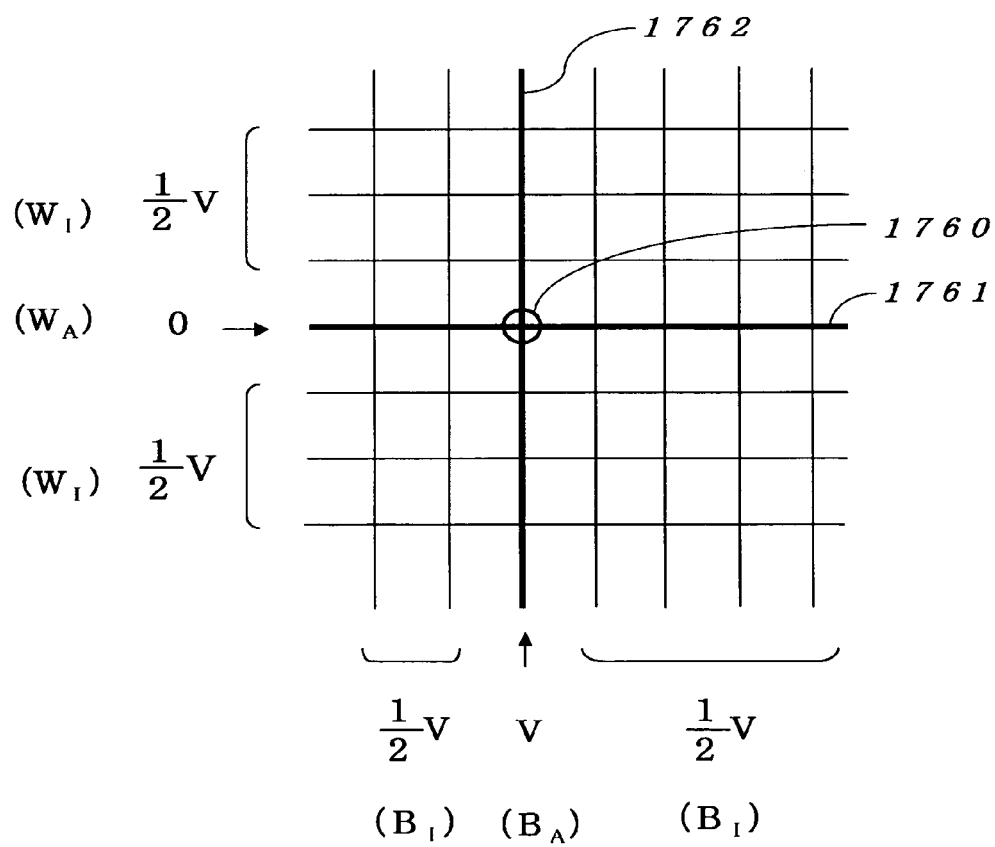

F I G. 24
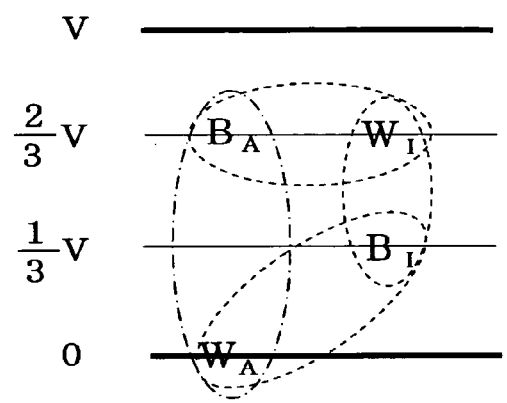
F I G. 25
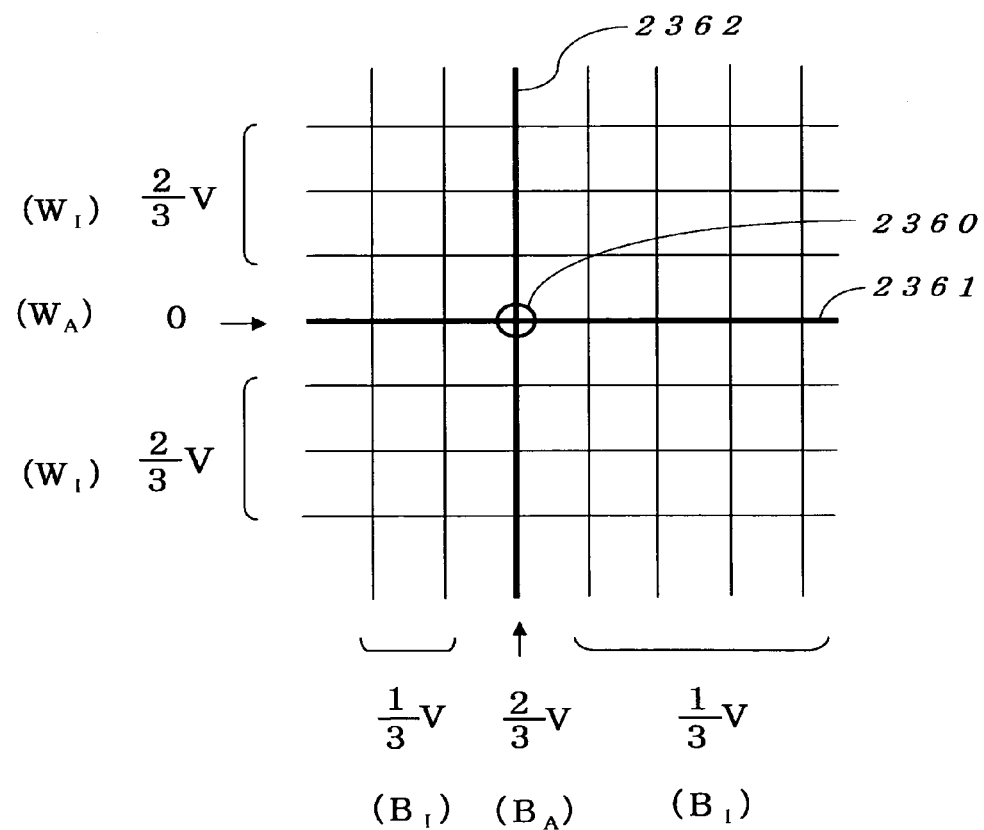

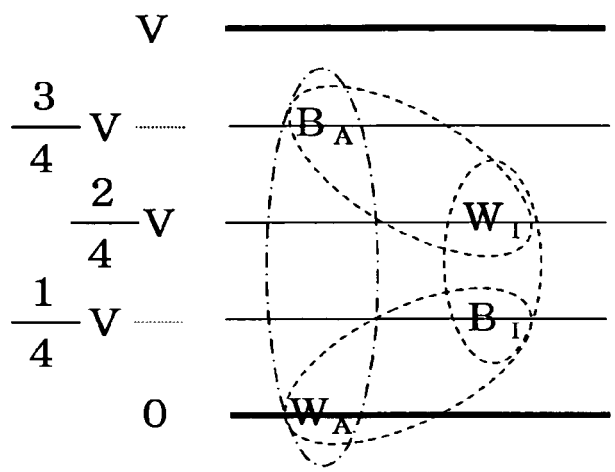
F I G. 30
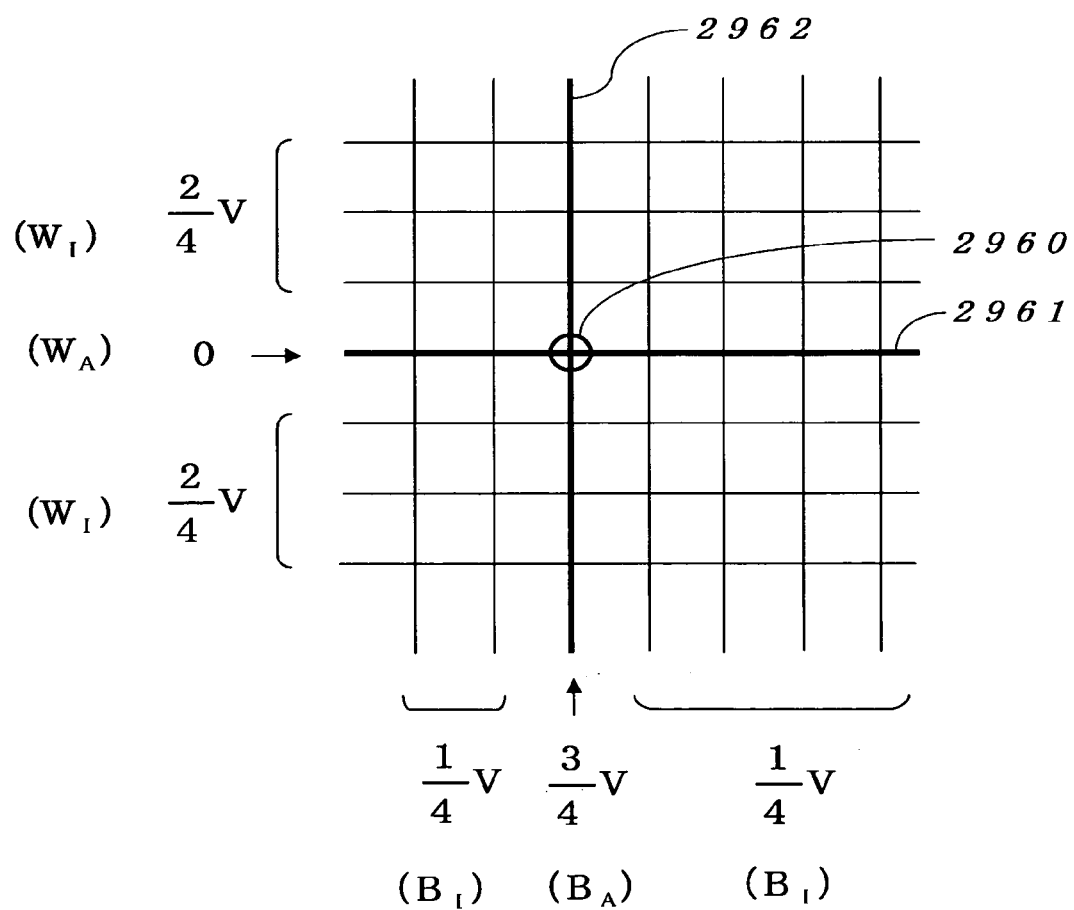
F I G. 31

F I G. 42
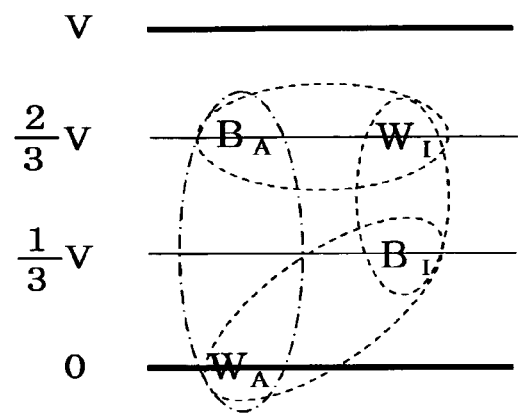
F I G. 43
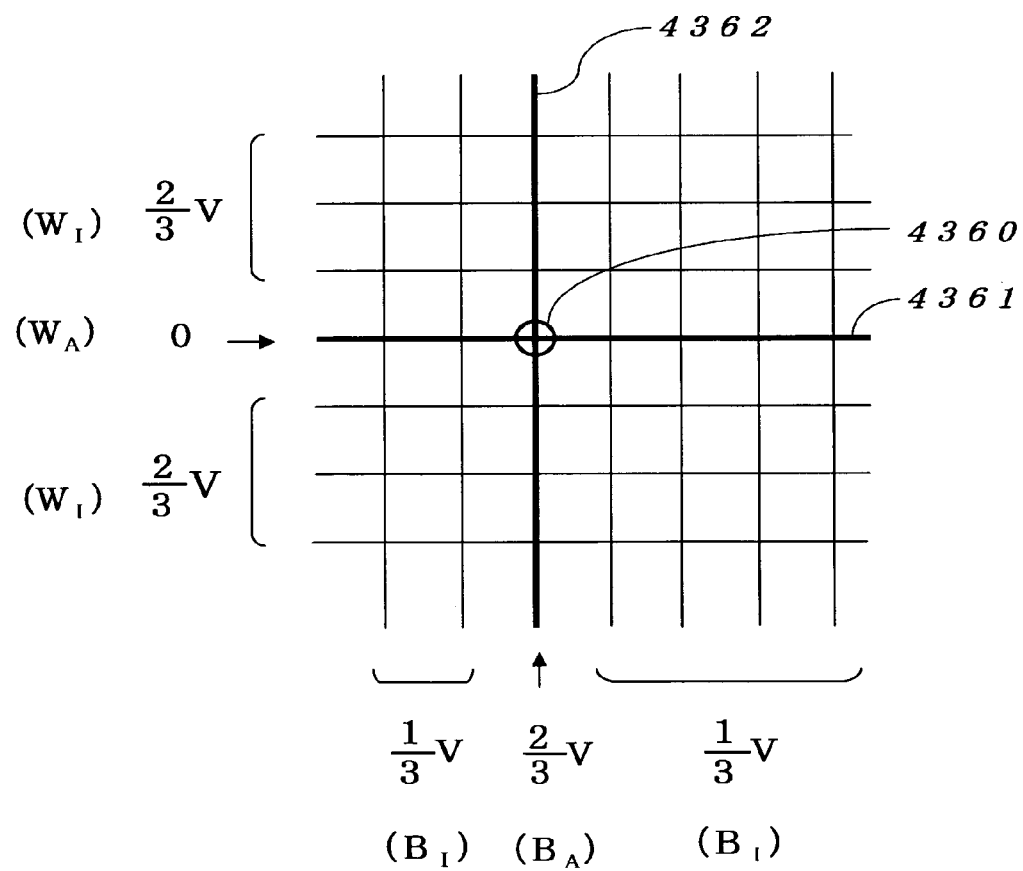

F I G. 48
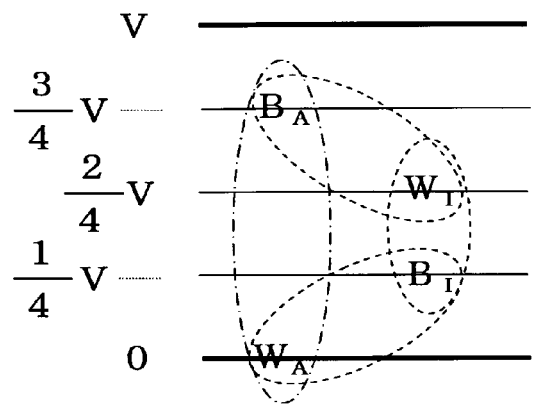
F I G. 49
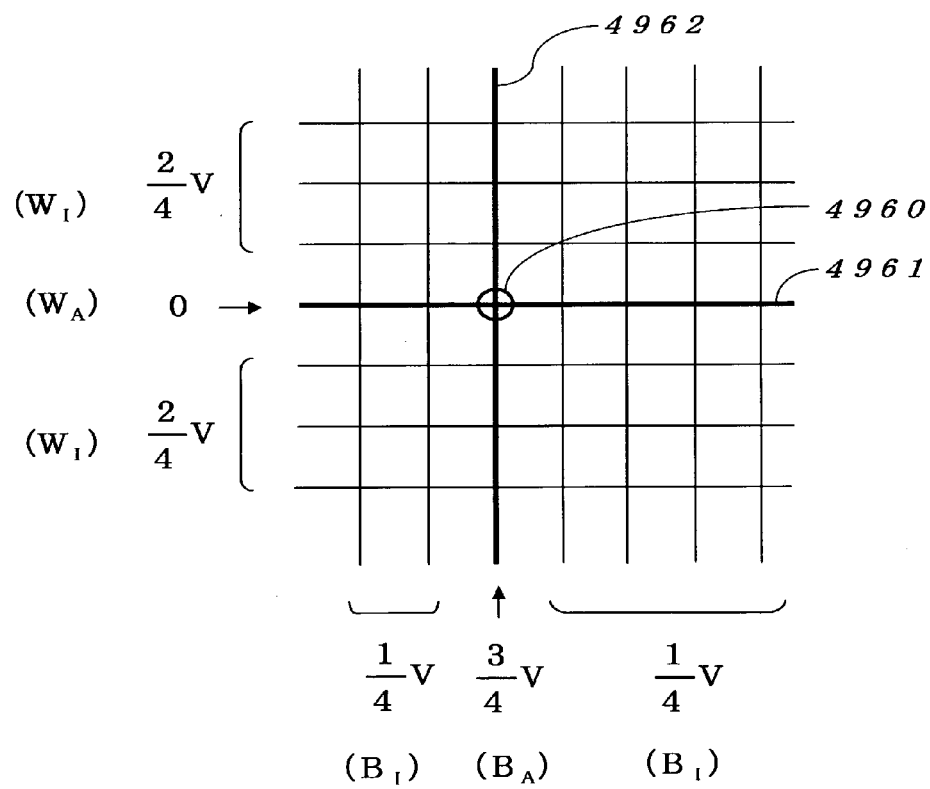

F I G. 57
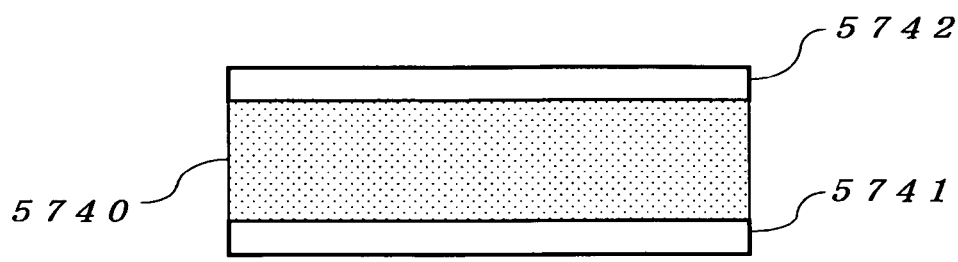
F I G. 58
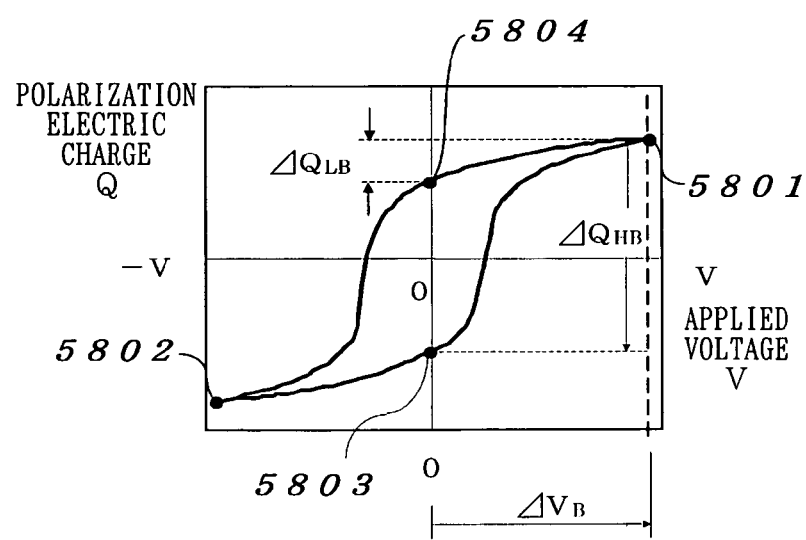

US 7,215,567 B2

FERROELECTRIC MEMORY DEVICE

BACKGROUND OF THE INVENTION

1. Field of the Invention

The present invention relates to a ferroelectric memory device serving as a nonvolatile memory for reading data without destructing the data in order to lengthen the service life for the number of read times of a memory cell and further accelerate the access time.

2. Description of the Related Art

In recent years, the significance of a nonvolatile memory in which data can be electrically written or whose data can be erased has been increased in the memory field. Though there are various types of nonvolatile memories, a ferroelectric memory is noticed from the viewpoints of high-speed performance, low-voltage characteristic, and low power consumption. There are various specific configurations of a ferroelectric memory as shown below.

A ferroelectric memory using a ferroelectric capacitor is known which defines two states in accordance with a remanent polarization state in a ferroelectric film. This capacitor detects an internal storage state of 1 or 0 by generating the internal polarization state of 1 or 0 in accordance with the way of applying two types of voltages equal to or higher than the coercive voltage of a ferroelectric thin film and having two different polarities to the ferroelectric capacitor, passing through a storage state due to remanent polarization, and applying voltage equal to or higher than the coercive electric field of the ferroelectric thin film to fetch electric charges. FIGS. 57, 58, 59 are illustrations for explaining the ferroelectric memory.

FIG. 57 is a sectional view showing a structure of a ferroelectric capacitor. As shown in FIG. 57, the ferroelectric capacitor has a structure for holding a ferroelectric thin film 5740 constituted of an inorganic ferroelectric by a first terminal 5741 constituted of a metallic electrode and a second terminal 5742 constituted of a metallic electrode.

FIG. 58 shows a polarization-charge-applied-voltage characteristic of the ferroelectric capacitor shown in FIG. 57. In FIG. 58, curved lines passing through four characteristic points 5801, 5802, 5803, and 5804 show characteristics of applied voltage V and internal polarization charge Q applied between the first terminal 5741 and the second terminal 5742 of the ferroelectric capacitor in FIG. 57.

The characteristic point 5801 shows a state of applying positive high voltage V to the second terminal 5742 from the first terminal 5741 and the characteristic point 5802 shows a state of applying positive high-voltage V to the first terminal 5741 from the second terminal 5742. At the characteristic points 5801 and 5802, internal polarization causes polarization reverse in positive and negative states.

When releasing a potential difference between the first terminal 5741 and the second terminal 5742 of the ferroelectric capacitor under the state of the characteristic point 5801 as 0, the internal polarization is kept as remanent polarization and becomes the state shown at the characteristic point 5804. Moreover, when releasing a potential difference between the first terminal 5741 and the second terminal 5742 of the ferroelectric capacitor under the state of the characteristic point 5802 as 0, internal polarization is kept as remanent polarization and becomes the state shown at the characteristic point 5803.

Thus, because the ferroelectric capacitor has the hysteresis characteristic shown in FIG. 3, it releases terminals at the both ends of a ferroelectric capacitor and has different remanent polarization depending on a previous state even if setting voltage to 0. The remanent polarization can store data by corresponding to the characteristic points 5803 and 5804.

When applying voltage V ($\Delta VB$) to the second terminal 5742 on the basis of the first terminal 5741 from a state in which the terminals at the both ends of the ferroelectric capacitor are released, the characteristic point moves to the characteristic point 5801. In this case, when the previous state is at the characteristic point 5803, electric charges of $\Delta QHB$ shown in FIG. 58 are fetched, while when it is at the characteristic point 5804, electric charges of $\Delta QLB$ are fetched. As shown in FIG. 58, because $\Delta QLB << \Delta QHB$, it is possible to determine the previous state stored as remanent polarization as 1 or 0 in accordance with the fetched number of electric charges.

The circuit shown in FIG. 59 is known as a specific circuit for performing the above operations.

As shown in FIG. 59, this circuit is constituted of a ferroelectric capacitor 5911 and an N-type insulating-gate field-effect transistor (hereafter referred to as MOSFET) 5912 and includes a word line (WL) 5913, bit line (BL) 5914, and plate line (PL) 5915. In this case, the MOSFET is an abbreviation of a Metal-Oxide-Semiconductor Field-Effect Transistor.

More minutely, the word line 5913 is connected to the gate electrode of the MOSFET 5912. The bit line 5914 is connected to an electrode serving as a source or drain of the MOSFET 5912. Moreover, the plate line 5915 is connected to one end of the ferroelectric capacitor 5911. The other end of the ferroelectric capacitor 5911 is connected to an electrode serving as a drain or source of the MOSFET 5912.

The circuit in FIG. 59 constituted as described above supplies potential to be applied to the ferroelectric capacitor 5911 to the bit line 5914 and plate line 5915 and turns on/off the MOSFET 5912 by the word line 5913 and thereby, performs the write operation and read operation of the above described electric charges.

In this case, the above method fetches electric charges when reading data. That is, because data is destructed, the above method is a method generally referred to as destructive read and an example of this method is disclosed in JP11-39882A (hereinafter referred to as Patent Document 1).

There is a method referred to as a nondestructive read in which data is not destructed when it is read. By improving a material of a ferroelectric thin film, there is a method for detecting a difference between output electric charges due to a difference between operating points when a weak voltage is applied to a ferroelectric capacitor due to a difference between inclinations of characteristics corresponding the characteristic points 6003 and 6004 shown in FIG. 60 by assuming the polarization-charge-applied-voltage hysteresis characteristic to be asymmetric as shown in FIG. 60. Examples of this method are disclosed in JP2-198094A and JP5-82800A (hereinafter referred to as Patent Documents 2 and 3).

Moreover, as shown in FIGS. 61 and 62, there is a structure in which a ferroelectric thin film 6100 is formed at the gate portion of a field-effect transistor, voltage equal to or higher than the coercive voltage of the ferroelectric thin film 6100 is applied between a gate electrode 6101 and a substrate 6109 or to a source electrode 6102 and drain electrode 6103 to make the ferroelectric thin film 6100 generate polarization so as to store data in accordance with the state of remanent polarization even after the applied voltage is removed. This can detect a written polarization direction, that is, a difference of 1 or 0 because electric charges induced by the channel of a field-effect transistor depend on the remanent polarization and become a difference between threshold voltages, and flowing current values are different.

A field-effect transistor having a ferroelectric thin film at its gate portion may be referred to as MFSFET. In this case, the MFSFET is an abbreviation of a Metal-Ferroelectrics-Semiconductor Field-Effect Transistor.

In FIG. 61, potential 0 is applied to the gate electrode 6101 through the word line 6104 and a positive potential V equal to or higher than coercive voltage is applied to the source electrode 6102 and drain electrode 6103 through the first bit line 6105 and second bit line 6106, and the ferroelectric thin film 6100 causes the polarization of a positive electrode at the gate side and the polarization of a negative electrode at the substrate side.

Moreover, in FIG. 62, positive potential V equal to or higher than coercive voltage is applied to the gate electrode 6101 through the word line 6104 and potential 0 is applied to the source electrode 6102 and drain electrode 6103 through the first bit line 6105 and second bit line 6106, and the ferroelectric thin film 6100 causes negative-electrode polarization at the gate side and positive-electrode polarization at the substrate 6109 side.

When reading data, there is a method for detecting a difference between currents flowing through an MFSFET by using a difference between the remanent polarizations as a change in threshold voltages of the MFSFET. As an example of this, there is JP2002-543627A (hereinafter referred to as Patent Document 4).

SUMMARY OF THE INVENTION

However, the above conventional ferroelectric memories have the following problems respectively.

That is, in the case of the method for destruction-reading data described for FIGS. 57 to 59 or shown in Patent Document 1, it is necessary to write deleted data again after reading the data. Therefore, because the write operation is performed after reading data, a cycle time becomes very long and a trouble occurs in high-speed read.

Because not only the above described but also write is performed for every read, write and data deletion are repeated and there is a problem that the service life as a ferroelectric material expires because $10^{10}$ to $10^{12}$ times are the limit of the number of rewriting times. Therefore, there is a problem that the material is insufficient from the viewpoints of quality and reliability as a static random access memory (hereafter referred to as SRAM) and dynamic random access memory (hereafter referred to as DRAM) from or in which data is frequently read or written at a high speed and its purposes are limited.

Moreover, as shown in Patent Documents 2 and 3, there is a method for preparing an asymmetric hysteresis characteristic of polarization-charge-applied-voltage of a ferroelectric thin film and reading data without destructing the data by using the asymmetric characteristic. However, it is not actually easy to obtain a material having a complex non-linear hysteresis characteristic shown in FIG. 60 or a typical view in Patent Document 3 and there is a problem that a delay of development or a trouble in fabrication easily occurs. Moreover, there is a problem that a difference between output signals of 1 and 0 in reading is small and the configuration of a detection circuit is difficult.

The method for holding remanent polarization data of a ferroelectric thin film by having bulk of a silicon substrate, setting a ferroelectric thin film on the gate electrode of a field-effect transistor, applying voltage equal to or higher than the coercive voltage of the ferroelectric thin film to a substrate and a gate electrode shown in FIG. 61 or 62 or Patent Document 4 has a following disadvantage.

That is, when arranging memory cells like a matrix and sharing word lines and bit lines between memory cells, voltage equal to or higher than coercive voltage may be applied to a memory cell at an unselected address. Therefore, efficient sharing is difficult and thus, there is a problem that an integration degree is lowered and the cost is easily increased.

Moreover, as described above, because voltage equal to or higher than coercive voltage may be applied to a memory cell at an unselected address, there is a disadvantage that the hysteresis characteristic of polarization-charge-applied voltage of a ferroelectric thin film of a conventional ferroelectric material is insufficient in angular characteristic and desired control cannot be made.

Furthermore, as shown in FIGS. 61 and 62, the ferroelectric thin film 6100 is located on the substrate 6109. Therefore, this represents that a ferroelectric is crystallized on silicon (Si). However, it is generally difficult to directly grow inorganic ferroelectric crystal on silicon crystal and many crystal defects are left on the boundary. Therefore, an ideal MFS (Metal Ferroelectrics Semiconductor) structure is not formed.

Therefore, in FIGS. 61 and 62, the remanent polarization of the ferroelectric thin film 6100 is influenced due to the above crystal defects in the ferroelectric thin film 6100 and the substrate 6109 and there is a disadvantage that desired data disappears in a short period.

Therefore, the present invention solves the problem and its object is to provide a ferroelectric memory capable of realizing high-speed, high integration degree, and long service life and by using nondestructive read and a storage method or a control method for improving the integration degree as a memory, selecting a material of a ferroelectric thin film suitable for the method and configuration and capable of being substituted for an SRAM or DRAM and widely used.

To solve the above problem and achieve the object of the present invention, each invention is constituted as described below.

That is, a first invention at least includes a field-effect transistor having a ferroelectric thin film at its gate portion, a word line connected to the gate electrode of the field-effect transistor, a first bit line connected to a first electrode serving as a source or drain of the field-effect transistor, a second bit line connected to a second electrode serving as a drain or source of the field-effect transistor, a write circuit for applying voltage equal to or higher than the coercive electric field of the ferroelectric thin film between the first bit line and the word line at first write timing and applying voltage equal to or higher than the coercive electric field of the ferroelectric thin film between the second bit line and the word line at second write timing, and a read circuit for applying voltage equal to or lower than the coercive electric field of the ferroelectric thin film between the first bit line and the word line at first read timing to detect a current flowing between the first bit line and the second bit line and applying a voltage equal to or lower than the coercive electric field of the ferroelectric thin film between the second bit line and the word line at second read timing to detect a current flowing between the second bit line and the first bit line.

A second invention is at least provided with a memory cell group including a plurality of field-effect transistors set like a matrix and respectively having a ferroelectric thin film at its gate portion, a word line connected in common to each gate electrode of field-effect transistors arranged in the same row out of the above field-effect transistors, a first bit line to be connected in common to each first electrode serving as a source or drain of each of field-effect transistors arranged in the same column out of the above field-effect transistors, a second bit line to be connected in common to a second electrode serving as a drain or source of each of the field-effect transistors arranged in the same column out of the above field-effect transistors, a write circuit for applying voltage equal to or higher than the coercive electric field of the ferroelectric thin film between the first bit line and the word line and between the second bit line and the word line at different timings when writing data to a field-effect transistor at a selected address, a read circuit for applying voltage equal to or lower than the coercive electric field of the ferroelectric thin film between the first bit line and the word line at the first read timing to detect a current flowing between the first bit line and the second bit line and applying voltage equal to or lower than the coercive electric field of the ferroelectric thin film between the second bit line and the word line at second read timing different from the first read timing to detect a current flowing between the second bit line and the first bit line, when reading data from a field-effect transistor at a selected address and a selection and control circuit for selecting a field-effect transistor at a desired address when the write circuit performs the write operation and controlling voltage so that voltage equal to or higher than the coercive electric field of the ferroelectric thin film is applied between a word line and a bit line of the selected field-effect transistor and voltage equal to or lower than the coercive electric field of the ferroelectric thin film is applied to remaining word lines and bit lines other than the above word line and bit line, while for selecting a field-effect transistor at a desired address when the read circuit performs the read operation and controlling voltage so that voltage equal to or lower than the coercive electric field of the ferroelectric thin film is applied to the word lines and bit lines of all the field-effect transistors.

A third invention applies a predetermined voltage to the above word line, first bit line, and second bit line so that when reading data from the above field-effect transistor, the field-effect transistor for reading the data operates in a saturated region in the first or second invention.

A fourth invention is constituted in the second invention so that the field-effect transistor is constituted of an N-type field-effect transistor and it is assumed that voltage supplied from the selection and control circuit to the N-type field-effect transistor ranges between 0 and V, and coercive voltage corresponding to the coercive electric field of the ferroelectric thin film ranges between (1/2) V and V and when writing data 1 in an N-type field-effect transistor at a selected address, the selection and control circuit supplies potential V to a word line of the selected address, potential (1/2) V to a word line at an unselected address, potential 0 [V] to a bit line at a selected address and potential (1/2) V to a bit line at an unselected address and when writing data 0 in an N-type field-effect transistor at a selected address, the selection and control circuit supplies potential 0 [V] to a word line at a selected address, potential (1/2) V to a word line at an unselected address, potential V to a bit line at a selected address, and potential (1/2) V to a bit line at an unselected address.

A fifth invention is constituted in the second invention so that the field-effect transistor is constituted of an N-type field-effect transistor, it is assumed that voltage supplied from the selection and control circuit to the N-type field-effect transistor ranges between 0 and V, and coercive voltage corresponding to the coercive electric field of the ferroelectric thin film ranges between (1/3) and (2/3) V, and when writing data 1 in an N-type field-effect transistor at a selected address, the selection and control circuit supplies potential V to a word line at a selected address, potential (1/3) V to a word line at an unselected address, potential (1/3) V to a bit line at a selected address, and potential (2/3) V to a bit line at an unselected address and moreover, when writing data 0 in an N-type field-effect transistor at a selected address, the selection and control circuit supplies potential 0 [V] to a word line at a selected address, potential (2/3) V to a word line at an unselected address, potential (2/3) V to a bit line at a selected address, and potential (1/3) V to a bit line at an unselected address.

A sixth invention is constituted in the second invention so that the field-effect transistor is constituted of an N-type field-effect transistor and it is assumed that voltage supplied from the selection and control circuit to the N-type field-effect transistor ranges between 0 and V and coercive voltage corresponding to the coercive electric field of the ferroelectric thin film ranges between (1/4) and (3/4)V and moreover, when writing data 1 in an N-type field-effect transistor at a selected address, the selection and control circuit supplies potential V to a word line at a selected address, potential (2/4) V to a word line at an unselected address, potential (1/4) V to a bit line at a selected address, and potential (3/4) V to a bit line at an unselected address and moreover, when writing data 0 in an N-type field-effect transistor at a selected address, the selection and control circuit supplies potential 0 [V] to a word line at a selected address, potential (2/4) V to a word line at an unselected address, potential (3/4) V to a bit line at a selected address, and potential (1/4) V to a bit line at an unselected address.

A seventh invention is constituted in the fourth invention so that when reading data from an N-type field-effect transistor at a selected address, the selection and control circuit supplies potential (1/2) V to a word line at a selected address, potential 0 [V] to a bit line, and potential (1/2) V to a bit line to be paired with the above bit line and moreover, supplies potential 0 [V] to a word line at an unselected address and unselected bit lines other than the paired bit lines.

An eighth invention is constituted in the fifth invention so that when reading data from an N-type field-effect transistor at a selected address, the selection and control circuit supplies potential (1/3) V to a word line at a selected address, potential 0 [V] to a bit line, and potential (1/3) V to a bit line to be paired with the above bit line and moreover, supplies potential 0 [V] to a word line at an unselected address and unselected bit lines other than the paired bit lines.

A ninth invention is constituted in the sixth invention so that when reading data from an N-type field-effect transistor at a selected address, the selection and control circuit supplies potential (1/4) V to a word line at a selected address, potential 0 [V] to a bit line, and potential (1/4) V to a bit line to be paired with the above bit line and moreover, supplies potential 0 [V] to a word line at an unselected address and unselected bit lines other than the paired bit lines.

A tenth invention is constituted in the second invention so that the field-effect transistor is constituted of a P-type field-effect transistor and it is assumed that voltage supplied from the selection and control circuit to the P-type field-effect transistor ranges between 0 and V and coercive voltage corresponding to the coercive electric field of the ferroelectric thin film ranges between (1/2) V and V and moreover, when writing data 1 in a P-type field-effect transistor at a selected address, the selection and control circuit supplies potential 0 [V] to a word line at a selected address, potential (1/2) V to a word line at an unselected address, potential V to a bit line at a selected address, and potential (1/2) V to a bit line at an unselected address, and when writing data 0 in a P-type field-effect transistor at a selected address, the selection and control circuit supplies potential V to a word line at a selected address, potential (1/2) V to a word line at an unselected address, potential 0 [V] to a bit line at a selected address, and potential (1/2) V to a bit line at an unselected address.

An eleventh invention is constituted in the second invention so that the field-effect transistor is constituted of a P-type field-effect transistor, it is assumed that voltage supplied from the selection and control circuit to the P-type field-effect transistor ranges between 0 and V and coercive voltage corresponding to the coercive electric field of the ferroelectric thin film ranges between (1/3) and (2/3) V and moreover, when writing data 1 in a P-type field-effect transistor at a selected address, the selection and control circuit supplies potential 0 [V] to a word line at a selected address, potential (2/3) V to a word line at an unselected address, potential (2/3) V to a bit line at a selected address, and potential (1/3) V to a bit line at an unselected address, and when writing data 0 in a P-type field-effect transistor at a selected address, the selection and control circuit supplies potential V to a word line at a selected address, potential (1/3) V to a word line at an unselected address, potential (1/3) V to a bit line at a selected address, and potential (2/3) V to a bit line at an unselected address.

A twelfth invention is constituted in the second invention so that the field-effect transistor is constituted of a P-type field-effect transistor, it is assumed that voltage supplied from the selection and control circuit to the P-type field-effect transistor ranges between 0 and V and coercive voltage corresponding to the coercive electric field of the ferroelectric thin film ranges between (1/4) V and (3/4) V, and moreover when writing data 1 in a P-type field-effect transistor at a selected address, the selection and control circuit supplies potential 0 [V] to a word line at a selected address, potential (2/4) V to a word line at an unselected address, potential (3/4) V to a bit line at a selected address, and potential (1/4) V to a bit line at an unselected address, and moreover when writing data 0 in a P-type field-effect transistor at a selected address, the selection and control circuit supplies potential V to a word line at a selected address, potential (2/4) V to a word line at an unselected address, potential (1/4) V to a bit line at a selected address, and potential (3/4) V to a bit line at an unselected address.

A thirteenth invention is constituted in the tenth invention so that when reading data from a P-type field-effect transistor at a selected address, the selection and control circuit supplies potential (1/2) V to a word line at a selected address, potential V to a bit line, and potential (1/2) V to a bit line to be paired with the above bit line, and moreover supplies potential V to a word line at an unselected address and unselected bit lines other than the paired bit lines.

A fourteenth invention is constituted in the eleventh invention so that when reading data from a P-type field-effect transistor at a selected address, the selection and control circuit supplies potential (2/3) V to a word line at a selected address, potential V to a bit line, and potential (2/3) V to a bit line to be paired with the above bit line and moreover, supplies potential V to a word line at an unselected address and unselected bit lines other than the paired bit lines.

A fifteenth invention is constituted in the twelfth invention so that when reading data from a P-type field-effect transistor at a selected address, the selection and control circuit supplies potential (3/4) V to a word line at a selected address, potential V to a bit line, and potential (3/4) V to a bit line to be paired with the above bit line and moreover, supplies potential V to a word line at an unselected address and unselected bit lines other than the paired bit lines.

In a sixteenth invention, a field-effect transistor having a ferroelectric thin film at the gate portion is channel-doped in any one of the first to fifteenth inventions.

In a seventeenth invention, the ferroelectric thin film is constituted of an inorganic ferroelectric in any one of the first to sixteenth inventions.

In an eighteenth invention, a ferroelectric thin film constituted of the inorganic ferroelectric is constituted of PZTN in the seventeenth invention.

In a nineteenth invention, the ferroelectric thin film is constituted of an organic ferroelectric in any one of the first to sixteenth inventions.

In a twentieth invention, a ferroelectric thin film constituted of the organic ferroelectric is constituted of PVDF, P(VDF/TrFE), or odd-number nylon such as nylon 7, or nylon 11 in the nineteenth invention.

As described above, according to the present invention having one of the above configurations, the threshold voltage of a MFSFET is changed due to remanent polarization of a ferroelectric thin film at the gate portion of the MFSFET and it can be detected as a current difference. Therefore, data read is nondestructive read and high-speed read can be made, and there is an advantage that the service life of a device is greatly lengthened.

Moreover, in the present invention, it is possible to store two-bit data in one MFSFET, share a word line or bit line by arranging memory cell group like a matrix, and layout at a high area efficiency is possible. Therefore, there is an advantage that it is possible to provide a high-integration, compact, and low-cost nonvolatile memory.

Moreover, the present invention is high-speed, long-service-life, and low-cost and at the same time, has such characteristics and features as original nonvolatile property, low voltage, and small power consumption of a ferroelectric memory. Therefore, not only the present invention is substituted for a general memory such as a nonvolatile memory, SRAM, or DRAM but also only one chip is used though a plurality of chips have been used so far. Therefore, there is an advantage that change to low cost, compactness, and lower power consumption is further progressed.

Furthermore, according to the present invention, by using as ferroelectric thin film at gate portion of MFSFET, PZTN of inorganic ferroelectric having a good angular characteristic in the polarization-charge-applied-voltage hysteresis characteristic, or PVDF, P(VDF/TrFE), or odd-number nylon such as nylon 7 or nylon 11 serving as organic ferroelectric for easily forming an ideal MFS structure, various characteristics are improved and there is an advantage that fabrication is easy and stability is increased. As a result, there are advantages that the quality reliability is improved and the fabrication cost is decreased.

BRIEF DESCRIPTION OF THE DRAWINGS

FIG. 16 is an illustration for potential control of various portions when writing data 1 in an N-type MFSFET at a selected address by using three types of potentials;

FIG. 17 is an illustration for potential control of various portions when writing data 1 in selected one of N-type MFSFETs arranged like a matrix by using three types of potentials;

FIG. 18 is an illustration for potential control of various portions when writing data 0 in an N-type MFSFET at a selected address by using three types of potentials;

FIG. 19 is an illustration for potential control of various portions when writing data 0 in selected one of N-type MFSFETs arranged like a matrix by using three types of potentials;

FIG. 24 is an illustration for potential control of various portions when writing data 0 in an N-type MFSFETs at a selected address by using four types of potentials;

FIG. 25 is an illustration for potential control of various portions when writing data 0 in selected one of N-type MFSFETs arranged like a matrix by using four types of potentials;

FIG. 30 is an illustration for potential control of various portions when writing data 0 in an N-type MFSFET at a selected address by using five types of potentials;

FIG. 31 is an illustration for potential control of various portions when writing data 0 in selected one of N-type MFSFETs arranged like a matrix by using five types of potentials;

FIG. 42 is an illustration for potential control of various portions when writing data 1 in a P-type MFSFET at a selected address by using four types of potentials;

FIG. 43 is an illustration for potential control of various portions when writing data 1 in selected one of P-type MFSFETs arranged like a matrix by using four types of potentials;

FIG. 48 is an illustration for potential control of various portions when writing data 1 in a P-type MFSFET at a selected address by using five types of potentials;

FIG. 49 is an illustration for potential control of various portions when writing data 1 in selected one of P-type MFSFETs arranged like a matrix by using five types of potentials;

FIG. 57 is a sectional view showing a structure of a ferroelectric capacitor used for a conventional ferroelectric memory device;

FIG. 58 is a characteristic diagram of a typical hysteresis characteristic of polarization electric charge and applied voltage of a ferroelectric thin film made of a generally-used material used for a conventional and the present invention's ferroelectric memory devices;

DETAILED DESCRIPTION OF THE PREFERRED EMBODIMENTS

Embodiments of the present invention are described below by referring to the accompanying drawings.

(Fist Configuration of Memory Cell of the Present Invention and its Operation Principle)

Figure 1:
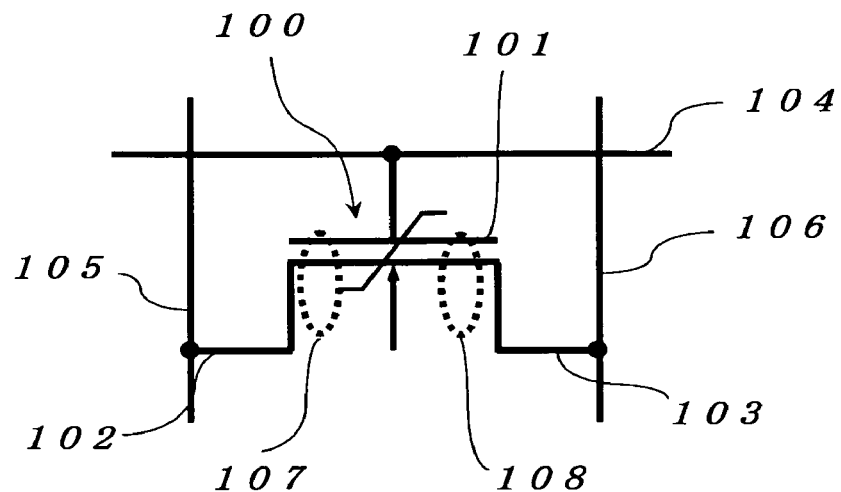
FIG. 1 is a circuit diagram showing a first configuration of a memory cell used for a ferroelectric memory device of the present invention.

FIG. 1 is a circuit diagram of a first configuration of one memory cell (storage device) serving as the basic unit of a ferroelectric memory device of the present invention. First, the structure, operation principle, and control method of the one memory cell are described.

As shown in FIG. 1, this memory cell is constituted of an N-type MFSFET 100, a word line 104, first bit line 105, and second bit line 106.

The N-type MFSFET 100 has a gate electrode 101, first electrode 102 constituted of $N^+$ diffusion and serving as a source or drain, and second electrode 103 constituted of $N^+$ diffusion and serving as a drain or source. Moreover, in the N-type MFSFET 100, the word line 104 is connected to the gate electrode 101, the first bit line 105 is connected to the first electrode 102, and the second bit line 106 is connected to the second electrode 103. In the N-type MFSFET 100 shown in FIG. 1, a ferroelectric thin film is embedded immediately below its gate electrode 101 and this state is shown in FIG. 2.

Figure 2:
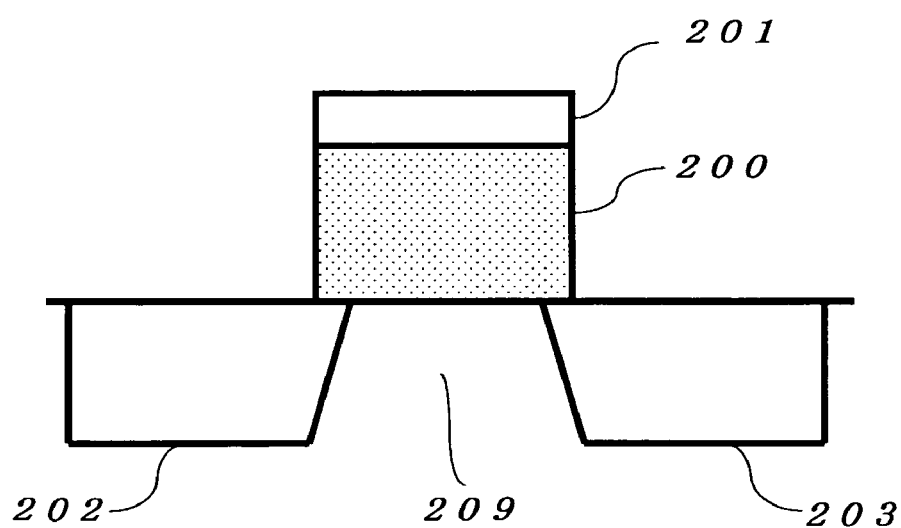
FIG. 2 is a sectional view showing a configuration of the cross section of an N-type MFSFET constituting the memory cell in FIG. 1.

FIG. 2 is a sectional view obtained by cutting the channel portion of the N-type MFSFET shown in FIG. 1 in the source-drain direction.

In FIG. 2, reference numeral 201 denotes a gate electrode made of metal and 202 denotes a first electrode constituted of $N^+$ diffusion and serving as a source or a drain and 203 denotes a second electrode serving as a source or drain and constituted of $N^+$ diffusion, and 209 denotes a silicon substrate. In this case, the gate electrode 201, first electrode 202, and second electrode 203 in FIG. 2 correspond to the gate electrode 101, first electrode 102, and second electrode 103 in FIG. 1, respectively.

In FIG. 2, reference numeral 200 denotes a ferroelectric thin film formed of PZTN. When applying voltage to the both ends of the ferroelectric thin film 200 formed of PZTN superior in crystallinity, polarization is generated in the thin film 200. The polarization once generated has a composition that it is not easily reversed and has a hysteresis characteristic having the good angular characteristic shown in FIG. 3.

FIG. 58 is a typical characteristic diagram of PZT or SBT having been used so far as a ferroelectric thin film. As a result of comparing FIG. 3 with FIG. 58, it is found that the PZTN recently noticed has a hysteresis characteristic having an angular characteristic better than a conventional typical ferroelectric.

PZT is a generic name of $Pb(Zr, Ti)O_3$, PZTN is a generic name of a substance in which a part of Ti of PZT is replaced with Nb, and SBT is a generic name of $SrBi_2Ta_2O_9$ or a composition close to it. Moreover, when using the ferroelectric thin film 200, platinum (Pt) is generally used for the gate electrode 201.

Figure 3:
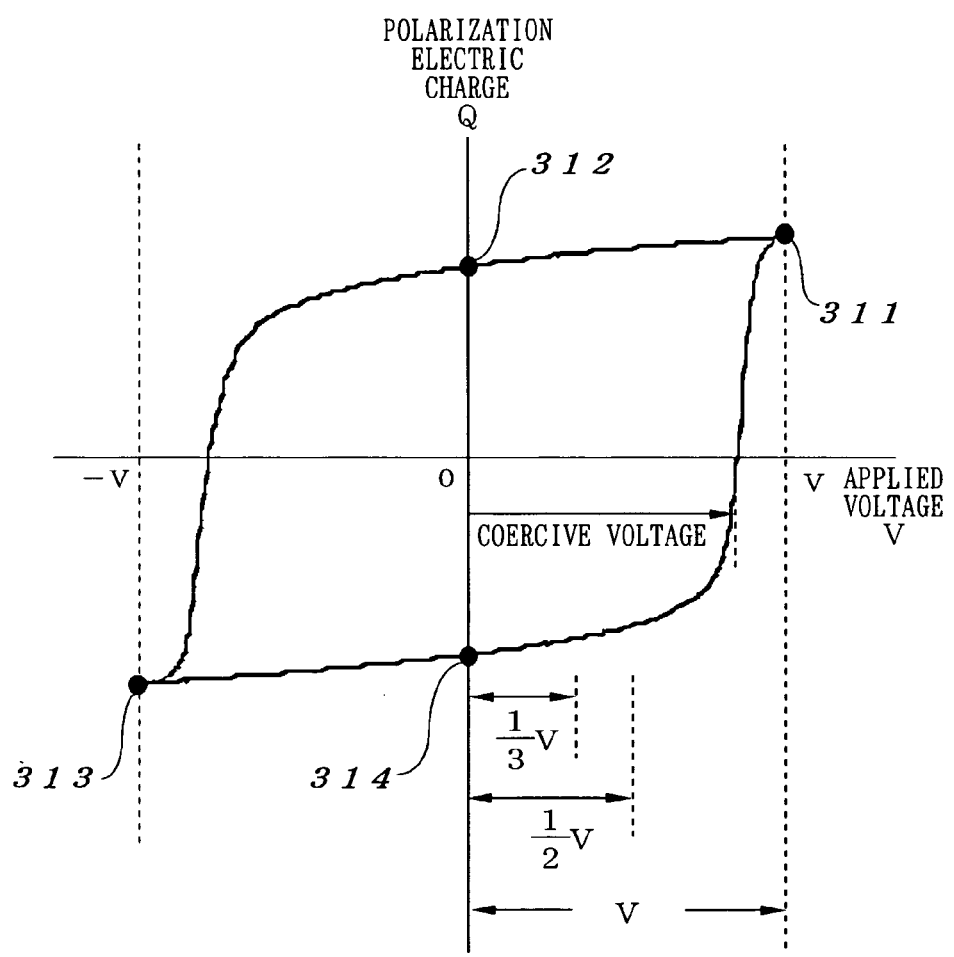
FIG. 3 is a characteristic diagram showing a hysteresis characteristic of polarization electric charge and applied voltage of a ferroelectric thin film of an N-type MFSFET.

As shown in FIG. 3, when applying positive voltage equal to or higher than a coercive electric field to a ferroelectric thin film, operating point becomes the state of a characteristic point 311. In this case, when removing applied voltage and releasing the film, operating point becomes a characteristic point 312 and a quantity corresponding to the intersection of the axis of ordinate is held as remanent polarization. Moreover, when applying negative voltage equal to or higher than coercive voltage, operating point moves to the state of a characteristic point 313. Therefore, when removing applied voltage and releasing the film, operating point becomes a characteristic point 314 and a quantity corresponding to the intersection of the axis of ordinate is held as remanent polarization.

In FIG. 1, when applying voltage equal to or higher than a coercive voltage corresponding to the coercive electric field of the ferroelectric thin film 200 in FIG. 2 to the word line 104 and the first bit line 105, an electric field is formed between the gate electrode 201 and the first electrode 202 and the ferroelectric thin film 200 held by the electrodes 201 and 202 locally causes polarization at the inside of it.

Figure 4:
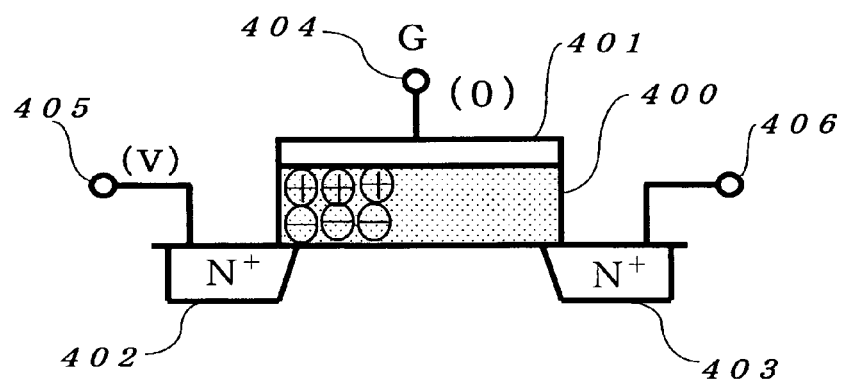
FIG. 4 is an illustration showing an example of one polarization state in the ferroelectric thin film of an N-type MFSFET.
Figure 5:
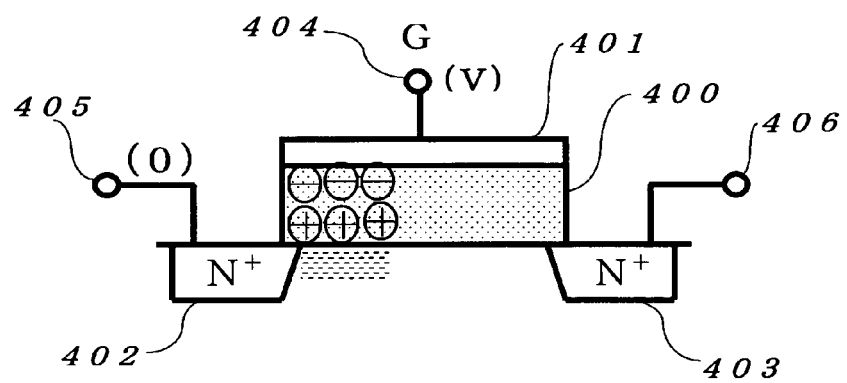
FIG. 5 is an illustration showing another example of one polarization state in the ferroelectric thin film of the N-type MFSFET.

For example, when the gate electrode 201 shown in FIG. 2 has potential 0 and the first electrode 202 shown in FIG. 2 has potential +V, the gate electrode-401 side causes positive internal polarization and the first electrode-402 side causes negative internal polarization nearby the first electrode 402 of a ferroelectric thin film 400 as shown in FIG. 4. However, when the gate electrode 201 shown in FIG. 2 has potential +V and the first electrode 202 has potential 0, the gate electrode-401 side causes negative internal polarization and the first electrode-402 side causes positive internal polarization nearby the first electrode 402 of the ferroelectric thin film 400 as shown in FIG. 5.

Moreover, in FIG. 1, when applying voltage equal to or higher than coercive voltage corresponding to the coercive electric field of the ferroelectric thin film 200 in FIG. 2 to the word line 104 and second bit line 103, an electric field is formed between the gate electrode 201 and the second electrode 203 and the ferroelectric thin film 200 held by the both electrodes 201 and 203 locally causes polarization at the inside of it.

Figure 6:
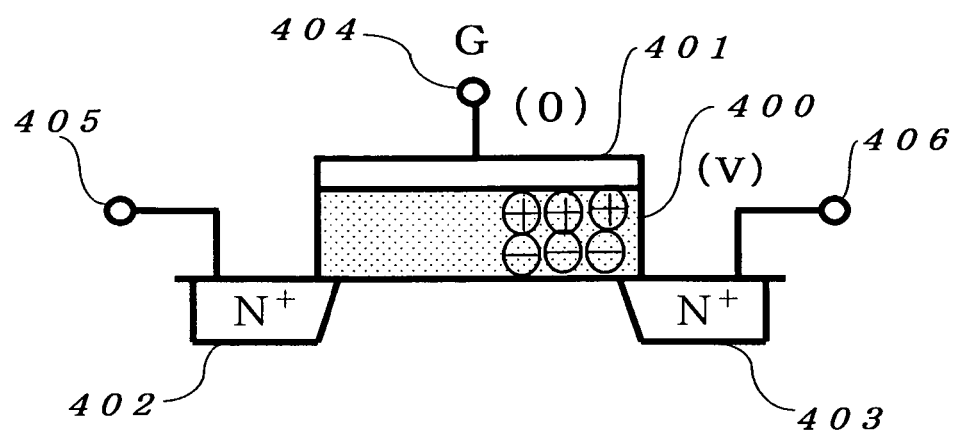
FIG. 6 is an illustration showing an example of the other polarization state in the ferroelectric thin film of the N-type MFSFET.
Figure 7:
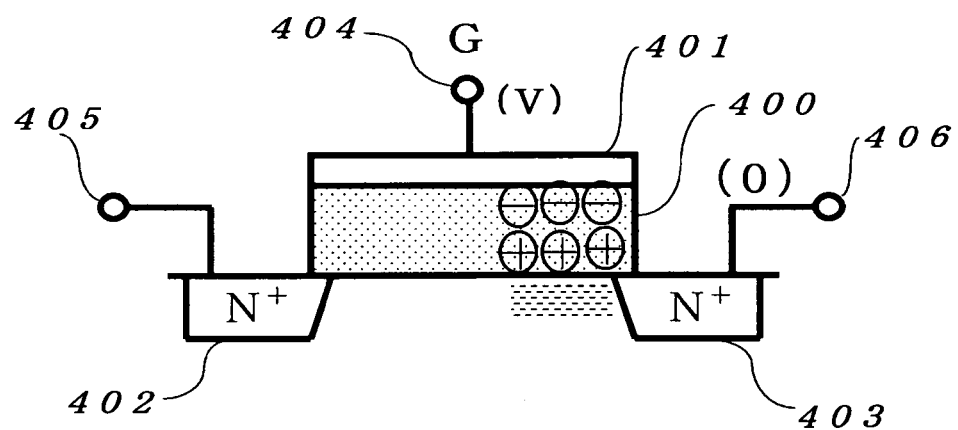
FIG. 7 is an illustration showing another example of the other polarization state in the ferroelectric thin film of the N-type MFSFET.

For example, when the gate electrode 201 shown in FIG. 2 has potential 0 and the second electrode 203 shown in FIG. 2 has potential +V, the gate electrode-401 side causes positive internal polarization and the second electrode-403 side causes negative internal polarization nearby the second electrode 403 of the ferroelectric thin film 400 as shown in FIG. 6. However, when the gate electrode 201 shown in FIG. 2 has potential +V and the second electrode 203 shown in FIG. 2 has potential 0, the gate electrode-401 side causes negative internal polarization and the second electrode-403 side causes positive internal polarization nearby the second electrode 403 of the ferroelectric thin film 400 as shown in FIG. 7.

FIGS. 4, 5, 6, and 7 are sectional views obtained by cutting the channel portion of an N-type MFSFET having the ferroelectric thin film 400 at its gate portion in the source-drain direction and sectional views showing wirings and internal state of an MFSFET. Moreover, in FIGS. 4, 5, 6, and 7, reference numeral 400 denotes a ferroelectric thin film, 401 denotes a gate electrode, 402 denotes a first electrode constituted of N+ diffusion and serving as a source or drain, 403 denotes a second electrode constituted of N+ diffusion and serving as a drain or source, 404 denotes a word line, 405 denotes a first bit line, and 406 denotes a second bit line. The word line 404, first bit line 405, and second bit line 406 in FIGS. 4, 5, 6, and 7 correspond to the word line 104, first bit line 105, and second bit line 106 in FIG. 1, respectively.

In FIGS. 4 and 5, polarization of the ferroelectric thin film 400 generated at the first electrode-402 side is stored as remanent polarization even if it is released from voltage. The data storing state is used as a first data storing place shown by a broken line 107 in FIG. 1. Moreover, in FIGS. 6 and 7, polarization of the ferroelectric thin film 400 generated at the second electrode-403 side is also stored as remanent polarization even if it is released from voltage. The data storing state is used as a second data storing place shown by a broken line 108 in FIG. 1.

As described above, the remanent polarization at the first electrode-402 side and the remanent polarization at the second electrode-403 side can be independently written when the ferroelectric thin film 400 is an insulator and the first electrode 402 is slightly separated from the second electrode 403 and are stored as remanent polarizations.

FIGS. 8, 9, 10, and 11 are state diagrams showing states of storing storage remanent polarization data in two places in the ferroelectric thin film 400 in one MFSFET having the ferroelectric thin film 400 at its gate portion.

Figure 8:
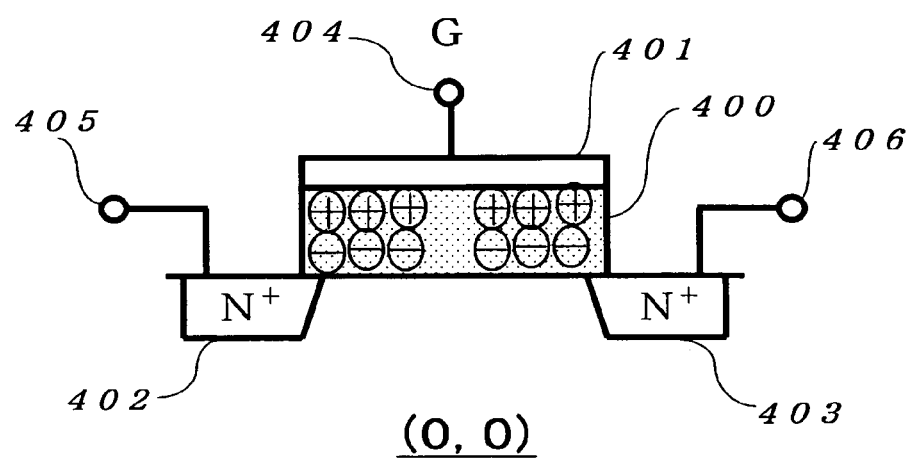
FIG. 8 is an illustration showing a polarization state when data (0,0) is stored in the ferroelectric thin film of an N-type MFSFET.
Figure 9:
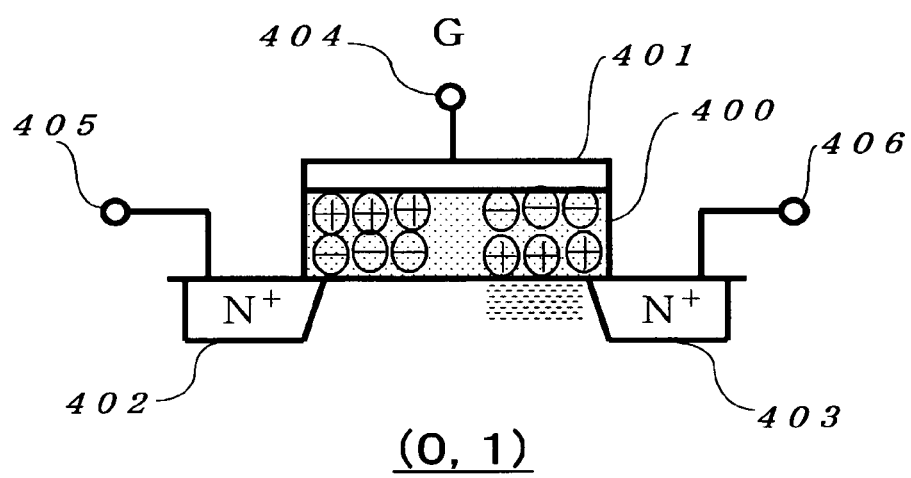
FIG. 9 is an illustration showing a polarization state when data (0,1) is stored in the ferroelectric thin film of the N-type MFSFET.

In FIG. 8, remanent polarization is stored at the first electrode-402 side and the second electrode-403 side of the ferroelectric thin film 400 and a positive polarization state is stored a the gate electrode-401 side. In FIG. 9, remanent polarization is stored at the first electrode-402 side and the second electrode-403 side of the ferroelectric thin film 400. Positive polarization state and negative polarization state are stored at the gate electrode-401 side.

Figure 10:
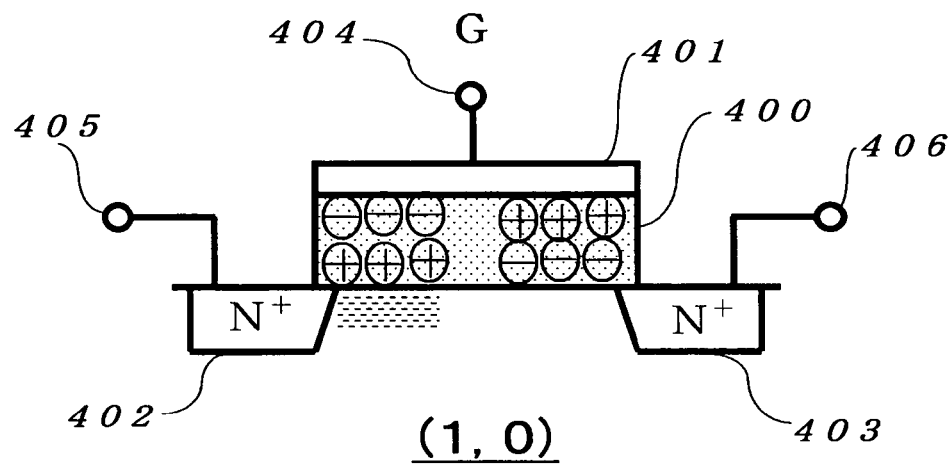
FIG. 10 is an illustration showing a polarization state when data (1,0) is stored in the ferroelectric thin film of the N-type MFSFET.
Figure 11:
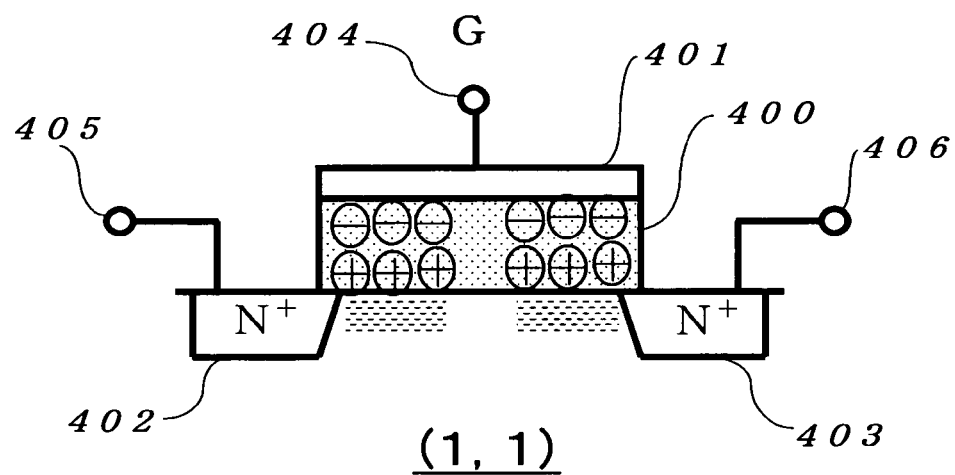
FIG. 11 is an illustration showing a polarization state when data (1,1) is stored in the ferroelectric thin film of the N-type MFSFET.

In FIG. 10, remanent polarization is stored at the first electrode-402 side and second electrode-403 side of the ferroelectric thin film 400 and negative and positive polarization states are stored at the gate electrode-401 side, respectively. In FIG. 11, remanent polarization is stored at the first electrode-402 side and second electrode-403 side of the ferroelectric thin film 400 and a negative polarization state is stored at the gate electrode-401 side.

As described above, one MFSFET can store four states of remanent polarization and store two-bit data.

When the ferroelectric thin film at the gate portion causes polarization, electric charges are induced in the channel region of the MFSFET. As shown in FIGS. 5, 7, 9, 10, and 11, when positive polarization is present at the channel region side, electrons are induced in the channel region. This state is shown in each drawing as a group of dotted lines. The induced electrons form a channel or at least lower the threshold voltage of the MFSFET. Moreover, when negative polarization is present at the channel side, it raises the threshold voltage of the MFSFET.

As described above, polarization occurs in the ferroelectric thin film of the MFSFET and data values 1 and 0 can be stored in the form of remanent polarization. Though data values 1 and 0 are only arrangements on definition, the data values 1 and 0 are defined as described below in this specification.

That is, the data value 1 is a case in which the remanent polarization of a ferroelectric influences the threshold voltage of the MFSFET to lower the threshold voltage so that a channel region is easily formed. Moreover, the data value 0 is a case of raising the threshold voltage so that the channel region is not easily formed.

According to the above definition, stored data can be shown as (0,0) in the state of FIG. 8, (0,1) in the state of FIG. 9, (1,0) in the state of FIG. 10 and (1,1) in the state of FIG. 11.

(Data Read)

Then, a method for reading the data accumulated in the ferroelectric thin film of the MFSFET as remanent polarization is described below.

Figure 12:
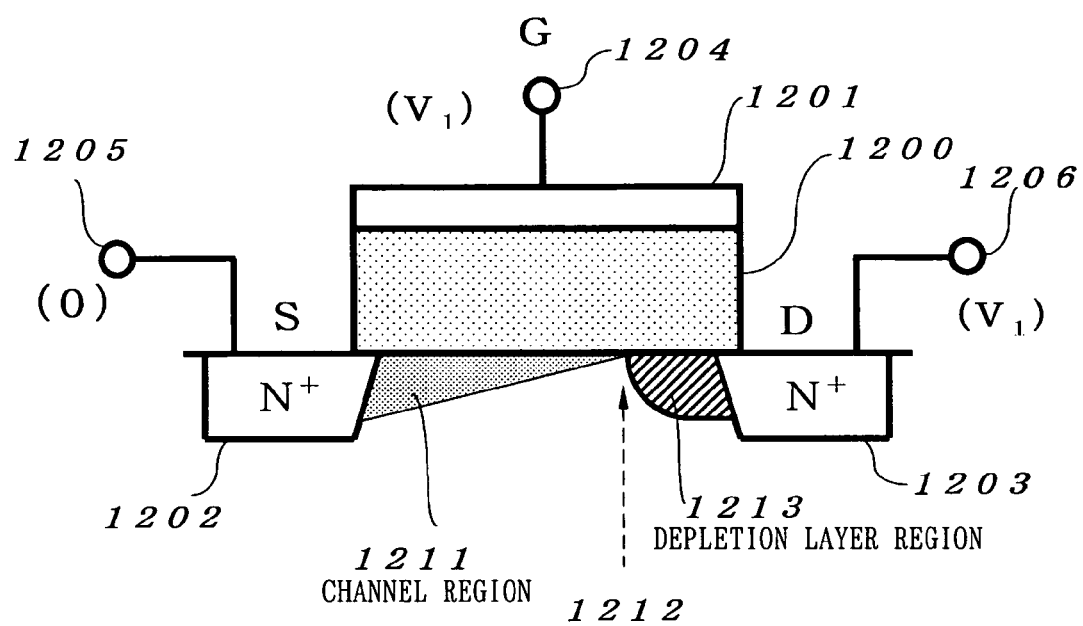
FIG. 12 is a sectional view showing a state in an N-type MFSFET when operating the N-type MFSFET in a saturated region.

FIG. 12 is a sectional view obtained by cutting the channel portion of an N-type MFSFET having the ferroelectric thin film 400 at its gate portion in the source-drain direction and shows a state of electric charges of a channel.

In FIG. 12, reference numeral 1200 denotes a ferroelectric thin film, 1201 denotes a gate electrode, 1202 denotes a first electrode serving as a source or drain and constituted of $N^+$ diffusion, and 1203 denotes a second electrode serving as a drain or source and constituted of $N^+$ diffusion. Potential 0 is supplied to the first electrode 1202 through a first bit line 1205. Moreover, positive voltage V1 equal to or lower than coercive voltage corresponding to the coercive electric field of the ferroelectric thin film 1200 is supplied to the gate electrode 1201 and second electrode 1203 through a word line 1204 and second bit line 1206. In this case, the first electrode 1202 becomes a source and the potential VGS between the source and the gate is shown by the following expression (1).

$$VGS = V1 - 0 = V1 \quad (1)$$

Moreover, the potential VDS between the drain and the source is shown by the following expression (2).

$$VDS = V1 - 0 = V1 \quad (2)$$

Therefore, when assuming the threshold voltage of an N-type MFSFET in a state in which the ferroelectric thin film 1200 does not cause polarization as Vth and the Vth is positive, magnitudes of VDS and (VGS−Vth) are determined similarly to the case of a MOSFET serving as an insulating-gage field-effect transistor in order to determine a saturated or unsaturated operation region of the MFSFET.

VDS is equal to V1 and VGS−Vth is equal to V1−Vth. Therefore, as long as the Vth is positive, VDS becomes larger than VGS−Vth and the N-type MFSFET performs a saturated-region operation.

Because there is a potential difference between a source and a drain, the potential of the surface of a channel changes from the source to the drain. When assuming this potential as VC, a channel is formed by induced carriers in a region meeting (VC−Vth)>0. This channel is the region 1211 shown in FIG. 12.

The potential VC of the channel changes its value depending on a place as described above and (VC−Vth) increases toward the source side. Therefore, because the induced number of electric charges increases toward the source side, depth differs like the channel region 1211 in FIG. 12 to show a difference of the number of electric charges induced in the channel.

Thus, when reaching the point 1212 where (VC−Vth) is equal to 0, electric charges for forming a channel are not induced. Moreover, when approaching to the drain side, a depletion layer region 1213 where no carrier is induced appears.

The current IDS flowing between the drain and the source of the MFSFET is shown by the following expression (3) because the saturated region operation is performed as described above by assuming the conductance constant of the MFSFET as β.

$$IDS = (1/2)\beta(V1 - Vth)^2 \quad (3)$$

According to the above expression, the current IDS flowing through the saturated region is actually decided by a region in which a channel is formed by inducing electric charges at the source side and it is shown that the current IDS is hardly influenced by the state of the depletion layer side at the drain side. Therefore, the polarization state of the ferroelectric thin film 1200 at the source side influences the threshold voltage to control the magnitude of the flowing current value. When assuming that the threshold voltage changes by ±ΔE in the positive direction and the negative direction of a polarization state, the current-value difference ΔIDS is shown by the following expression (4) when showing ΔE as IDS (ΔE) as a function of a current I.

$$\Delta IDS = IDS(+\Delta E) - IDS(-\Delta E) \quad (4)$$
$$= 2\beta \cdot \Delta E \cdot (V1 - Vth)$$

Moreover, because V1 is equal to or lower than coercive voltage and Vth is positive, when assuming that the absolute value of −ΔE is large, it is possible to set the difference between polarization states of the ferroelectric thin film 1200 to the difference between on and off of the MFSFET.

However, because various factors influence the above number of polarization electric charges or threshold voltage, the number of polarization electric charges or threshold voltage may not directly become an optimum point.

In this case, a difference between polarization states is forcibly set so as to become an actual operation point of on or off of a MOSFET by channel-doping the above MFSFET. Thus, data detection is securely performed and the configuration of a detection circuit is simplified. Thus, small size, reduced power consumption and high-speed operation are realized.

That is, by channel-doping the MFSFET and properly adjusting the threshold voltage of the MFSFET, it is possible to realize a configuration for easily detecting data because of bringing the MFSFET into an operation region in which distinction is clear because a difference between on and off of the MFSFET appears in accordance with a difference between remanent polarization directions.

Figure 13:
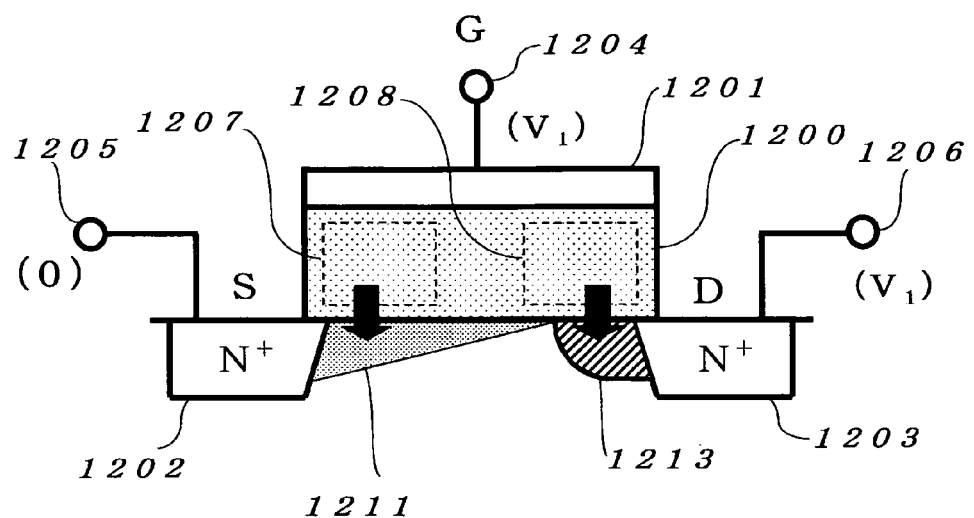
FIG. 13 is a sectional view for explanation when reading data from an N-type MFSFET.

FIG. 13 is a sectional view of an N-type MFSFET obtained by cutting the channel portion in the source-drain direction when reading data from the first data storing place and shows a state of electric charges of a channel.

In FIG. 13, potential 0 is supplied to the first electrode 1202 through the first bit line 1205 similarly to the case of FIG. 12. Moreover, positive potential V1 equal to or lower than coercive voltage corresponding to the coercive electric field of the ferroelectric thin film 1200 is supplied to the gate electrode 1201 and second electrode 1203 through the word line 1204 and second bit line 1206. In this case, the first electrode 1202 serves as a source electrode and the MFSFET operates in a saturated region.

Therefore, a remanent polarization state nearby the first data storing place 1207 in FIG. 13 influences a threshold voltage nearby the source and becomes a conclusive factor for a difference between flowing currents. In this case, because the remanent polarization stage of the second data storing place 1208 is present on the depletion layer 1213, the flowing current is hardly influenced. Therefore, by detecting the current value of the MFSFET in the state of FIG. 13, it is possible to detect the remanent polarization state of the first data storing place 1207.

Figure 14:
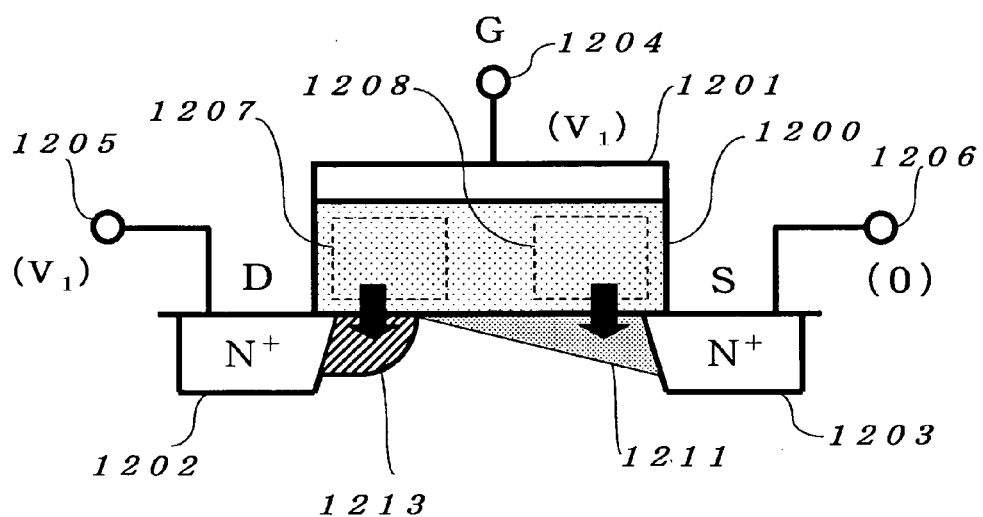
FIG. 14 is a sectional view for another explanation when reading data from an N-type MFSFET.

FIG. 14 is a sectional view of an N-type MFSFET obtained by cutting the channel portion of an N-type MFSFET in the source-drain direction when reading data from the second data storing place and shows a state of electric charges of the channel.

In FIG. 14, potential 0 is supplied to the second electrode 1203 through the second bit line 1206.

Moreover, positive potential V1 equal to or lower than coercive voltage corresponding to the coercive electric field of the ferroelectric thin film 1200 is supplied to the gate electrode 1201 and first electrode 1202 through the word line 1204 and first bit line 1205.

In this case, the second electrode 1203 serves as a source electrode and the MFSFET operates in the saturated region. Therefore, the remanent polarization state nearby the second data storing place 1208 in FIG. 14 influences the threshold voltage nearby the source and becomes a conclusive factor for a difference between flowing currents. In this case, because the remanent polarization state of the first data storing place 1207 is present on the depletion layer 1213, flowing current is hardly influenced. Therefore, by detecting the current value of the MFSFET in the state of FIG. 14, it is possible to detect the remanent polarization state of the second data storing place 1208.

A case about a simple memory cell is described above. In fact, however, it is necessary to use a configuration improving integration efficiency by arranging a plurality of memory cells like a matrix. The total arrangement and a way of controlling each signal line are described below.

(Memory Cell Group and its Peripheral Circuits)

Figure 15:
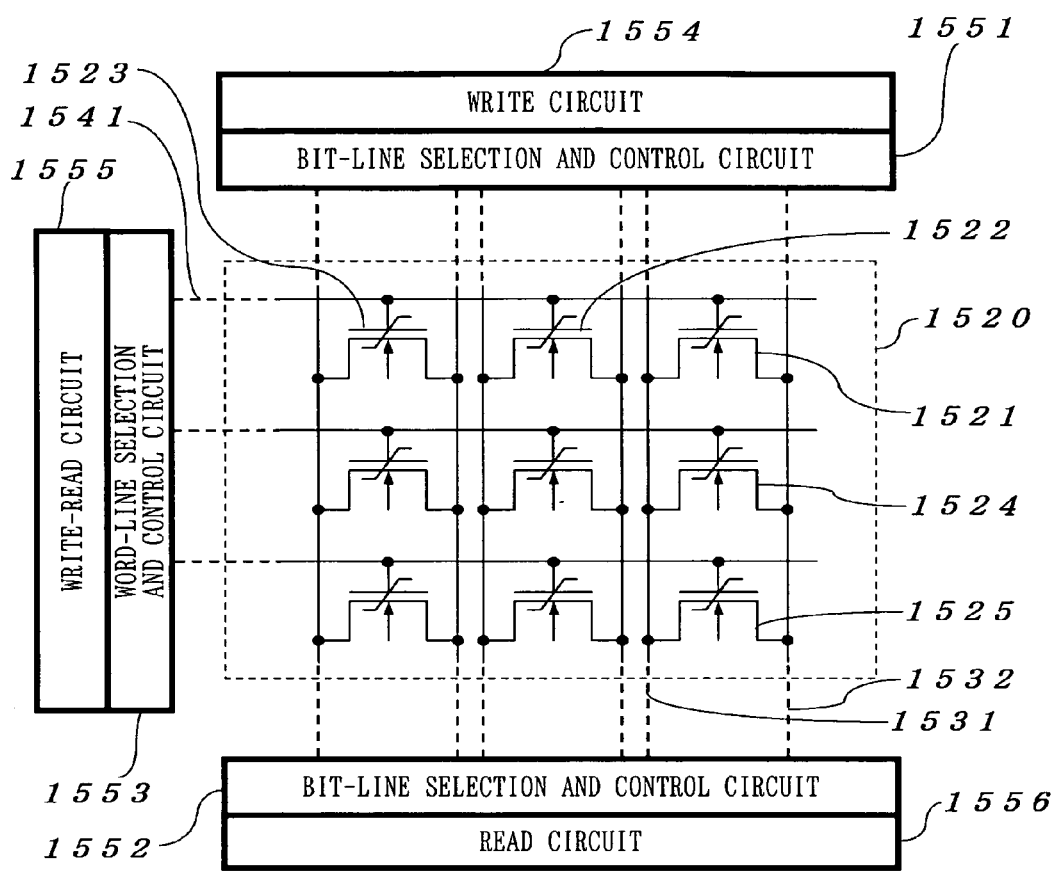
FIG. 15 is a block diagram showing a memory cell group and its peripheral circuits used for a ferroelectric memory device of the present invention.

FIG. 15 is an illustration showing a memory cell group constituted of a plurality of memory cells and a configuration of its peripheral circuits.

The memory cell group 1520 is constituted of N-type MFSFETs 1521, 1522, 1523, 1524, and 1525 respectively having a ferroelectric thin film at its gate portion as shown in a broken line in FIG. 15 and these N-type MFSFETs are arranged like a matrix.

In the case of the MFSFETs 1521, 1522, and 1523 arranged in the same row, gate electrodes are connected to a common word line 1541. Moreover, in the case of the MFSFETs 1521, 1524, and 1525 arranged in the same column, first electrodes are connected to a common first bit line 1531 and second electrodes are connected to a common second bit line 1532.

As shown in FIG. 15, peripheral circuits include bit-line selection and control circuits 1551 and 1552, word-line selection and control circuit 1553, write circuit 1554, write/read circuit 1555, and read circuit 1556.

The bit-line selection and control circuits 1551 and 1552 and word-line selection and control circuit 1553 respectively select a word line and bit line to be connected with the memory cell group 1520 so that a desired memory cell in the memory cell group 1520 can be selected.

The write circuit 1554 writes data in the memory cell selected as described above in the memory cell group 1520. The read circuit 1556 reads data from the memory cell selected as described above in the memory cell group 1520. The write/read circuit 1555 performs the write operation by linking with the write circuit 1554 when the write circuit 1554 writes data in a memory cell and performs the read operation by linking with the read circuit 1556 when the read circuit 1556 read data from a memory cell.

In this case, when the write circuit 1554 performs the data write operation and potential necessary for data write is simply supplied to a word line or bit line of a memory cell at a selected address, voltage equal to or higher than a coercive voltage may be added to a memory cell at an unselected address because of the influence of the word line or bit line to which the potential is supplied and the remanent polarization of the memory cell at the unselected address may be rewritten. Therefore, as to be described later, it is necessary not only to control a word line or bit line at a selected address but also to properly and comprehensively control a word line or bit line corresponding to an unselected address.

Therefore, the word-line selection and control circuit 1553 and bit-line selection and control circuits 1551 and 1552 properly and comprehensively control word lines or bit lines of the total memory cell. Moreover, consideration for not applying voltage equal to or higher than coercive voltage to every memory cell when reading data is necessary. Therefore, the word-line selection and control circuit 1553 and bit-line selection and control circuits 1551 and 1552 are used.

Then, an embodiment of a control method of a word line and bit line considering not only a selected address but also an unselected address described above is described below.

Embodiment 1 of Control Method of Word Line and Bit Line

FIGS. 16, 17, 18, 19, 20, and 21 are illustrations showing relations between word lines and bit lines for using three types of potentials for control by setting intermediate potential (1/2) V when the potential of power supply ranges between 0 [V] and V [V] (refer to FIG. 16).

As shown in FIG. 3, when hysteresis characteristic sufficiently approaches to an angular type, coercive voltage is present between (1/2) V and V as an absolute value, and remanent polarization is stored even if voltage of approx. (1/2) V is applied to a ferroelectric thin film, the method shown in FIGS. 16 to 21 can be used.

FIG. 16 shows a relation between selected word line WA, unselected word line WI, selected bit line BA, and unselected bit line BI when writing data 1 in a memory cell at a selected address. In FIG. 16, the selected word line WA is set to potential V, the selected bit line BA is set to potential 0, the unselected word line WI is set to (1/2) V, and the unselected bit line BI is set to (1/2) V. In this case, when the potential V is applied to the ferroelectric thin film of the memory cell, data 1 is written but when ±(1/2) V or potential 0 is applied to the ferroelectric thin film, remanent polarization is kept.

FIG. 17 shows potentials of word lines and bit lines when writing data 1 in only a memory cell at a selected address while word line group and bit line group are actually arranged like a matrix. In FIG. 17, reference numeral 1760 denotes a memory cell at an address in which data 1 should be written, 1761 denotes the word line at a selected address, and 1762 denotes a bit line at a selected address.

Potential V is supplied to the word line 1761 at a selected address and potential 0 is supplied to the selected bit line 1762 and (1/2) V is supplied to all other word lines and bit lines at unselected addresses. In this case, voltage V is applied to only the ferroelectric thin film of the memory cell 1760 at a selected address and ±(1/2) V or potential 0 is applied to ferroelectric thin films of other memory cells at unselected addresses.

Therefore, voltage equal to or higher than coercive voltage is applied to only the memory cell 1760 at a selected address and data 1 is written. However, because other memory cells at unselected addresses respectively have voltage equal to or lower than coercive voltage, memory cells at unselected addresses are not influenced even if the other memory cells have different values.

FIG. 18 shows a relation between selected word line WA, unselected word line WI, selected bit line BA, and unselected bit line BI when writing data 0 in a memory cell at a selected address. In FIG. 18, the selected word line WA is set to potential 0, the selected bit line BA is set to potential V, the unselected word line WI is set to (1/2) V, and the unselected bit line BI is set to (1/2) V. In this case, when potential −V is applied to the ferroelectric thin film of the memory cell, data 0 is written but when ±(1/2) V or potential 0 is applied to the ferroelectric thin film, remanent polarization is kept.

FIG. 19 shows potentials of word lines and bit lines when writing data 0 in only a memory cell at a selected address while word line group and bit line group are actually arranged like a matrix. In FIG. 19, reference numeral 1760 denotes a memory call at an address in which data 0 should be written, 1761 denotes a word line at a selected address, and 1762 denotes a bit line at a selected address.

Potential 0 is supplied to the word line 1761 at a selected address and potential V is supplied to the bit line 1762 at a selected address and (1/2) V is supplied to all other word lines and bit lines at unselected addresses. In this case, −V is applied to only the ferroelectric thin film of the memory cell 1760 at a selected address and ±(1/2) V or potential 0 is applied to ferroelectric thin films of other memory cells at unselected addresses.

Therefore, voltage equal to or higher than coercive voltage is applied to only the memory cell 1760 at a selected address and data 0 is written. Because other memory cells at unselected addresses respectively have voltage equal to or lower than the coercive voltage even if they have different values, memory cells at unselected addresses are not influenced.

Figure 20:
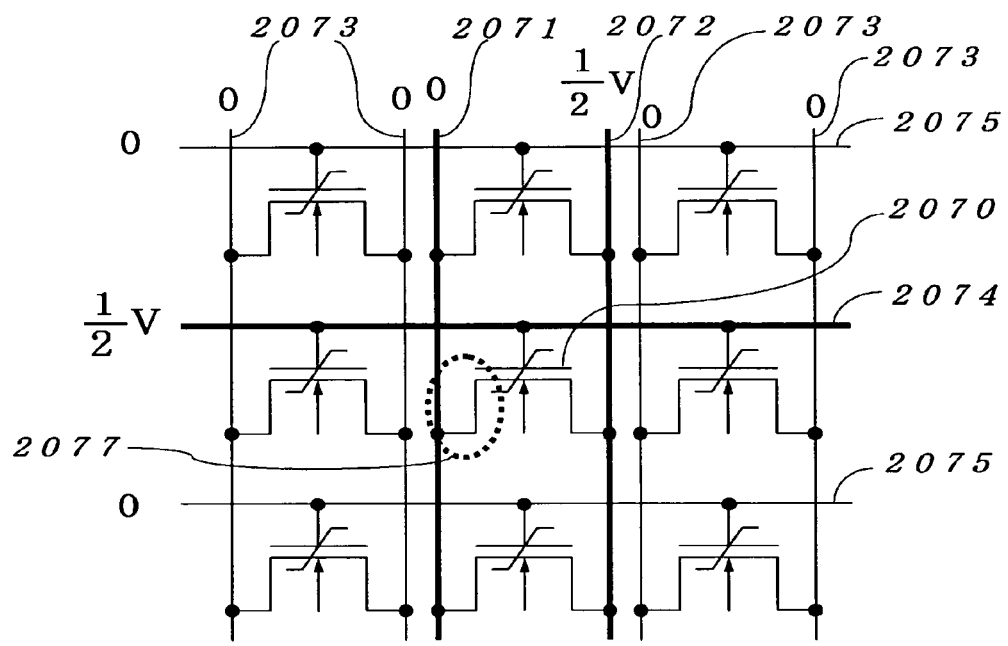
FIG. 20 is an illustration for potential control of various portions when reading one data from selected one of N-type MFSFETs arranged like a matrix by using three types of potentials.

FIG. 20 shows a relation between selected word line WA, unselected word line WI, selected first bit line B1, selected second bit line B2, and unselected bit line BI when reading remanent polarization data from the first data storing place of the selected MFSFET.

In FIG. 20, reference numeral 2070 denotes an N-type MFSFET at a selected address, 2071 denotes a fist bit line connected to a first electrode serving as the source or drain of the MFSFET 2070, and 2072 denotes a second bit line connected to a second electrode serving as the drain or source of the MFSFET 2070. Reference numeral 2074 denotes a word line connected to the gate electrode of the MFSFET 2070 at the selected address. Reference numeral 2077 denotes the first data storing place of the MFSFET 2070.

In this case, to read remanent polarization data from the first data storing place 2077 of the selected MFSFET 2070, potential (1/2) V is supplied to the selected word line 2074, potential 0 is supplied to the selected first bit line 2071, and potential (1/2) V is supplied to the selected second bit line 2072.

Then, the MFSFET 2070 is turned on and operates in a saturated region because it is an N-type MFSFET and potential (1/2) V is supplied to the gate electrode of it from the word line 2074, potential 0 is supplied to the source electrode of it from the first bit line 2071, and potential (1/2) V is supplied to the drain electrode of it from the second bit line 2072.

Therefore, the current when the directionality of remanent polarization of the first data storing place 2077 located at the source side of the N-type MFSFET influences the threshold voltage of the MFSFET flows between the first bit line 2071 and the second bit line 2072. Therefore, by detecting the current by the read circuit 1556 in FIG. 15, it is possible to determine 1 or 0 of read data in accordance with the magnitude of the detected current.

In this case, potential 0 is supplied to the other unselected word line 2075 and unselected bit line 2073. As a result, no current flows because other MFSFETs at unselected addresses are turned off. Moreover, because only voltage equal to or lower than coercive voltage of 0 [V] or (1/2) V is applied to ferroelectric thin films of all MFSFETs, remanent polarization data is kept.

Figure 21:
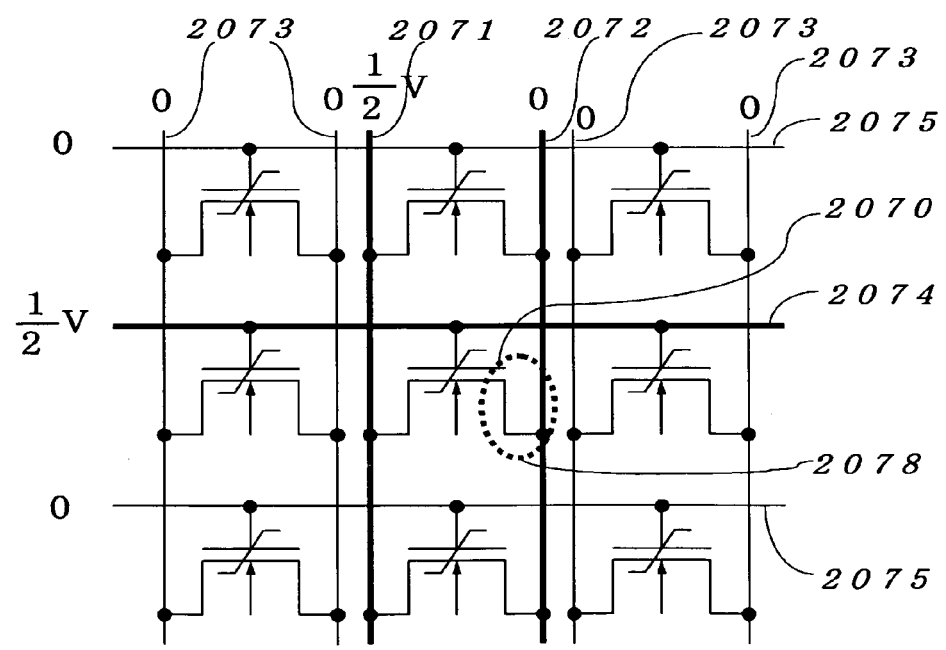
FIG. 21 is an illustration for potential control of various portions when reading the other data in an N-type MFSFET arranged like an array by using three types of potentials.

FIG. 21 shows a relation between selected word line WA, unselected word line WI, selected first bit line B1, selected second bit line B2, and unselected bit line BI when reading remanent polarization data from the second data storing place of a selected MFSFET.

In FIG. 21, reference numeral 2070 denotes an N-type MFSFET at a selected address, 2071 denotes a first bit line connected to a first electrode serving as the source or drain of the MFSFET 2070, and 2072 denotes a second bit line connected to a second electrode serving as a drain or source of the MFSFET 2070. Reference numeral 2074 denotes a word line connected to the gate electrode of the MFSFET 2070 at the selected address. Moreover, reference numeral 2078 denotes a second data storing place of the MFSFET 2070.

In this case, to read reaming polarization data from the second data storing place 2078 of the selected MFSFET 2070, potential (1/2) V is supplied to the selected word line 2074, potential 0 is supplied to the selected second bit line 2072, and potential (1/2) V is supplied to the selected first bit line 2071.

Then, the MFSFET 2070 is turned on and operates in a saturated region because it is an N-type MFSFET and potential (1/2) V is supplied to the gate electrode of it from the word line 2074, potential 0 is supplied to the source electrode of it from the second bit line 2072, and potential (1/2) V is supplied to the drain electrode of it from the first bit line 2071.

Therefore, the current when the directionality of the remanent polarization of the second data storing place 2078 located at the source side of the N-type MFSFET influences the threshold voltage of the MFSFET flows between the second bit line 2072 and the first bit line 2071. Therefore, by detecting this current by the read circuit 1556 in FIG. 15, it is possible to determine 1 or 0 of read data in accordance with the magnitude of the detected current.

In this case, potential 0 is supplied to the other unselected word lines 2075 and unselected bit lines 2073. As a result, no current flows because other MFSFETs at unselected addresses are turned off. Moreover, because only voltage equal to or lower than coercive voltage of 0 [V] or (1/2) V is applied to ferroelectric thin films of all MFSFETs, remanent polarization data is kept.

In the above description, when reading data from a memory cell, the remanent polarization of a ferroelectric thin film is stored and the data in a memory cell is not destructed. Therefore, the present invention does not require rewrite of data which has been required for a conventional ferroelectric memory and a cycle required for rewrite of the data.

Embodiment 2 of Control Method of Word Line and Bit Line

Figure 22:
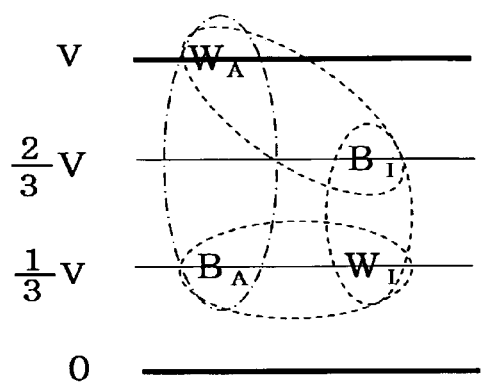
FIG. 22 is an illustration for potential control of various portions when writing data 1 in an N-type MFSFET at a selected address by using four types of potentials.

FIGS. 22, 23, 24, 25, 26, and 27 are illustrations showing relations between word lines and bit lines for using four types of potentials for control by setting two intermediate potentials (1/3) V and (2/3) V when the potential of power supply ranges between 0 [V] and V[V] (refer to FIG. 22).

As shown in FIG. 3, when a hysteresis characteristic sufficiently approaches an angular type and coercive voltage ranges between 1/2V and V, the method described for the embodiment 1 of the control method of word line and bit line is preferable. However, the method shown in FIGS. 22 to 27 can be used as a method suitable when it is necessary to improve the allowance for holding remanent polarization to coercive voltage and the safety by considering a ferroelectric material in which the angular characteristic of hysteresis is insufficient and fluctuation on fabrication and remanent polarization is stored even if voltage of 1/3V is applied to a ferroelectric thin film.

FIG. 22 shows a relation between selected word line WA, unselected word line WI, selected bit line BA, and unselected bit line BI when writing data 1 in a memory cell at a selected address. In FIG. 22, the selected word line WA is set to potential V, the selected bit line BA is set to potential (1/3) V, the unselected word line WI is set to (1/3) V, and the unselected bit line BI is set to potential (2/3) V. In this case, when (2/3) V is applied to the ferroelectric thin film of a memory cell, data 1 is written and remanent polarization is kept in the ferroelectric thin film at ±(1/3) V or 0.

Figure 23:
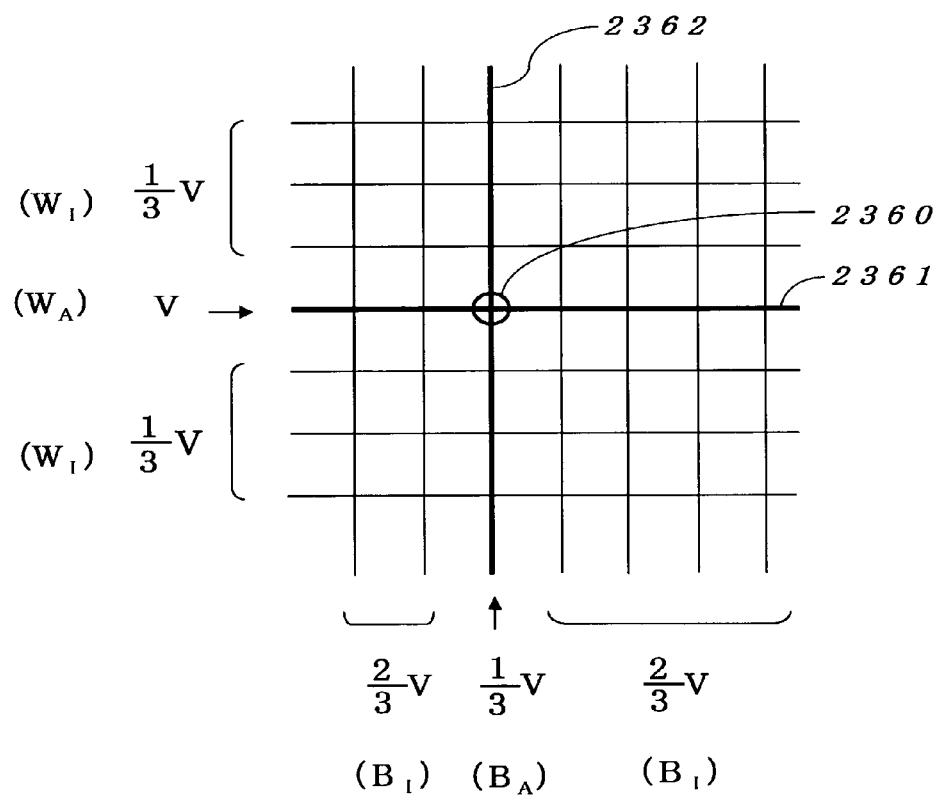
FIG. 23 is an illustration for potential control of various portions when writing data 1 in selected one of N-type MFSFETs arranged like a matrix by using four types of potentials.

FIG. 23 shows potentials of each word line and each bit line when writing data 1 in only a memory cell at a selected address while a word line group and a bit line group are actually arranged like a matrix. In FIG. 23, reference numeral 2360 denotes a memory cell at an address in which data 1 should be written, 2361 denotes a word line at a selected address, and 2362 denotes a bit line at a selected address.

Potential V is supplied to the word line 2361 at a selected address and potential (1/3) V is supplied to the selected bit line 2362, (1/3) V is supplied to other word lines at unselected addresses, and potential (2/3) V is supplied to all other bit lines at unselected addresses. In this case, voltage (2/3) V is applied to only the ferroelectric thin film of the memory cell 2360 at a selected address and voltage ±(1/3) V or 0 is applied to ferroelectric thin films of other memory cells at unselected addresses.

Therefore, voltage equal to or higher than a coercive voltage is applied to only the memory cell 2360 at a selected address, data 1 is written, memory cells at unselected addresses are not influenced because they respectively have voltage equal to or lower than coercive voltage even if they have different values.

FIG. 24 shows a relation between selected word line WA, unselected word line WI, selected bit line BA, and unselected bit line BI when writing data 0 in a memory cell at a selected address. In FIG. 24, the selected word line WA is set to potential, the selected bit line BA is set to potential (2/3) V, unselected word line WI is set to (2/3) V, and unselected bit line BI is set to (1/3) V. In this case, when voltage −(2/3) V is applied to the ferroelectric thin film of a memory cell, data 0 is written and remanent polarization is kept in the ferroelectric thin film at voltage ±(1/3) V or 0.

FIG. 25 shows the potential of each word line and the potential of each bit line when writing data 0 in only a memory cell at a selected address while word line group and bit line group are actually arranged like a matrix. In FIG. 25, reference numeral 2360 denotes a memory cell at an address in which data 0 should be written, 2361 denotes a word line at a selected address, and 2362 denotes a bit line at a selected address.

Potential 0 is supplied to the word line 2361 at the selected address and potential (2/3) V is supplied to the selected bit line 2362, and (2/3) V is supplied to all other word lines at unselected addresses and (1/3) V is supplied to all other bit lines at unselected addresses. In this case, voltage −(2/3) V is applied to only the ferroelectric thin film of the memory cell 2360 at the selected address and ±(1/3) V or potential 0 is applied to other ferroelectric thin films at the unselected addresses.

Therefore, voltage equal to or higher than coercive voltage is applied to only the memory cell 2360 at the selected address and data 0 is written, but other memory cells at unselected addresses are not influenced because the memory cells respectively have voltage equal to or lower than coercive voltage even if they have different values.

Figure 26:
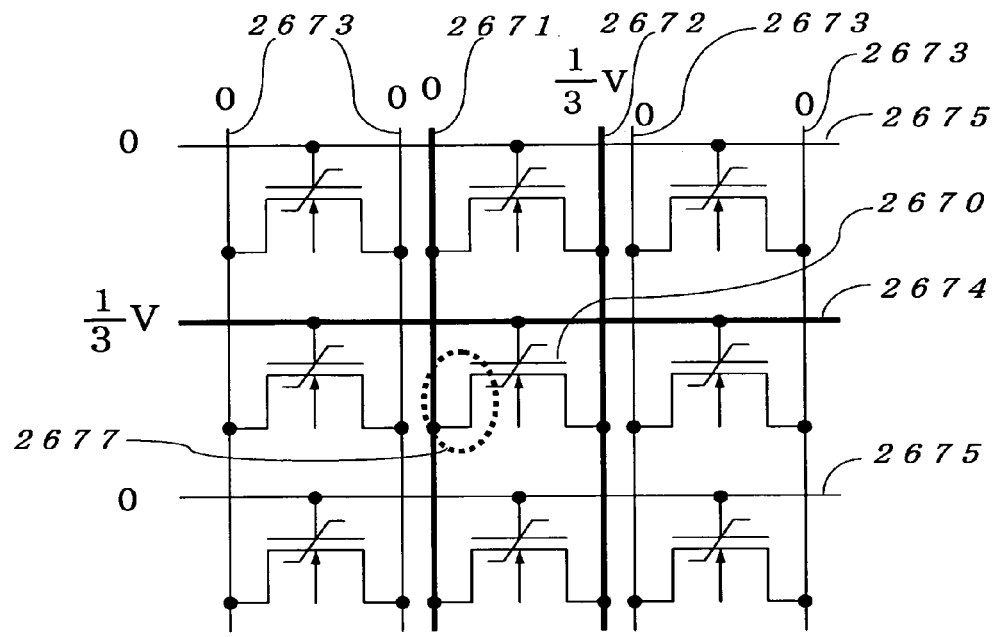
FIG. 26 is an illustration for potential control of various portions when reading one data from selected one of N-type MFSFETs arranged like a matrix by using four types of potentials.

FIG. 26 shows a relation between selected word line WA, unselected word line WI, selected first bit line B1, selected second bit line B2, and unselected bit line BI when reading remanent polarization data from the first data storing place of a selected MFSFET.

In FIG. 26, reference numeral 2670 denotes an N-type MFSFET at a selected address, 2671 denotes a first bit line connected to a first electrode serving as the source or drain of the MFSFET 2670, and 2672 denotes a second bit line connected to a second electrode serving as the drain or source of the MFSFET 2670. Reference numeral 2674 denotes a word line connected to the gate electrode of the MFSFET 2670 at the selected address. Moreover, reference numeral 2677 denotes the first data storing place of the MFSFET 2670.

In this case, to read the remanent polarization data from the first data storing place 2677 of the selected MFSFET 2670, potential (1/3) V is supplied to the selected word line 2674, potential 0 is supplied to the selected first bit line 2671, and potential (1/3) V is supplied to the second bit line 2672 of a selection pair.

Then, the MFSFET 2670 is turned on and operates in a saturated region because it is an N-type MFSFET and potential (1/3) V is supplied to the gate electrode of it from the word line 2674, potential 0 is supplied to the source electrode of it from the first bit line 2671, and potential (1/3) V is supplied to the drain electrode of it from the second bit line 2672.

Therefore, the current when the directionality of the remanent polarization of the first data storing place 2677 located at the source side of the N-type MFSFET influences the threshold voltage of the MFSFET flows between the first bit line 2671 and the second bit line 2672. Then, by detecting the current by the read circuit 1556 in FIG. 15, it is possible to determine 1 or 0 of read data in accordance with the magnitude of the detected current.

In this case, potential 0 is supplied to all other unselected word lines 2675 and unselected bit lines 2673. As a result, no current flows because other MFSFETs at unselected addresses are turned off. Moreover, because only voltage equal to or lower than a coercive voltage of 0 [V] or (1/3) V is applied ferroelectric thin films of all MFSFETs, remanent polarization data is kept.

Figure 27:
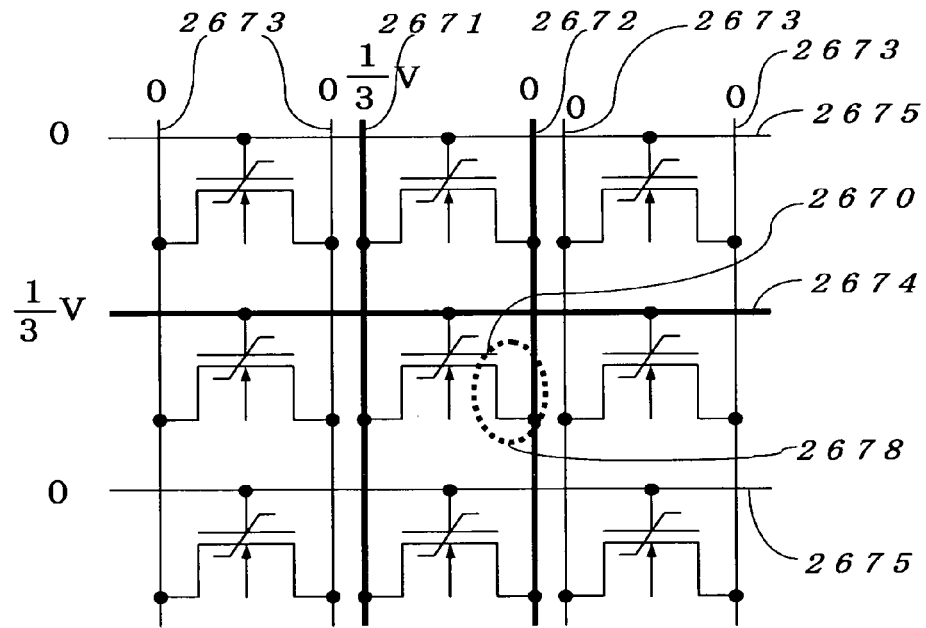
FIG. 27 is an illustration for potential control of various portions when reading the other data from selected one of N-type MFSFETs arranged like a matrix by using four types of potentials.

FIG. 27 shows a relation between selected word line WA, unselected word line WI, selected first bit line B1, selected second bit line B2, and unselected bit line BI when reading remanent polarization data from the second data storing place of the selected MFSFET.

In FIG. 27, reference numeral 2670 denotes an N-type MFSFET at a selected address, 2671 denotes a first bit line connected to a first electrode serving as the source or drain of the MFSFET 2670, and 2672 denotes a second bit line connected to a second electrode serving as the drain or source of the MFSFET 2670. Reference numeral 2674 denotes a word line connected to the gate electrode of the MFSFET 2670 at the selected address. Moreover, reference numeral 2678 denotes the second data storing place of the MFSFET 2670.

In this case, to read remanent polarization data from the second data storing place 2678 of the selected MFSFET 2670, potential (1/3) V is supplied to the selected word line 2674, potential 0 is supplied to the selected second bit line 2672, and potential (1/3) V is supplied to the first bit line 2671 of a selection pair.

Then, the MFSFET 2670 is turned on and operates in a saturated region because it is an N-type MFSFET and potential (1/3) V is supplied to the gate electrode of it from the word line 2674, potential 0 is supplied to the source electrode of it from the second bit line 2672, and potential (1/3) V is supplied to the drain electrode of it from the first bit line 2671.

Therefore, the current when the directionality of the remanent polarization of the second data storing place 2678 located at the source side of the N-type MFSFET influences the threshold voltage of the MFSFET flows between the second bit line 2672 and the first bit line 2671. Therefore, by detecting the current by the read circuit 1556 in FIG. 15, it is possible to determine 1 or 0 of read data in accordance with the magnitude of the detected current.

In this case, potential 0 is supplied to all other unselected word lines 2675 and unselected bit lines 2673. As a result, no current flows because other MFSFETs at unselected addresses are turned off. Moreover, because only voltage equal to or lower than coercive voltage of 0 [V] or (1/3) V is applied to ferroelectric thin films of all MFSFETs, the remanent polarization data is kept.

Embodiment 3 of Control Method of Word Line and Bit Line

Figure 28:
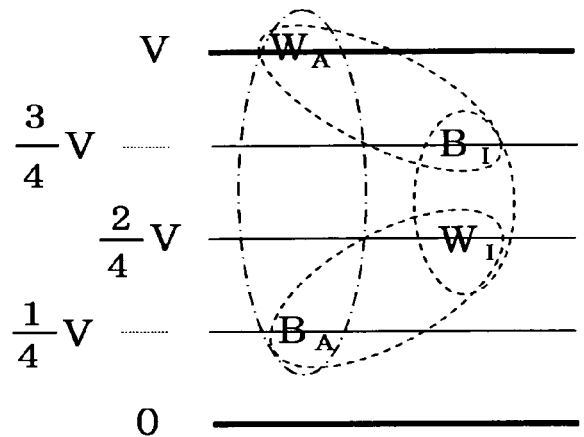
FIG. 28 is an illustration for potential control of various portions when writing data 1 in an N-type MFSFET at a selected address by using five types of potentials.

FIGS. 28, 29, 30, 31, 32, and 33 are illustrations showing relations between word lines and bit lines for using five types of potentials for control by setting three intermediate potentials (1/4) V, (2/4) V, and (3/4) V when the potential of power supply ranges between 0 [V] and V[V] (refer to FIG. 28).

In the case of the method of the embodiment 2 as the above-described control method of word line and bit line, it is necessary to change many unselected word lines present for write to (1/3) V or (2/3) V though they are unselected in accordance with the fact that data at a selected address is 1 or 0 and unnecessary current consumption due to a lot of charge and discharge currents and delay of write time may be caused.

Therefore, though write voltage and coercive voltage for keeping remanent polarization have the same allowance, the same potential of (2/4) V can be used for an unselected word line in writing. Therefore, a method suitable for smaller power consumption is described below by referring to FIGS. 28 to 33.

FIG. 28 shows a relation between selected word line WA, unselected word line WI, selected bit line BA, and unselected bit line BI when writing data 1 in a memory cell at a selected address. In FIG. 28, the selected word line WA is set to potential V, selected bit line BA is set to potential (1/4) V, unselected word line WI is set to (2/4) V, and unselected bit line BI is set to (3/4) V. In this case, when voltage (3/4) V in an absolute value is applied to the ferroelectric thin film of a memory cell, data 1 is written and remanent polarization is kept in the ferroelectric thin film at potential ±(1/4) V or 0.

Figure 29:
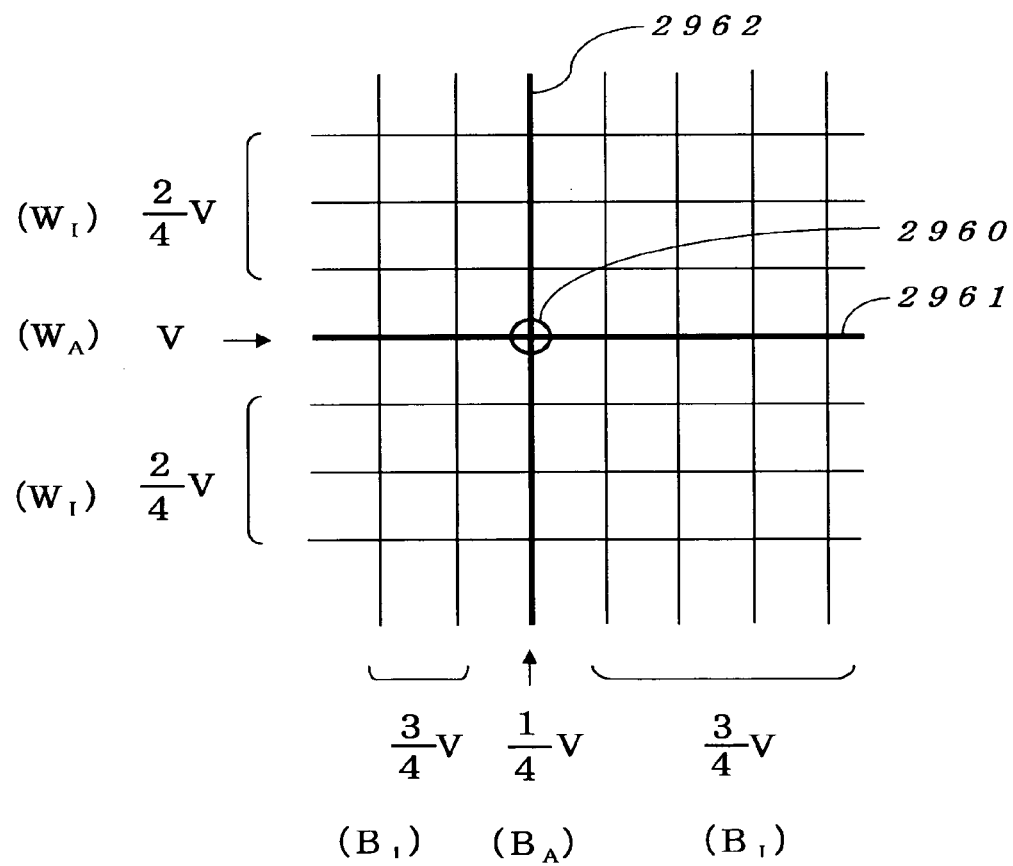
FIG. 29 is an illustration for potential control of various portions when writing data 1 in selected one of N-type MFSFETs arranged like a matrix by using five types of potentials.

FIG. 29 shows the potential of each word line and the potential of each bit line when writing data 1 in only a memory cell at a selected address while word line group and bit line group are actually arranged like a matrix. In FIG. 29, reference numeral 2960 denotes a memory cell in which data 1 should be written, 2961 denotes a word line at a selected address, and 2962 denotes a bit line at a selected address.

In this case, potential V is supplied to the word line 2961 at the selected address and potential (1/4) V is supplied to the selected bit line 2962 and (2/4) V is supplied to other word lines at unselected addresses and (3/4) V is supplied to all other bit lines at unselected addresses. In this case, voltage (3/4) V is applied to only the ferroelectric thin film of the memory cell 2960 at a selected address and voltage ±(1/4) V is applied to ferroelectric thin films of other memory cells at unselected addresses.

Therefore, voltage equal to or higher than coercive voltage is applied to only the memory cell 1760 at a selected address, data 1 is written but other memory cells at unselected addresses are not influenced because they respectively have voltage equal to or lower than coercive voltage even if they have different values.

FIG. 30 shows a relation between selected word line WA, unselected word line WI, selected bit line BA, and unselected bit line BI when writing data 0 in a memory cell at a selected address. In FIG. 30, the selected word line WA is set to potential 0, the selected bit line BA is set to potential (3/4) V, the unselected word line WI is set to (2/4) V, and the unselected bit line BI is set to (1/4) V. In this case, when −(3/4) V is applied to the ferroelectric thin film of a memory cell, data 0 is written and remanent polarization is kept in the ferroelectric thin film at potential ±(1/4) V or potential 0.

FIG. 31 shows the potential of each word line and the potential of each bit line when writing data 0 in only a memory cell at a selected address while word line group and bit line group are actually arranged like a matrix. In FIG. 31, reference numeral 2960 denotes a memory cell at an address in which data 0 should be written, 2961 denotes a word line at a selected address, and 2962 denotes a bit line at a selected address.

In this case, potential 0 is supplied to the word line 2961 at the selected address and potential (3/4) V is supplied to the selected bit line 2962, and (2/4) V is supplied to other word lines at unselected addresses and (1/4) V is supplied to all other bit lines at unselected addresses. In this case, voltage −(3/4) V is applied to only the ferroelectric thin film of the memory cell 2960 at the selected address and voltage ±(1/4) V is applied to ferroelectric thin films of other memory cells at unselected addresses.

Therefore, voltage equal to or higher than coercive voltage is applied to only the memory cell 2960 at the selected address, data 0 is written but other memory cells at unselected addresses are not influenced because they respectively have voltage equal to or lower than coercive voltage even if they have different values.

Figure 32:
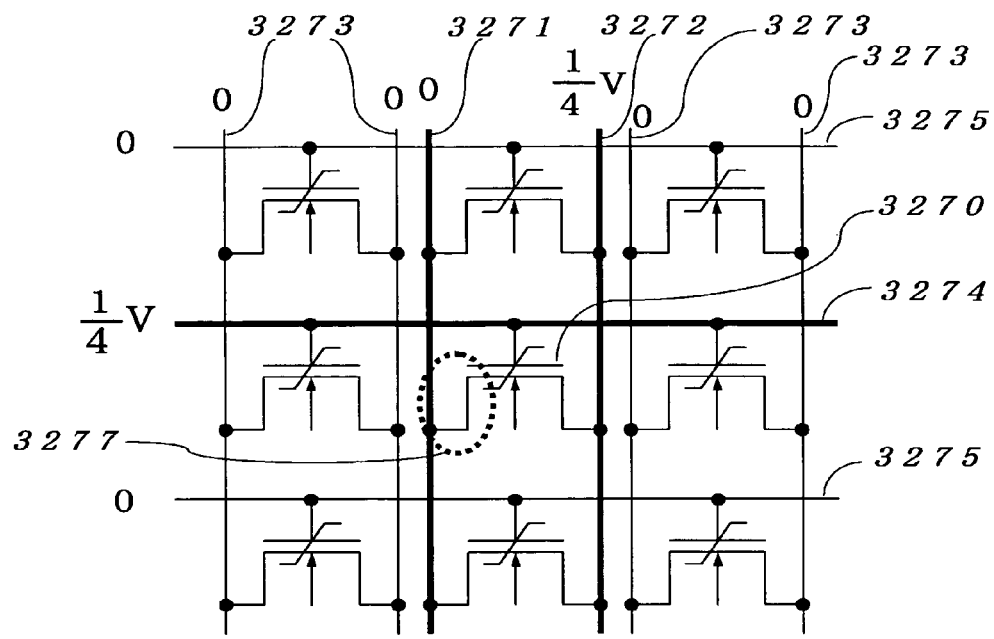
FIG. 32 is an illustration for potential control of various portions when reading one data from selected one of N-type MFSFETs arranged like a matrix by using five types of potentials.

FIG. 32 shows a relation between selected word line WA, unselected word line WI, selected first bit line B1, selected second bit line B2, and unselected bit line BI when reading remanent polarization data from the first data storing place of a selected MFSFET.

In FIG. 32, reference numeral 3270 denotes an N-type MFSFET at a selected address, 3271 denotes a first bit line connected to a first electrode serving as the source or drain of the MFSFET 3270, and 3272 denotes a second bit line connected to a second electrode serving as the drain or source of the MFSFET 3270. Reference numeral 3274 denotes a word line connected to the gate electrode of the MFSFET 3270 at the selected address. Moreover, reference numeral 3277 denotes the first data storing place of the MFSFET 3270.

In this case, to read remanent polarization data from the first data storing place 3277 of the selected MFSFET 3270, potential (1/4) V is supplied to the selected word line 3274, potential 0 is supplied to the selected first bit line 3271, and potential (1/4) V is supplied to the selected second bit line 3272.

Then, the MFSFET 3270 is turned on and operates in a saturated region because it is an N-type MFSFET and potential (1/4) V is supplied to the gate electrode of it from the word line 3274, potential 0 is supplied to the source electrode of it from the first bit line 3271, and potential (1/4) V is supplied to the drain electrode of it from the second bit line 3272.

Therefore, the current when the directionality of remanent polarization of the first data storing place 3277 located at the source side of an N-type MFSFET influences the threshold voltage of the MFSFET flows between the fist bit line 3271 and the second bit line 3272. Therefore, by detecting the current by the read circuit 1556 in FIG. 15, it is possible to determine 1 or 0 of read data in accordance with the magnitude of the detected current.

In this case, potential 0 is supplied to all other unselected word lines 3275 and unselected bit lines 3273. As a result, no current flows because other MFSFETs at unselected addresses are turned off. Moreover, because only voltage equal to or lower than coercive voltage of 0 [V] or (1/4) V is applied to ferroelectric thin films of all MFSFETs, remanent polarization data is kept.

Figure 33:
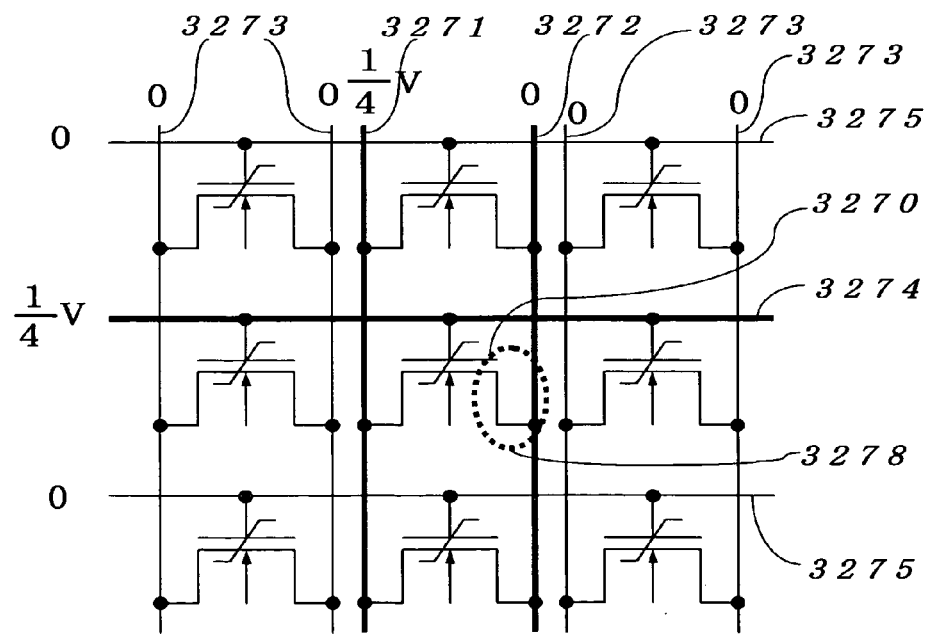
FIG. 33 is an illustration for potential control of various portions when reading the other data from selected one of N-type MFSFETs arranged like a matrix by using five types of potentials.

FIG. 33 shows a relation between selected word line WA, unselected word line WI, selected first bit line B1, selected second bit line B2, and unselected bit line BI when reading remanent polarization data from the second data storing place of a selected MFSFET.

In FIG. 33, reference numeral 3270 denotes an N-type MFSFET at a selected address, 3271 denotes a first bit line connected to a first electrode serving as the source or drain of the MFSFET 3270, and 3272 denotes a second bit line connected to a second electrode serving as the drain or source of the MFSFET 3270. Reference numeral 3274 denotes a word line connected to the gate electrode of the MFSFET 3270 at the selected address. Moreover, reference numeral 3278 denotes the second data storing place of the MFSFET 3270.

In this case, to read remanent polarization from the second data storing place 3278 of the selected MFSFET 3270, potential (1/4) V is supplied to the selected word line 3274, potential 0 is supplied to the selected second bit line 3272, and potential (1/4) V is supplied to the selected first bit line 3271.

Then, the MFSFET 3270 is turned on and operates in a saturated region because it is an N-type MFSFET and potential (1/4) V is supplied to the gate electrode of it from the word line 3274, potential 0 [V] is supplied to the source electrode of it from the second bit line 3272, and potential (1/4) V is supplied to the drain electrode of it from the first bit line 3271.

Therefore, the current when the directionality of the remanent polarization of the second data storing place 3278 located at the source side of the N-type MFSFET influences the threshold voltage of the MFSFET flows between the second bit line 3272 and the first bit line 3271. Therefore, by detecting the current by the read circuit 1556 in FIG. 15, it is possible to determine 1 or 0 of read data in accordance with the magnitude of the detected current.

In this case, potential 0 is supplied to all other unselected word lines 3275 and unselected bit lines 3273. As a result, no current flows because other MFSFETs at unselected addresses are turned off. Moreover, only voltage of equal to or lower than coercive voltage of 0 [V] or (1/4) V is applied to ferroelectric thin films of all MFSFETs, the remanent polarization data is kept.

(Second Configuration of Memory Cell of the Present Invention)

Figure 34:
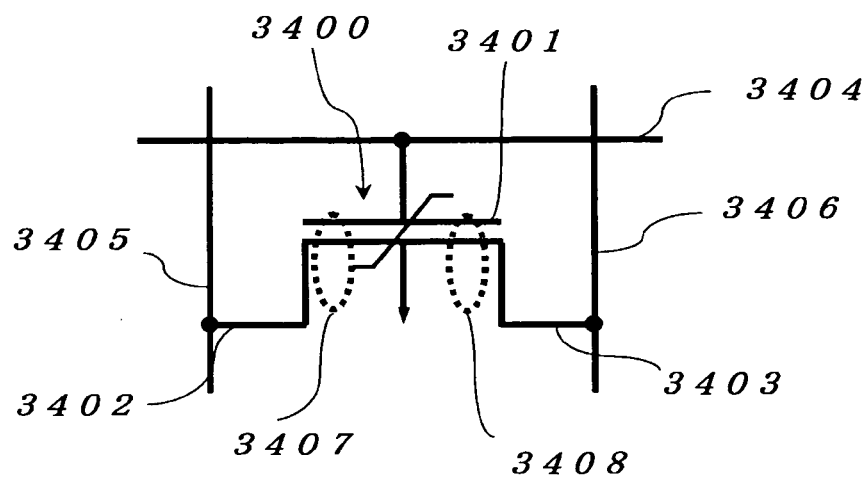
FIG. 34 is a circuit diagram showing a second configuration of a memory cell used for a ferroelectric memory device of the present invention.

FIG. 34 is a circuit diagram showing a configuration of a second example of a memory cell serving as the basic unit of a ferroelectric memory device of the present invention.

As shown in FIG. 34, this memory cell is constituted of a P-type MFSFET 3400, word line 3404, first bit line 3405, and second bit line 3406. That is, the memory cell is obtained by replacing the N-type MFSFET 100 of the memory cell shown in FIG. 1 with the P-type MFSFET 3400.

The P-type MFSFET 3400 is constituted of a gate electrode 3401, a first electrode 3402 serving as a source or drain and constituted of P$^+$ diffusion, and a second electrode 3403 serving as a drain or source and constituted of P$^+$ diffusion. Moreover, in the P-type MFSFET 3400, the word line 3404 is connected to the gate electrode 3401, the first bit line 3405 is connected to the first electrode 3402, and the second bit line 3406 is connected to the second electrode 3403. In the P-type MFSFET 3400 in FIG. 34, a ferroelectric thin film is embedded immediately below the gate electrode 3401 and this point is the same as the case of the N-type MFSFET 100 shown in FIG. 1.

Thus, the memory cell shown in FIG. 34 is obtained by replacing the N-type MFSFET 100 of the memory cell shown in FIG. 1 with the P-type MFSFET 3400. Therefore, the memory cell shown in FIG. 34 basically has a configuration and function same as those of the memory cell shown in FIG. 1 except that positives and negatives of a power supply and voltage to be controlled are reversed and can hold two-bit remanent polarization data.

Figure 35:
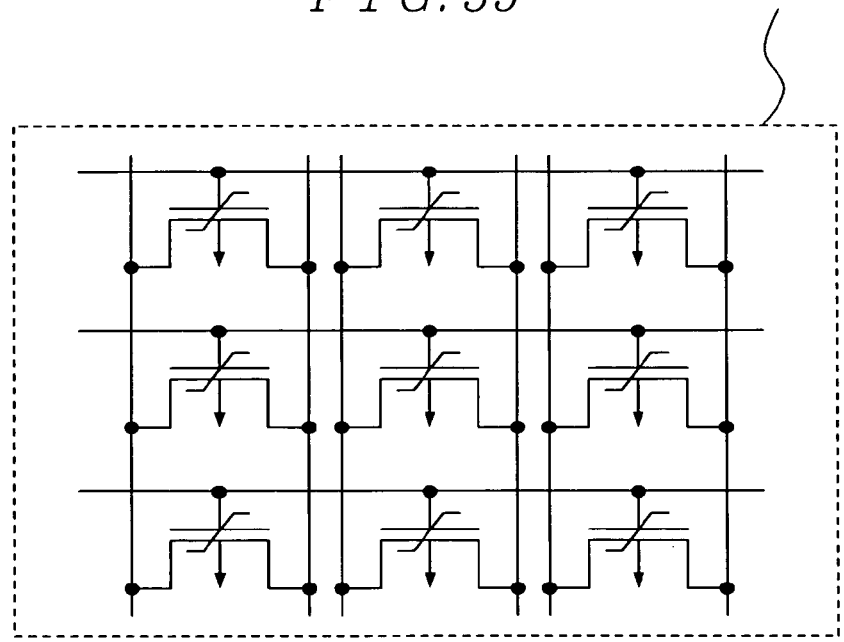
FIG. 35 is a circuit diagram showing a configuration of a memory cell group constituted of a P-type MFSFET.

FIG. 35 shows a circuit on which a memory cell group 3520 is formed by arranging unit memory cells shown in FIG. 34 like a matrix. The memory 3520 shown in FIG. 35 is obtained by replacing an N-type MFSFET with a P-type MFSFET in the memory cell group 1520 shown in FIG. 15. Even if replacing the N-type MFSFET with the P-type MFSFET, the configuration of an MFSFET, word line, first bit line, and second bit line is the same. Therefore, though peripheral circuits of the memory cell group 3520 are not illustrated, the same circuits as the peripheral circuits shown in FIG. 15 are basically used.

Embodiment 4 of Control Method of Word Line and Bit Line

FIGS. 36, 37, 38, 39, 40, and 41 show a case of replacing the MFSFET of a memory cell with the above-described P-type MFSFET and are drawings showing relations between word lines and bit lines for using three types of potentials for control by setting intermediate potential (1/2) V when the potential of power supply ranges between 0 [V] and V[V].

Figure 36:
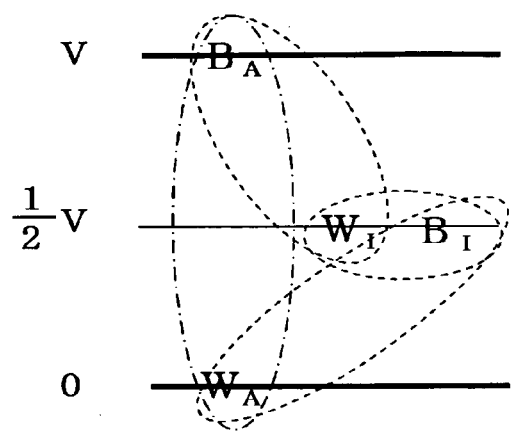
FIG. 36 is an illustration for potential control of various portions when writing data 1 in a P-type MFSFET at a selected address by using three types of potentials.

FIG. 36 shows a relation between selected word line WA, unselected word line WI, selected bit line BA, and unselected bit line BI when writing data 1 in a memory cell at a selected address. In FIG. 36, potential 0 is supplied to the selected word line WA, potential V is supplied to the selected bit line BA, (1/2) V is supplied to the unselected word line WI, and potential (1/2) V is supplied to the unselected bit line BI. In this case, when voltage −V is applied to the ferroelectric thin film of the memory cell, data 1 is written, and remanent polarization is kept when voltage ±(1/2) V or 0 is applied to the ferroelectric thin film.

Figure 37:
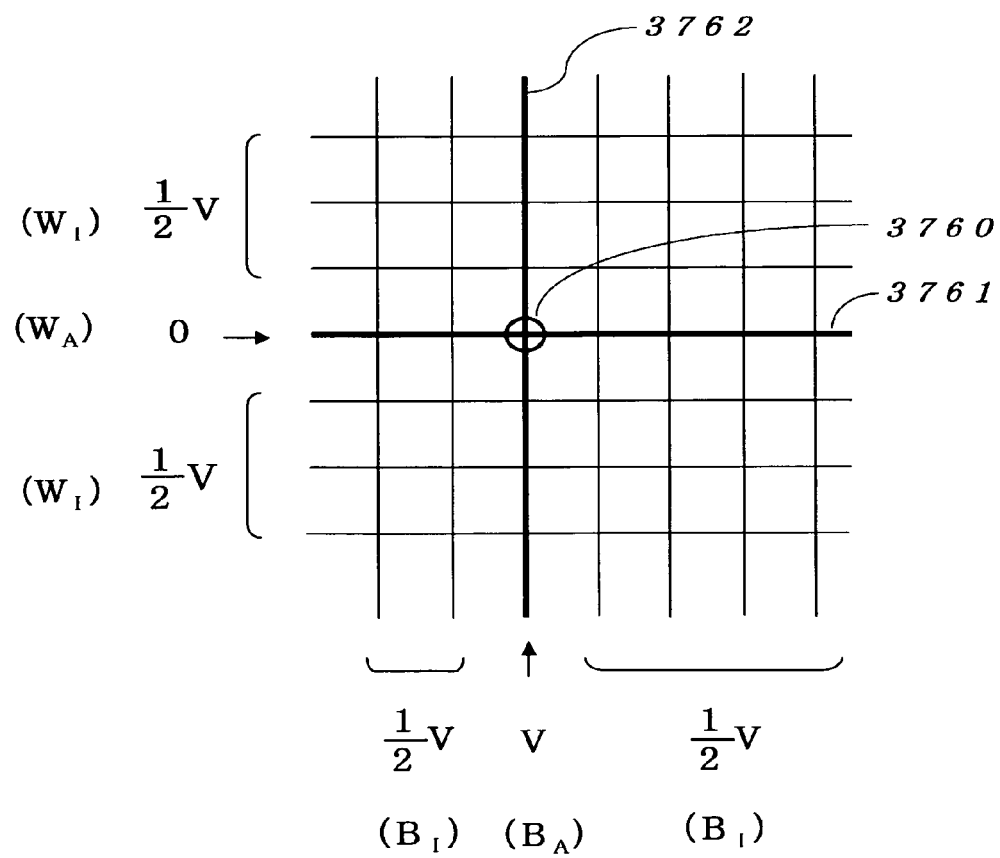
FIG. 37 is an illustration for potential control of various portions when writing data 1 in selected one of P-type MFSFETs arranged like a matrix by using three types of potentials.

FIG. 37 shows the potential of each word line and the potential of each bit line when writing data 1 in only a memory cell at a selected address while word line group and bit line group are actually arranged like a matrix. In FIG. 37, reference numeral 3760 denotes a memory cell in which data 1 should be written, 3761 denotes a word line at a selected address, and 3762 denotes a bit line at a selected address.

In this case, potential 0 is supplied to the word line 3761 at the selected address and potential V is supplied to the selected bit line 3762 and (1/2) V is supplied to word lines and bit lines at unselected addresses. In this case, voltage −V is applied to only the ferroelectric thin film of the memory cell 3760 at the selected address and voltage ±(1/2) V or 0 is applied to the ferroelectric thin film of other memory cells at unselected addresses.

Therefore, voltage equal to or higher than coercive voltage is applied to only the memory cell 3760 at the selected address, data 1 is written but data in memory cells at unselected addresses is not changed because they respectively have voltage equal to or lower than the coercive voltage even if they have different values.

Figure 38:
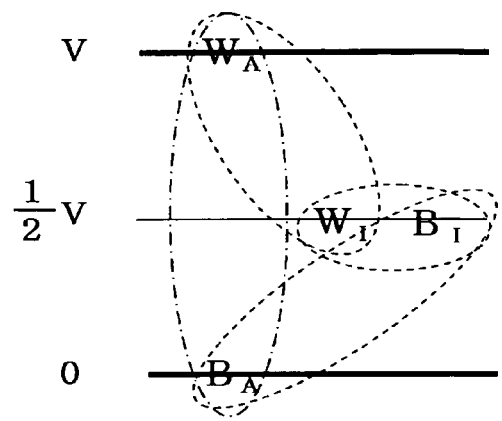
FIG. 38 is an illustration for potential control of various portions when writing data 0 in a P-type MFSFET at a selected address by using three types of potentials.

FIG. 38 shows a relation between selected word line WA, unselected word line WI, selected bit line BA, and unselected bit line BI when writing data 0 in a memory cell at a selected address. In FIG. 38, the selected word line WA is set to potential V, the selected bit line BA is set to potential 0, the unselected word line WI is set to (1/2) V, and the unselected bit line BI is set to (1/2) V. In this case, when voltage V is applied to the ferroelectric thin film of the memory cell, data 0 is written and remanent polarization is kept in the ferroelectric thin film when voltage ±(1/2) V or 0 is applied to the ferroelectric thin film.

Figure 39:
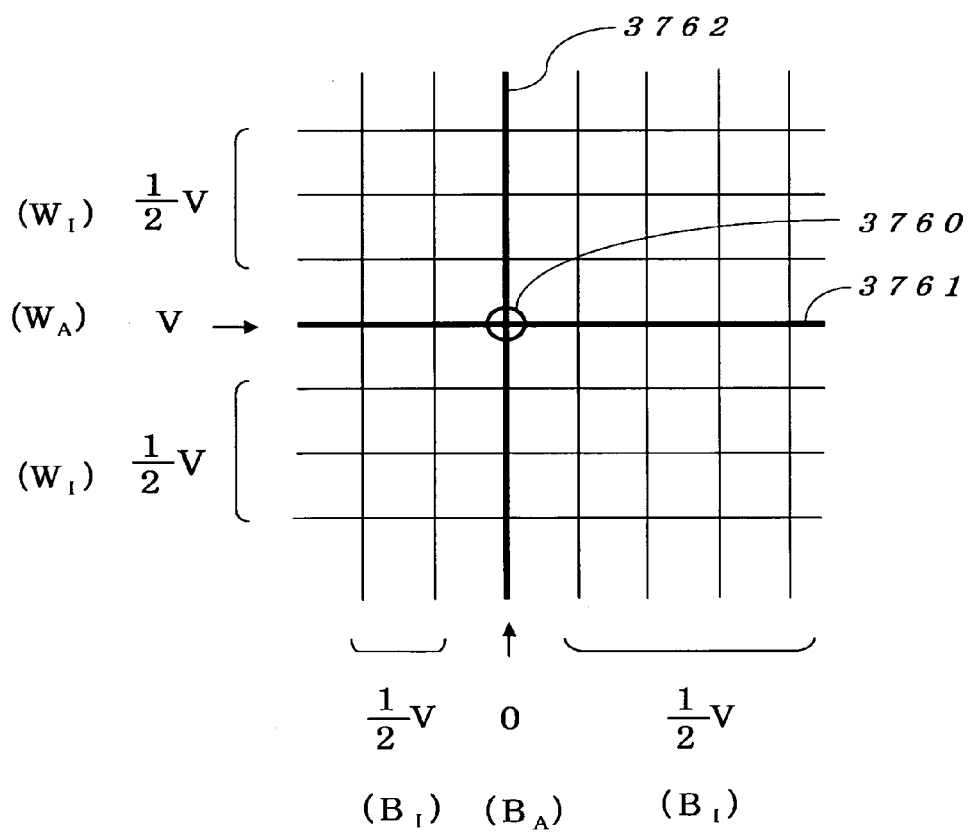
FIG. 39 is an illustration for potential control of various portions when writing data 0 in selected one of P-type MFSFETs arranged like a matrix by using three types of potentials.

FIG. 39 shows the potential of each word line and the potential of each bit line when writing data 0 in only a memory cell at a selected address while word line group and bit line group are actually arranged like a matrix. In FIG. 39, reference numeral 3760 denotes a memory cell at an address in which data 0 should be written, 3761 denotes a word line at a selected address, and 3762 denotes a bit line at a selected address.

In this case, potential V is supplied to the word line 3761 at the selected address and potential 0 is supplied to the selected bit line 3762 and (1/2) V is supplied to all other word lines and bit lines at unselected addresses. In this case, voltage V is applied to only the ferroelectric thin film of the memory cell 3760 at the selected address and voltage ±(1/2) V or 0 is applied to ferroelectric thin films of other memory cells at unselected addresses.

Therefore, voltage equal to or higher than coercive voltage is applied to only a memory cell at a selected address, data 0 is written, and other memory cells at unselected addresses are not influenced because they respectively have voltage equal to or lower than coercive voltage even if they have different values.

Figure 40:
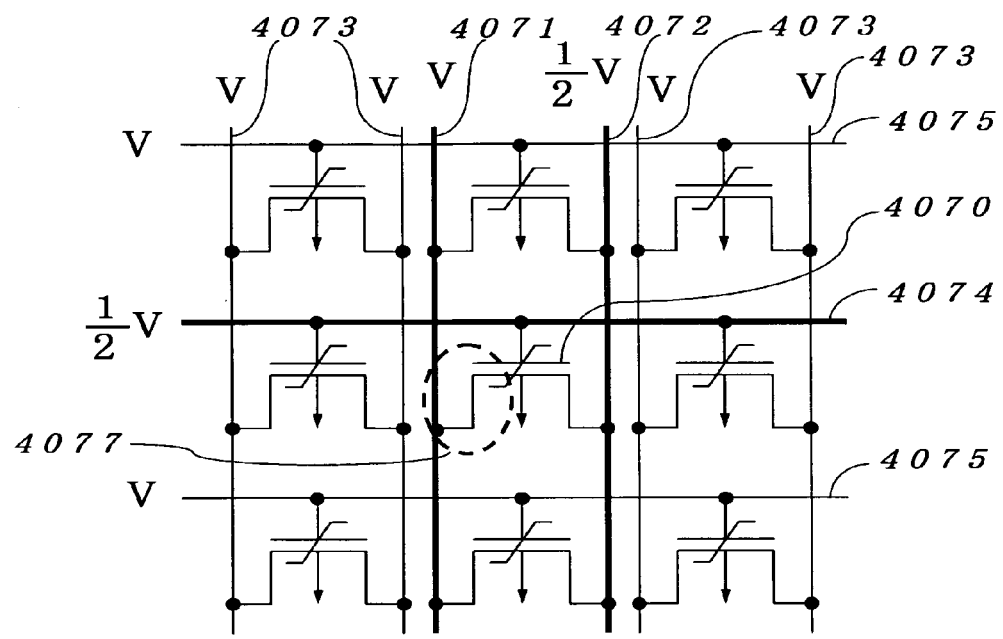
FIG. 40 is an illustration for potential control of various portions when reading one data from selected one of P-type MFSFETs arranged like a matrix by using three types of potentials.

FIG. 40 shows a relation between selected word line WA, unselected word line WI, selected first bit line B1, selected second bit line B2, and unselected bit line BI when reading remanent polarization data from the first data storing place of the selected MFSFET.

In FIG. 40, reference numeral 4070 denotes a P-type MFSFET at a selected address, 4071 denotes a first bit line connected to a first electrode serving as the source or drain of the MFSFET 4070 and 4072 denotes a second bit line connected to a second electrode serving as the drain or source of the MFSFET 4070. Reference numeral 4074 denotes a word line connected to the gate electrode of the MFSFET 4070 at the selected address. Reference numeral 4077 denotes a first data storing place of the MFSFET.

In this case, to read remanent polarization data from the fist data storing place 4077 of the selected MFSFET 4070, potential (1/2) V is supplied to the selected word line 4074, potential V is supplied to the selected first bit line 2071, and potential (1/2) V is supplied to the selected second bit line 2072.

Then, the MFSFET 4070 is turned on and operates in a saturated region because it is a P-type MFSFET and potential (1/2) V is supplied to the gate electrode of it from the word line 4074, potential V is supplied to the source electrode of it from the first bit line 4071, and potential (1/2) V is supplied to the drain electrode of it from the second bit line 2072.

Therefore, the current when the directionality of the remanent polarization of the first data storing place 4077 located at the source side of the P-type MFSFET influences the threshold voltage of the MFSFET flows between the first bit line 4071 and the second bit line 4072. Then, by detecting the current by the read circuit shown in FIG. 15, it is possible to determine 1 or 0 of read data in accordance with the magnitude of the detected current.

In this case, potential V is supplied to all other unselected word lines 4075 and unselected bit lines 4073. As a result, no current flows because other MFSFETs at unselected addresses are turned off. Moreover, because only voltage equal to or lower than coercive voltage of 0 [V] or (1/2) V is applied to ferroelectric thin films of all MFSFETs, remanent polarization data is kept.

Figure 41:
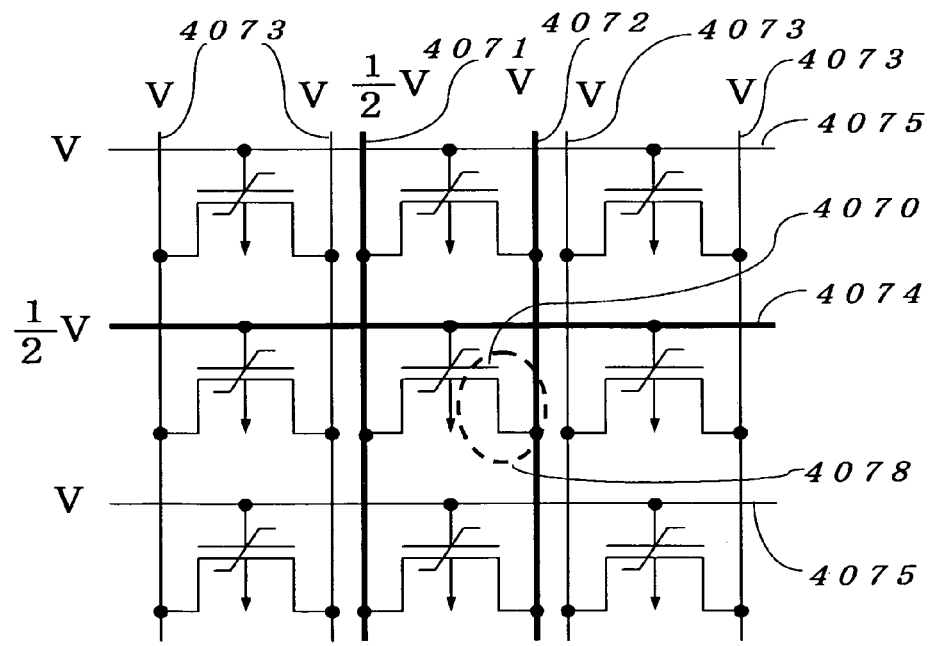
FIG. 41 is an illustration for potential control of various portions when reading the other data from selected one of P-type MFSFETs arranged like a matrix by using three types of potentials.

FIG. 41 shows a relation between selected word line WA, unselected word line WI, selected first bit line B1, selected second bit line B2, and unselected bit line BI when reading the remanent polarization data from the second data storing place of the selected MFSFET.

In FIG. 41, reference numeral 4070 denotes a P-type MFSFET at a selected address, 4071 denotes a first bit line connected to a first electrode serving as the source or drain of the MFSFET 4070, and 4072 denotes a second bit line connected to a second electrode serving as the drain or source of the MFSFET 4070. Reference numeral 4074 denotes a word line connected to the gate electrode of the MFSFET 4070 at the selected address. Moreover, reference numeral 4078 denotes a second data storing place of the MFSFET 4070.

In this case, to read remanent polarization data from the second data storing place 4078 of the selected MFSFET 4070, potential (1/2) V is supplied to the selected word line 4074, potential V is supplied to the selected second bit line 4072, and potential (1/2) V is supplied to the selected first bit line 4071.

Then, the MFSFET 4070 is turned on and operates in a saturated region because it is a P-type MFSFET and potential (1/2) V is supplied to the gate electrode of it from the word line 4074, potential V is supplied to the source electrode of it from the second bit line 4072, and potential (1/2) V is supplied to the drain electrode of it from the first bit line 4071.

Therefore, the current when the directionality of the remanent polarization of the second data storing place 4078 located at the source side of the P-type MFSFET influences the threshold voltage of the MFSFET flows between the second bit line 4072 and the first bit line 4071. Therefore, by detecting the current by the read circuit shown in FIG. 15, it is possible to determine 1 or 0 of read data in accordance with the magnitude of the detected current.

In this case, potential V is supplied to all other unselected word lines 4075 and unselected bit lines 4073. As a result, no current flows because other MFSFETs at unselected addresses are turned off. Moreover, because only voltage equal to or lower than coercive voltage of 0 [V] or (1/2) V is applied to ferroelectric thin films of all MFSFETs, remanent polarization data is kept.

Embodiment 5 of Control Method of Word Line and Bit Line

FIGS. 42, 43, 44, 45, 46, and 47 are illustrations showing relations between word lines and bit lines for using four types of potentials for control by setting two intermediate potentials (1/3) V and (2/3) V when replacing the MFSFET of a memory cell with the above-described P-type MFSFET and the potential of power supply ranges between 0 [V] and V[V].

FIG. 42 shows a relation between selected word line WA, unselected word line WI, selected bit line BA, and unselected bit line BI when writing data 1 in the address of a selected memory cell. In FIG. 42, the selected word line WA is set to potential 0, the selected bit line BA is set to potential (2/3) V, unselected word line WI is set to (2/3) V, and unselected bit line BI is set to (1/3) V. In this case, when voltage −(2/3) V is applied to the ferroelectric thin film of the memory cell, data 1 is written and remanent polarization is kept when voltage ±(1/3) V or 0 is applied to the ferroelectric thin film.

FIG. 43 shows the potential of each word line and the potential of each bit line when writing data 1 in only a memory cell at a selected address while word line group and bit line group are actually arranged like a matrix. In FIG. 43, reference numeral 4360 denotes a memory cell at an address in which data 1 should be written, 4361 denotes a word line at a selected address, and 4362 denotes a bit line at a selected address.

In this case, potential 0 is supplied to the word line 4361 at the selected address and potential (2/3) V is supplied to the selected bit line 4362, and (2/3) V is supplied to other word lines at unselected addresses and (1/3) V is supplied to all other bit lines at unselected addresses. In this case, voltage −(2/3) V is applied to only the ferroelectric thin film of the memory cell 4360 at the selected address and voltage ±(1/3) V or 0 is applied to ferroelectric thin films of other memory cells at unselected addresses.

Therefore, voltage equal to or higher than coercive voltage is applied to only the memory cell at the selected address, data 1 is written, but other memory cells at unselected addresses are not influenced because they respectively have voltage equal to or lower than coercive voltage even if they have different values.

Figure 44:
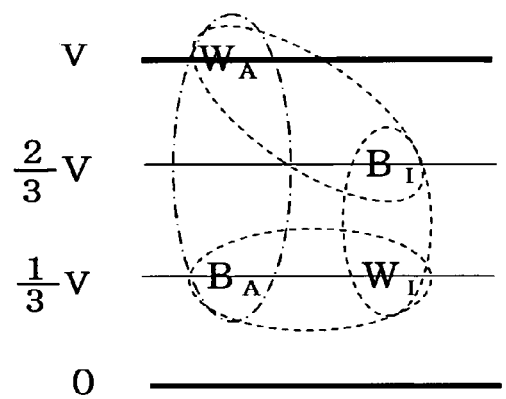
FIG. 44 is an illustration for potential control of various portions when writing data 0 in a P-type MFSFET at a selected address by using four types of potentials.

FIG. 44 shows a relation between selected word line WA, unselected word line WI, selected bit line BA, and unselected bit line BI when writing data 0 in a memory cell at a selected address. In FIG. 44, the selected word line WA is set to potential V, the selected bit line BA is set to potential (1/3) V, the unselected word line WI is set to (1/3) V and the unselected bit line BI is set to potential (2/3) V. In this case, when voltage (2/3) V is applied to the ferroelectric thin film of the memory cell, data 0 is written, and remanent polarization is kept when voltage ±(1/3) V or 0 is applied to the ferroelectric thin film.

Figure 45:
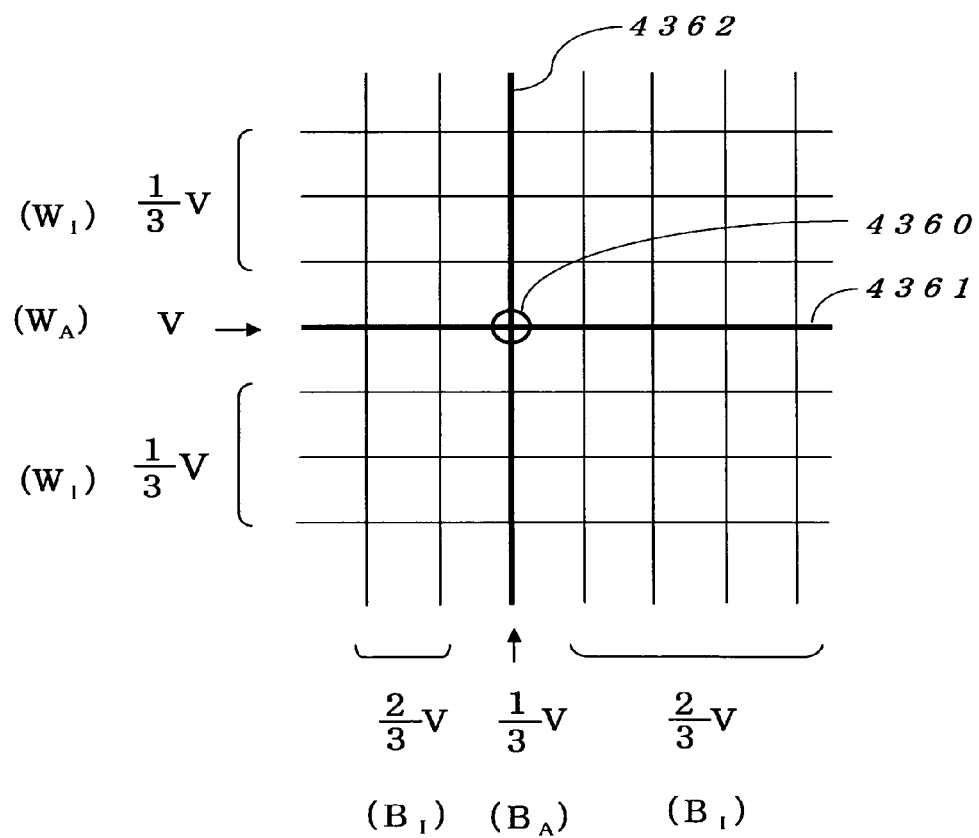
FIG. 45 is an illustration for potential control of various portions when writing data 0 in selected one of P-type MFSFETs arranged like a matrix by using four types of potentials.

FIG. 45 shows the potential of each word line and the potential of each bit line when writing data 0 in only a memory cell at a selected address while word line group and bit line group are actually arranged like a matrix. In FIG. 45, reference numeral 4360 denotes a memory cell at an address in which data 1 should be written, 4361 denotes a word line at a selected address, and 4362 denotes a bit line at a selected address.

In this case, potential V is supplied to the word line 4361 at the selected address and potential (1/3) V is supplied to the selected bit line 4362, and (1/3) V is supplied to other word lines at unselected addresses and (2/3) V is supplied to all other bit lines at unselected addresses. In this case, voltage (2/3) V is applied to only the ferroelectric thin film of the memory cell 4360 at the selected address and voltage ±(1/3) V or 0 is applied to ferroelectric thin films of other memory cells at unselected addresses.

Therefore, voltage equal to or higher than coercive voltage is applied to only a memory cell at a selected address, data 0 is written, but other memory cells at unselected addresses are not influenced because they respectively have voltage equal to or lower than coercive voltage even if they have different values.

Figure 46:
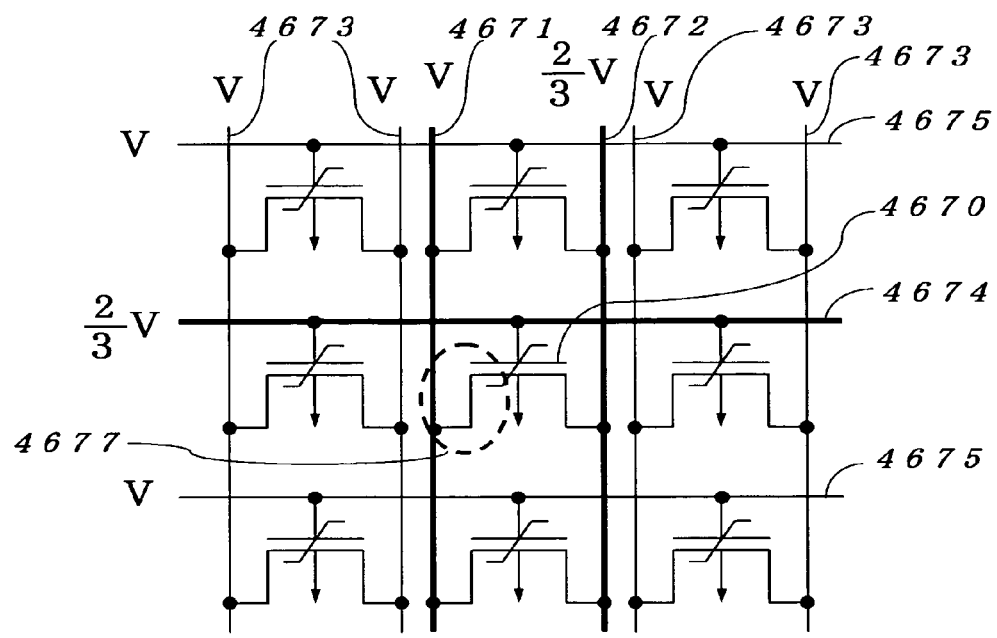
FIG. 46 is an illustration for potential control of various portions when reading one data from selected one of P-type MFSFETs arranged like a matrix by using four types of potentials.

FIG. 46 shows a relation between selected word line WA, unselected word line WI, selected first bit line B1, selected second bit line B2, and unselected bit line BI when reading remanent polarization data from the first data storing place of the selected MFSFET.

In FIG. 46, reference numeral 4670 denotes a P-type MFSFET at a selected address, 4671 denotes a first bit line connected to a first electrode serving as the source or drain of the MFSFET 4670, and 4672 denotes a second bit line connected to a second electrode serving as the drain or source of the MFSFET 4670. Reference numeral 4674 denotes a word line connected to the gate electrode of the MFSFET 4670 at the selected address. Moreover, reference numeral 4677 denotes the first data storing place of the MFSFET 4670.

In this case, to read remanent polarization data from the first data storing place 4677 of the selected MFSFET 4670, potential (2/3) V is supplied to the selected word line 4674, potential V is supplied to the selected first bit line 4671, and potential (2/3) V is supplied to the selected second bit line 4672.

Then, the MFSFET 4670 is turned on and operates in a saturated region because it is a P-type MFSFET and potential (2/3) V is supplied to the gate electrode of it from the word line 4674, potential V is supplied to the source electrode of it from the first bit line 4671, and potential (2/3) V is supplied to the drain electrode of it from the second bit line 4672.

Therefore, the current when the directionality of the remanent polarization of the first data storing place 4677 located at the source side of the P-type MFSFET influences the threshold voltage of the MFSFET flows between the fist bit line 4671 and the second bit line 4672. Therefore, by detecting the current by the read circuit shown in FIG. 15, it is possible to determine 1 or 0 of read data in accordance with the magnitude of the detected current.

In this case, potential V is supplied to all other unselected word lines 4675 and unselected bit lines 4673. As a result, no current flows because other MFSFETs at unselected addresses are turned off. Moreover, because only voltage equal to or lower than the coercive voltage of 0 [V] or (1/3)

V is applied to ferroelectric thin films of all MFSFETs, remanent polarization data is kept.

Figure 47:
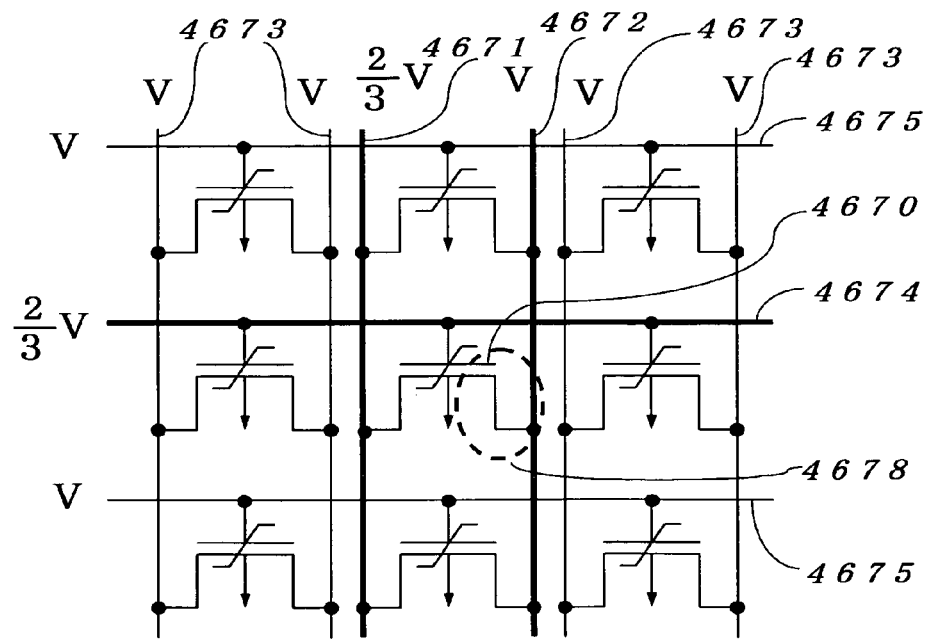
FIG. 47 is an illustration for potential control of various portions when reading the other data from selected one of P-type MFSFETs arranged like a matrix by using four types of potentials.

FIG. 47 shows a relation between selected word line WA, unselected word line WI, selected first bit line B1, selected second bit line B2, and unselected bit line BI when reading the remanent polarization data from the second data storing place of the selected MFSFET.

In FIG. 47, reference numeral 4670 denotes a P-type MFSFET at a selected address, 4671 denotes a first bit line connected to a first electrode serving as the source or drain of the MFSFET 4670, and 4672 denotes a second bit line connected to a second electrode serving as the drain or source of the MFSFET 4670. Reference numeral 4674 denotes a word line connected to the gate electrode of the MFSFET 4670 at the selected address. Reference numeral 4678 denotes the second data storing place of the MFSFET 4670.

In this case, to read remanent polarization data from the second data storing place 4678 of the MFSFET 4670, potential (2/3) V is supplied to the selected word line 4674, potential V is supplied to the selected second bit line 4672, and potential (2/3) V is supplied to the selected first bit line 4671.

Then, the MFSFET 4670 is turned on and operates in a saturated region because it is a P-type MFSFET and potential (2/3) V is supplied to the gate electrode of it from the word line 4674, potential V is supplied to the source electrode of it from the second bit line 4672, and potential (2/3) V is supplied to the drain electrode of it from the first bit line 4671.

Therefore, the current when the directionality of the remanent polarization of the second data storing place 4678 located at the source side of the P-type MFSFET influences the threshold voltage of the MFSFET flows between the second bit line 4672 and the first bit line 4671. Therefore, by detecting the current by the read circuit shown in FIG. 15, it is possible to determine 1 or 0 of read data in accordance with the magnitude of the detected current.

In this case, potential V is supplied to other unselected word lines 4675 and unselected bit lines 4673. As a result, no current flows because other MFSFETs at unselected addresses are turned off. Moreover, only voltage equal to or lower than coercive voltage 0 [V] or (1/3) V is applied to ferroelectric thin films of all MFSFETs, remanent polarization data is kept.

Embodiment 6 of Control Method of Word Line and Bit Line

FIGS. 48, 49, 50, 51, 52, and 53 are illustrations showing relations between word lines and bit lines for using five types of potentials for control by setting three intermediate potentials (1/4) V, (2/4) V, and (3/4) V when the MFSFET of a memory cell is replaced with the above-described P-type MFSFET and potential of power supply ranges between 0[V} and V[V] (refer to FIG. 48).

FIG. 48 shows a relation between selected word line WA, unselected word line WI, selected bit line BA, and unselected bit line BI when writing data 1 in a memory cell at a selected address. In FIG. 48, the selected word line WA is set to potential 0, the selected bit line BA is set to potential (3/4) V, the unselected word line WI is set to potential (2/4) V, and the unselected bit line BI is set to potential (1/4) V. In this case, when voltage −(3/4) V is applied to the ferroelectric thin film of the memory cell, data 1 is written, and remanent polarization is kept when voltage ±(1/4) V or 0 is applied to the ferroelectric thin film.

FIG. 49 shows the potential of each word line and the potential of each bit line when writing data 1 in only a memory cell at a selected address while word line group and bit line group are actually arranged like a matrix. In FIG. 49, reference numeral 4960 denotes a memory cell at an address in which data 1 should be written, 4961 denotes a word line at a selected address, and 4962 denotes a bit line at a selected address.

In this case, potential 0 is supplied to the word line 4961 at a selected address and potential (3/4) V is supplied to the selected bit line 4962, potential (2/4) V is supplied to other bit lines at unselected addresses, and potential (1/4) V is supplied to all other bit lines at unselected addresses. In this case, voltage −(3/4) V is applied to only the ferroelectric thin film of the memory cell 4960 at the selected address and voltage ±(1/4) V is applied to ferroelectric thin films of other memory cells at unselected addresses.

Therefore, voltage equal to or higher than coercive voltage is applied to only the memory cell 4960 at a selected address, data 1 is written, and other memory cells at unselected addresses are not influenced because they respectively have voltage equal to or lower than coercive voltage even if they have different values.

Figure 50:
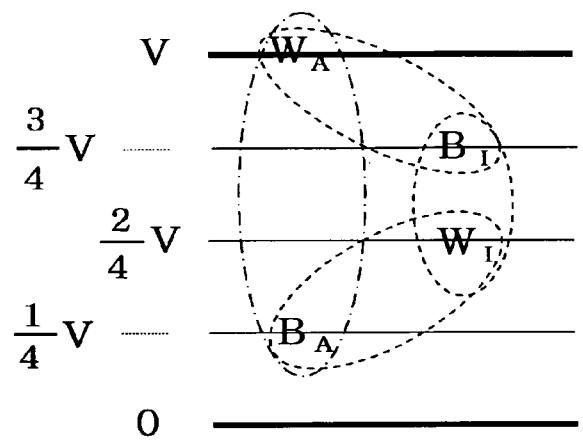
FIG. 50 is an illustration for potential control of various portions when writing data 0 in a P-type MFSFET at a selected address by using five types of potentials.

FIG. 50 shows a relation between selected word line WA, unselected word line WI, selected bit line BA, and unselected bit line BI when writing data 0 in a memory cell at a selected address. In FIG. 50, the selected word line WA is set to potential V, the selected bit line BA is set to potential (1/4) V, the unselected word line WI is set to (2/4) V, and the unselected bit line BI is set to (3/4) V. In this case, when (3/4) V is applied to the ferroelectric thin film of the memory cell, data 0 is written and remanent polarization is kept when potential ±(1/4) V or 0 is applied to the ferroelectric thin film.

Figure 51:
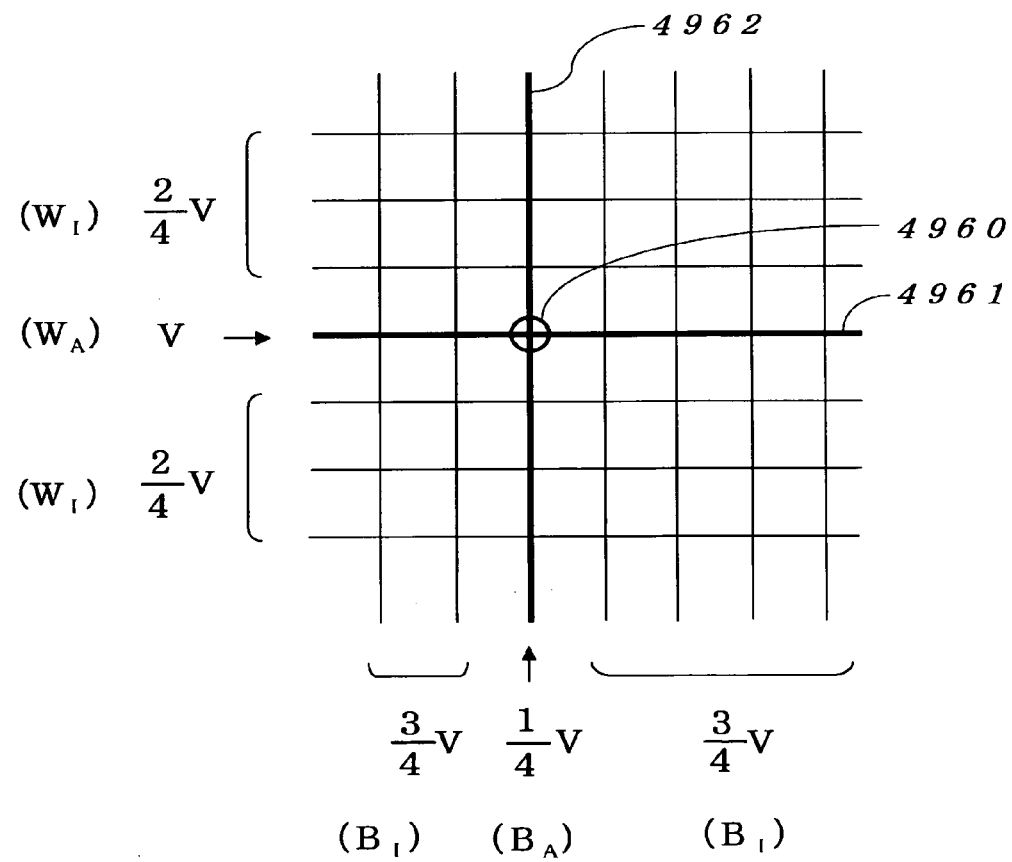
FIG. 51 is an illustration for potential control of various portions when writing data 0 in selected one of P-type MFSFETs arranged like a matrix by using five types of potentials.

FIG. 51 shows the potential of each word line and the potential of each bit line when writing data 0 in only a memory cell at a selected address while word line group and bit line group are actually arranged like a matrix. In FIG. 51, reference numeral 4960 denotes a memory cell at an address in which data 0 should be written, 4961 denotes a word line at a selected address, and 4962 denotes a bit line at a selected address.

In this case, potential V is supplied to the word line 4961 at a selected address and potential (1/4) V is supplied to the selected bit line 4962 and potential (2/4) V is supplied to other word lines at unselected addresses and potential (3/4) V is supplied to all other bit lines at unselected addresses. In this case, voltage (3/4) V is applied to only the ferroelectric thin film of the memory cell 4960 at a selected address and voltage ±(1/4) V is applied to ferroelectric thin films of other memory cells at unselected addresses.

Therefore, voltage equal to or higher than coercive voltage is applied to only the memory cell 4960 at the selected address, data 0 is written, and other memory cells at unselected addresses are not influenced because they respectively have a voltage equal to or lower than the coercive voltage even if they have different values.

Figure 52:
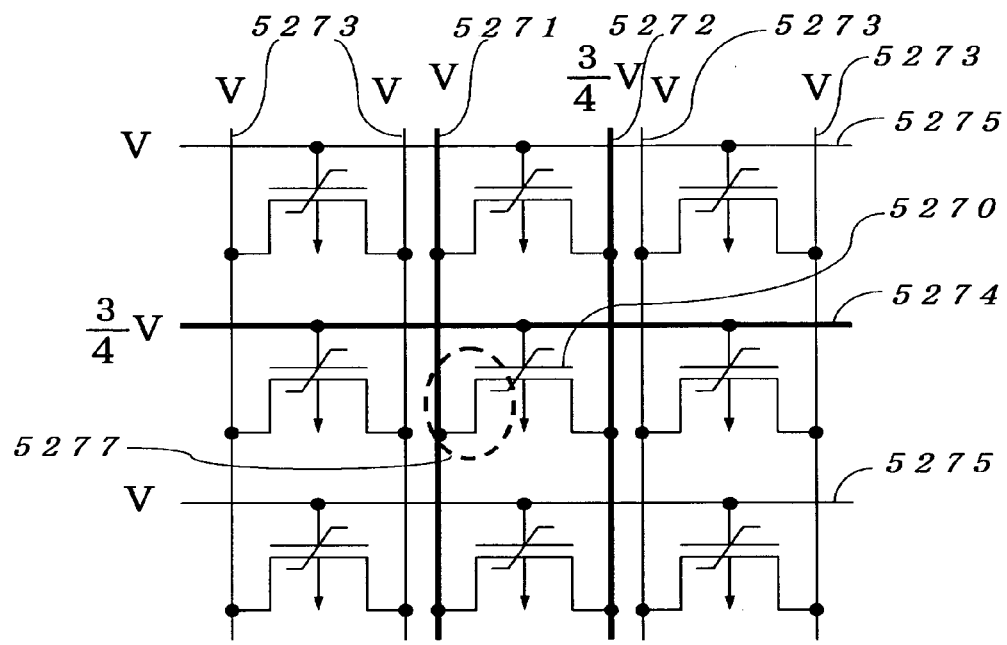
FIG. 52 is an illustration for potential control of various portions when reading one data from selected one of P-type MFSFETs arranged like a matrix by using five types of potentials.

FIG. 52 shows a relation between selected word line WA, unselected word line WI, selected first bit line B1, selected-pair second bit line B2, and unselected bit line BI when reading remanent polarization data from the first data storing place of a selected MFSFET.

In FIG. 52, reference numeral 5270 denotes a P-type MFSFET at a selected address, 5271 denotes a first bit line connected to a first electrode serving as the source or drain of the MFSFET 5270, and 5272 denotes a second bit line connected to a second electrode serving as the drain or source of the MFSFET 5270. Reference numeral 5274 denotes a word line connected to the gate electrode of the MFSFET 5270 at the selected address. Moreover, reference numeral 5277 denotes the first data storing place of the MFSFET 5270.

In this case, to read remanent polarization data from the first data storing place 5277 of the selected MFSFET 5270, potential (3/4) V is supplied to the selected word line 5274, potential V is supplied to the selected first bit line 5271, and potential (3/4) V is supplied to the selected second bit line 5272.

Then, the MFSFET 5270 is turned on and operates in a saturated region because it is a P-type MFSFET and potential (3/4) V is supplied to the gate electrode of it from the word line 5274, potential V is supplied to the source electrode of it from the first bit line 5271, and potential (3/4) V is supplied to the drain electrode of it from the second bit line 5272.

Therefore, the current when the directionality of the first data storing place 5277 located at the source side of the P-type MFSFET influences the threshold voltage of the MFSFET flows between the first bit line 5271 and the second bit line 5272. Therefore, by detecting the current by the read circuit shown in FIG. 15, it is possible to determine 1 or 0 of read data in accordance with the magnitude of the detected current.

In this case, potential V is supplied to all other unselected word lines 5275 and unselected bit lines 5273. As a result, no current flows because other MFSFETs at unselected addresses are turned off. Moreover, because only voltage equal to or lower than coercive voltage of 0 [V] or (1/4) V is applied to ferroelectric thin films of all MFSFETs, remanent polarization data is kept.

Figure 53:
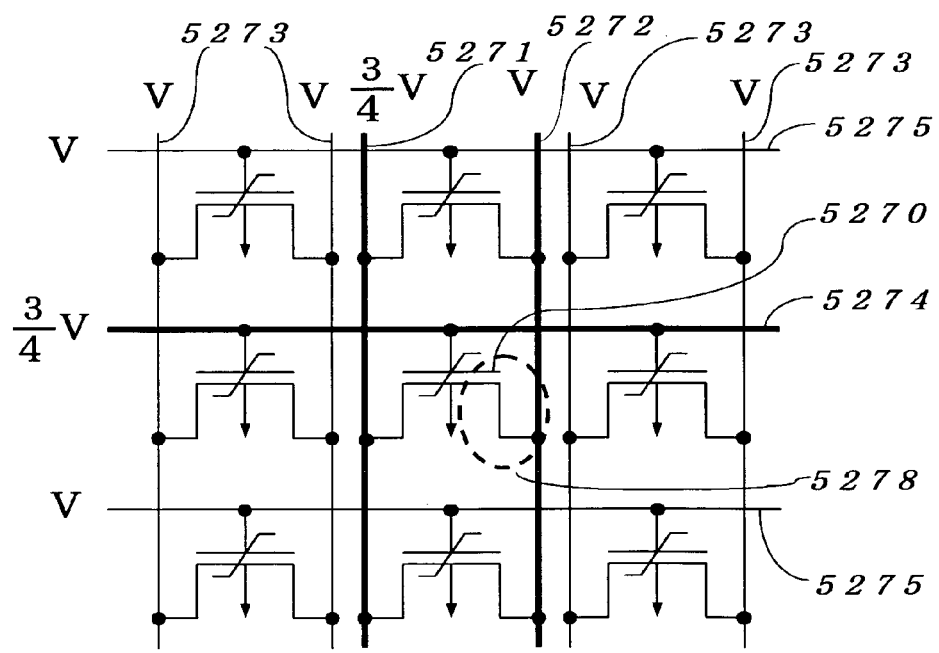
FIG. 53 is an illustration for potential control of various portions when reading the other data from selected one of P-type MFSFETs arranged like a matrix by using five types of potentials.

FIG. 53 shows a relation between selected word line WA, unselected word line WI, selected first bit line B1, selected-pair second bit line B2, and unselected bit line BI when reading the remanent polarization data from the second data storing place of the selected MFSFET.

In FIG. 53, reference numeral 5270 denotes a P-type MFSFET at a selected address, 5271 denotes a first bit line connected to a first electrode serving as the source or drain of the MFSFET 5270, 5272 denotes a second bit line connected to a second electrode serving as the drain or source of the MFSFET 5270. Reference numeral 5274 denotes a word line connected to the gate electrode of the MFSFET 5270 at the selected address. Moreover, reference numeral 5278 denotes the second data storing place of the MSFFET 5270.

In this case, to read remanent polarization data from the second data storing place 5278 of the selected MFSFET 5270, potential (3/4) V is supplied to the selected word line 5274, potential V is supplied to the selected second bit line 5272, and potential (3/4) V is supplied to the first bit line 5271 of a selection pair.

Then, the MFSFET 5270 is turned on and operates in a saturated region because it is a P-type MFSFET, potential (3/4) V is supplied to the gate electrode of it from the word line 5274, potential V is supplied to the source electrode of it from the second bit line 5272, and potential (3/4) V is supplied to the drain electrode of it from the first bit line 5271.

Therefore, the current when the directionality of the remanent polarization of the second data storing place 5278 located at the source side of the P-type MFSFET influences the threshold voltage of the MFSFET flows between the second bit line 5272 and the first bit line 5271. Therefore, by detecting the current by the read circuit shown in FIG. 15, it is possible to determine 1 or 0 of read data in accordance with the magnification of the detected current.

In this case, potential V is supplied to other unselected word lines 5275 and unselected bit lines 5273. As a result, no current flows because other MFSFETs at unselected addresses are turned off. Moreover, only voltage equal to or lower than coercive voltage 0 [V] or (1/4) V is applied to ferroelectric thin films of all MFSFETs, remanent polarization data is kept.

(Configuration of Ferroelectric Memory Device)

Then, the outline of the general configuration of an embodiment of a ferroelectric memory device of the present invention using the memory cells and control circuit described for FIGS. 1 to 53 is described below by referring to FIG. 54.

In this case, FIG. 15 is a block diagram of a memory cell group and only its peripheral control circuits. However, in the case of an actual memory device, a circuit factor including other functions is necessary. FIG. 54 is a block diagram showing the outline of the general configuration of a ferroelectric memory device including the portion.

Figure 54:
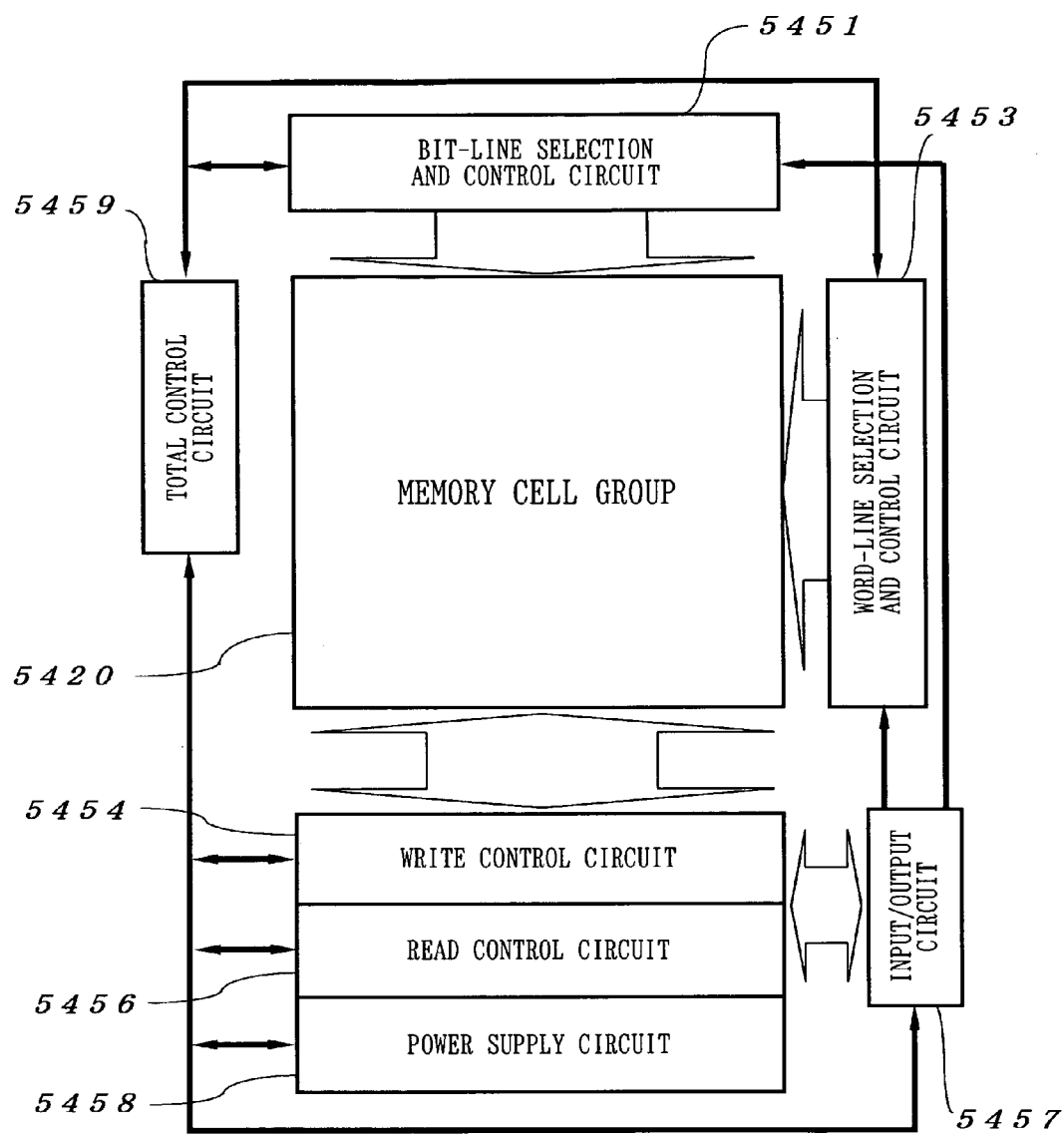
FIG. 54 is a block diagram showing the general configuration outline of a ferroelectric memory device of the present invention.

As shown in FIG. 54, an embodiment of a ferroelectric memory device of the present invention is constituted of a memory cell group 5420, bit-line selection and control circuit 5451, word-line selection and control circuit 5453, write control circuit 5454, read control circuit 5456, input/output circuit 5457, power supply circuit 5458, and total control circuit 5459.

In the case of the memory cell group 5420, memory cells shown in FIG. 1 or 34 are arranged like a matrix like the memory cells of the memory cell group 1520 in FIG. 15.

The word-line selection and control circuit 5453 and bit-line selection and control circuit 5451 select a desire memory cell by selecting the word line, first bit line, and second bit line as shown in FIG. 1 or 34 included in the memory cell group 1520.

The write control circuit 5454 writes the data passing through the input/output circuit 5457 in a memory cell selected by the word-line selection and control circuit 5453 and bit-line selection and control circuit 5451 in accordance with an instruction of the total control circuit 5459.

The read control circuit 5456 reads the data stored in a memory cell selected by the word-line selection and control circuit 5453 and bit-line selection and control circuit 5451 in accordance with an instruction of the total control circuit 5420 and outputs the data to the input/output circuit 5457.

The power supply circuit 5458 generates a plurality of signals having different potentials necessary when the write control circuit 5454 writes data in a desired memory cell and generates a plurality of signals having different potentials necessary when the read control circuit 5456 reads data from a desired memory cell. The total control circuit 5459 controls, when reading or writing data, each portion in accordance with the operation.

The word-line selection and control circuit 5453, bit-line selection and control circuit 5451, write control circuit 5454, and read control circuit 5456 control a word line, first bit line, and second bit line of a memory cell at a selected address when writing or reading data and control a word line, first bit line, and second bit line of a memory cell at an unselected address.

In this case, a part of the write circuit 1554 and a part of the write-read circuit 1555 shown in FIG. 15 are included in the write control circuit 5454 in FIG. 54. Moreover, a part of the read circuit 1556 and a part of the write-read circuit 1555 shown in FIG. 15 are included in the read control circuit 5456 in FIG. 54.

Moreover, in FIGS. 15 and 54, a field-effect transistor of a memory cell group uses a MFSFET having a ferroelectric for its gate portion. However, peripheral control circuits are respectively constituted of an insulating-gate field-effect transistor (MOSFET) in principle.

(Other Materials of Ferroelectric Thin Film)

As described above, a memory cell uses an MFSFET in which a ferroelectric thin film is embedded immediately below a gate electrode, its sectional structure is shown in FIG. 2, and a material of the ferroelectric thin film is inorganic ferroelectric such as PZTN, PZT, or SBT.

However, as shown in FIG. 2, the ferroelectric thin film 200 is formed on the silicon substrate 209. Therefore, this crystallizes ferroelectric on silicon (Si). It is generally difficult to directly grow inorganic ferroelectric crystal on silicon crystal and an ideal MFS structure is not formed because many crystal defects are left on the boundary. As a result, in the ferroelectric thin film 200 and silicon substrate 209, the remanent polarization of ferroelectric thin film 200 is influenced because of the crystal defects and a trouble is considered that desired data disappears in a short period.

Therefore, it is preferable to use not inorganic ferroelectric but organic ferroelectric as the material of the ferroelectric thin film 200. Because organic ferroelectric is formed at a low temperature compared to inorganic ferroelectric, a layer including many defects at the interface with silicon is not formed but an ideal MFS structure is formed.

Therefore, in FIG. 2, when the ferroelectric thin film 200 is organic ferroelectric, it is possible to realize a memory cell of an MFSFET having a preferable-characteristic ferroelectric thin film at its gate portion. In this case, PVDF (poly (vinylidene fluoride), P(VDF/TrFE) (poly(vinylidene fluoride-trifluoroethylene), or odd-number nylon such as nylon 7 or nylon 11 is proper as the material of organic ferroelectric.

(Other Structure of MFSFET Having Ferroelectric Thin Film at its Gate Portion)

As described above, a memory cell uses an MFSFET in which a ferroelectric thin film is embedded immediately below a gate electrode and its sectional structure is shown in FIG. 2. However, it is also allowed to use the following structure.

Figure 55:
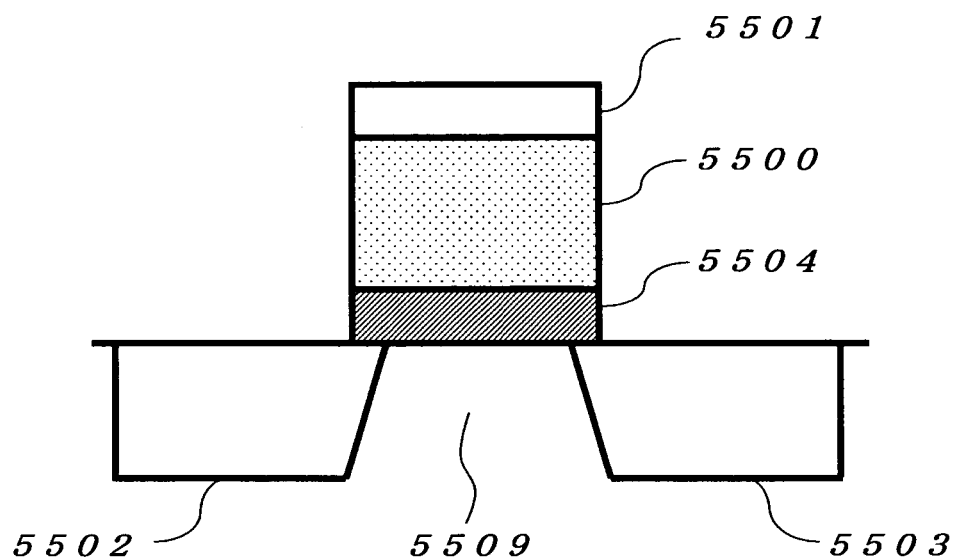
FIG. 55 is a sectional view showing a second configuration of an MFSFET structure having a ferroelectric thin film used for a ferroelectric memory device of the present invention.

FIG. 55 is a second structure of an MFSFET having a ferroelectric thin film at its gate portion.

In FIG. 55, reference numeral 5501 denotes agate electrode constituted of metal, 5502 denotes a first electrode serving as a source or drain and constituted of $N^+$ diffusion, and 5503 denotes a second electrode serving as a drain or source and constituted of $N^+$ diffusion. Reference numeral 5500 denotes a ferroelectric thin film and 5504 denotes a buffer layer constituted of a paraelectric thin film.

FIG. 2 is different from FIG. 55 in that the buffer layer 5504 constituted of a paraelectric insulator is used in FIG. 55. The buffer layer 5504 is used because when the crystallinity of the ferroelectric thin film 5500 is incomplete, leak of electric charges occurs between the silicon substrate 209 and ferroelectric thin film 200 of an MFSFET in the case of the structure in FIG. 2 and the holding characteristic of the remanent polarization of the ferroelectric thin film 200 may be deteriorated.

Therefore, as shown in FIG. 55, the buffer layer 5504 which is an insulator and in which a ferroelectric thin film is easily crystal-grown is set between the silicon substrate 5509 and the ferroelectric thin film 5500 so as to prevent the above characteristic from deteriorating.

Figure 56:
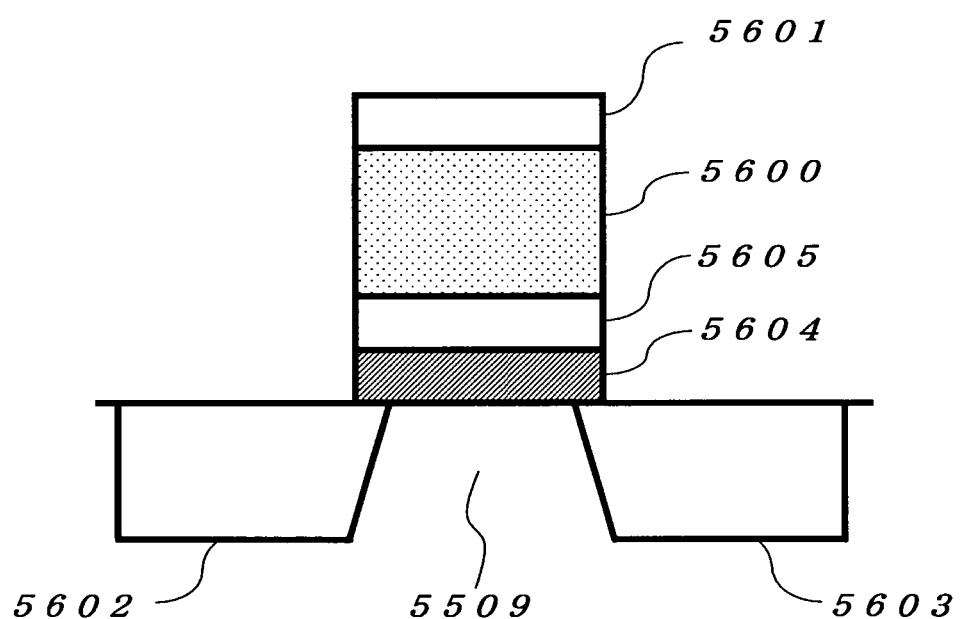
FIG. 56 is a sectional view showing a third configuration of an MFSFET structure having a ferroelectric thin film used for a ferroelectric memory device of the present invention.
Figure 59:
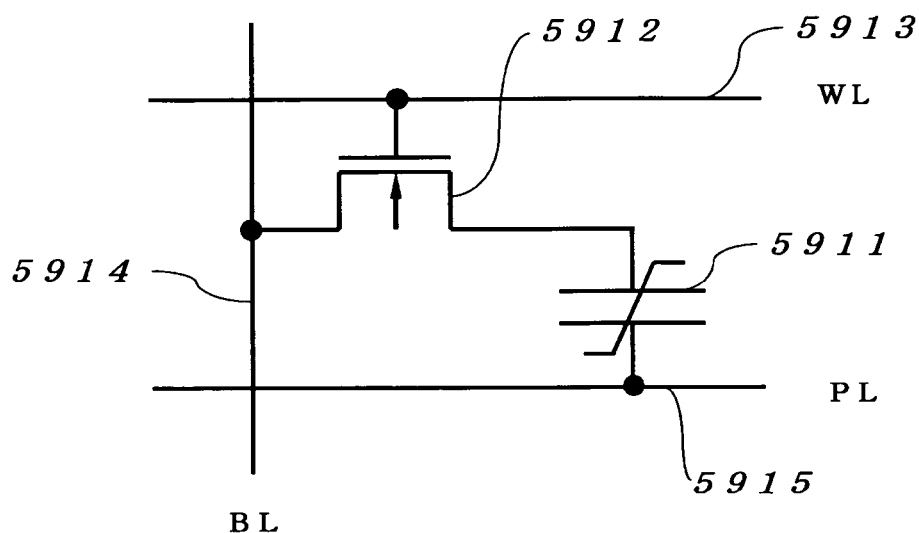
FIG. 59 is a circuit diagram sowing a configuration of a memory cell used for a conventional ferroelectric memory device.
Figure 60:
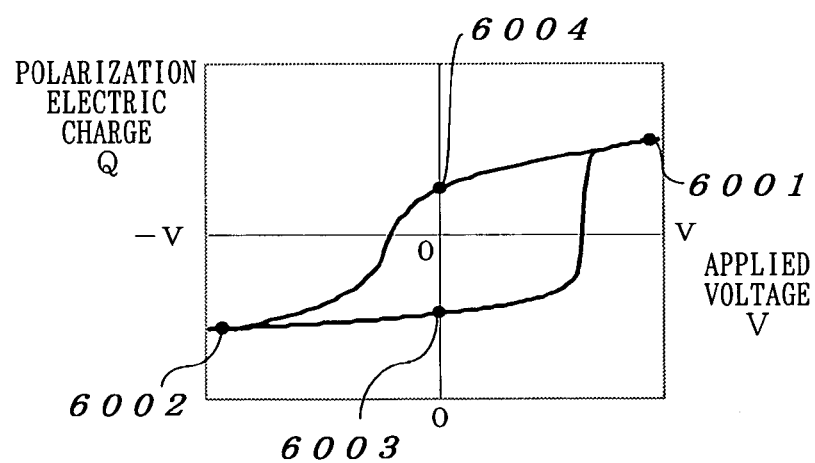
FIG. 60 is a characteristic diagram showing characteristics of polarization electric charge and applied voltage of a ferroelectric capacitor used for a conventional nondestructive-read ferroelectric memory device.
Figure 61:
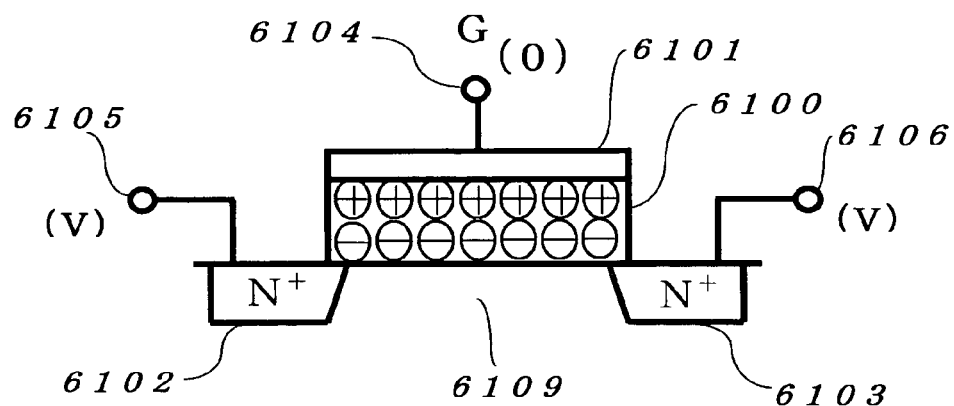
FIG. 61 is an illustration showing a polarization state in a ferroelectric thin film of a conventional MFSFET.
Figure 62:
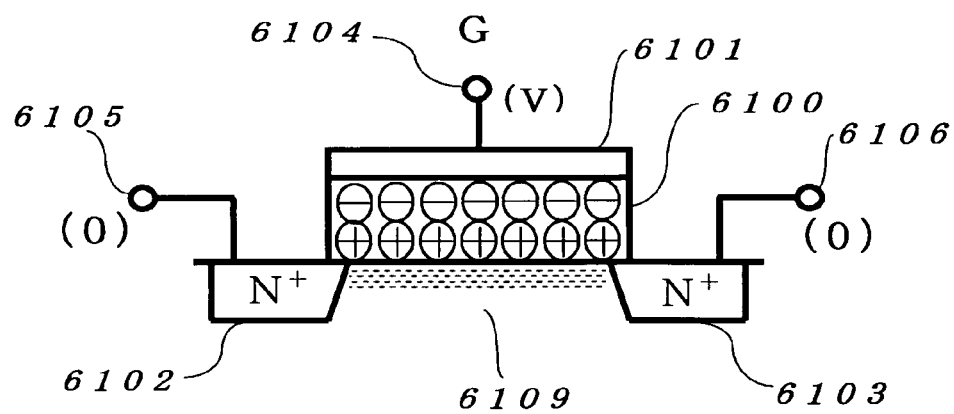
FIG. 62 is an illustration showing another polarization state in a ferroelectric thin film of a conventional MFSFET.

FIG. 56 shows a third structure of an MFSFET having a ferroelectric thin film at its gate portion.

In FIG. 56, reference numeral 5601 denotes a gate electrode constituted of metal, 5602 denotes a first electrode serving as a source or drain and constituted of $N^+$ diffusion, and 5603 denotes a second electrode serving as a drain or source and constituted of $N^+$ diffusion. Reference numeral 5600 denotes a ferroelectric thin film, 5604 denotes a first buffer layer formed of paraelectric thin film placing emphasis on insulating property, and 5605 denotes a second buffer layer made of a material in which ferroelectric is easily crystallized.

FIG. 55 is different from FIG. 56 in that the second buffer layer 5605 is used in FIG. 56. The function of a buffer layer is to easily realize the insulating property between a silicon substrate and a ferroelectric thin film and crystallization of the ferroelectric thin film. However, it may be difficult to realize two functions by one material.

Therefore, as shown in FIG. 56, the first buffer layer 5604 and second buffer layer 5605 are formed between the silicon substrate 5509 and the ferroelectric thin film 5500 so that their function is shared and can be compatible.

OTHERS

The present invention is not restricted to the above embodiment. Another embodiment is described below.

In the case of the embodiments 1, 2, and 3 respectively relating to a control method of word line and bit line, when reading data from a memory cell, potential differences between gate electrode and source electrode are set to $(1/2)$ V, $(1/3)$ V, and $(1/4)$ V. However, when it is possible to read data independently of these potentials, it is also allowed to supply a lower potential. In this case, long-term reliability and service life of a device are improved.

Moreover, in FIG. 2, PZTN is shown as a preferable example as a material of an inorganic ferroelectric thin film. However, by using a control method suitable for the characteristic of a ferroelectric thin film, it is allowed to use a material other than PZTN. For example, it is allowed to use BLT ($Bi_{4x}La_xTi_3O_{12}$), (Ba, Sr) $TiO_3$, $Bi_4Ti_3O_{12}$, or $BaBiNb_2O_9$ in addition to PZT and SBT shown as ferroelectric. Moreover, there are infinite materials when the rate of composition is changed. Furthermore, it is allowed to use an object obtained by laminating materials in which the upper layer and lower layer of a ferroelectric thin film are different in composition.

Furthermore, it is also allowed to use Ta, Ti, or alloy of Pt and Ti other than the above-described platinum (Pt) as a metal film or a material of a metal film electrode. Furthermore, it is possible to use an oxide conductive film of $RuO_2$, $IrO_2$, $SrRuO_3$, or $RhO_2$ according to circumstances. Not only electrical characteristic but also reliability of quality, easiness on fabrication, and fabrication cost are comprehensively studied on which material is selected among the above materials.

Moreover, in FIGS. 2, 55, and 56, an MFSFET is described by using a type having a bulk substrate. Furthermore, an integrated circuit using a silicon-on-insulator substrate (SOI) having an embedded oxide film layer can be similarly applied.

A basic circuit configuration of the present invention having a ferroelectric thin film at its gate portion to store two-bit data in one transistor can be applied to an integrated circuit including an MFSFET or MOSFET using silicon.

Moreover, in the case of a product having a specification allowing slow response speed, the basic circuit configuration can be applied to a TFT using an organic ferroelectric for its gate portion or the integrated circuit of an organic transistor.

What is claimed is:

1. A ferroelectric memory device comprising:
   a memory cell group including:
   a plurality of field-effect transistors set like a matrix and respectively having a ferroelectric thin film at its gate portion,
   a word line connected in common to each gate electrode of the field-effect transistors arranged in same row out of the field-effect transistors,
   a first bit line to be connected in common to each first electrode serving as a source or drain of each of the field-effect transistors arranged in same column out of the field-effect transistors, and
   a second bit line to be connected in common to a second electrode serving as a drain or source of each of the field-effect transistors arranged in the same column out of the field-effect transistors;
   a write circuit for applying voltages equal to or higher than a coercive electric field of the ferroelectric thin film between the first bit line and the word line and between the second bit line and the word line at different timings when writing data in one of the field-effect transistors at a selected address;
   a read circuit for applying voltage equal to or lower than the coercive electric field of the ferroelectric thin film between the first bit line and the word line at the first read timing to detect a current flowing between the first bit line and the second bit line and applying voltage equal to or lower than the coercive electric field of the ferroelectric thin film between the second bit line and the word line at the second read timing different from the first read timing to detect a current flowing between the second bit line and the first bit line when reading data from the one of the field-effect transistors at the selected address; and
   a selection and control circuit for selecting the one of the field-effect transistors at a desired address when the write circuit performs the write operation and controlling voltage so that voltage equal to or higher than the coercive electric field of the ferroelectric thin film is applied between a word line and a bit line of the selected field-effect transistor and the voltage equal to or lower than the coercive electric field of the ferroelectric thin film is applied to remaining word lines and bit lines other than the word line and the bit line, while for selecting the one of the field-effect transistors at the desired address when the read circuit performs the read operation and controlling the voltage so that the voltage equal to or lower than the coercive electric field of the ferroelectric thin film is applied to the word lines and the bit lines of all of the field-effect transistors,
   the one of the field-effect transistors being an N-type field-effect transistor,
   the voltage being supplied from the selection and control circuit to the N-type field-effect transistor ranges between 0 and V, and coercive voltage corresponding to the coercive electric field of the ferroelectric thin film ranges between $(1/2)$ V and V, and
   when writing data 1 in the N-type field-effect transistor at the selected address, the selection and control circuit supplying potential V to the word line of the selected address, potential $(1/2)$ V to a word line at an unselected address, potential 0V to the bit line at the selected address, and potential $(1/2)$ V to a bit line at the unselected address, and
   when writing data 0 in the N-type field-effect transistor at the selected address, the selection and control circuit supplying potential 0V to the word line of the selected address, potential $(1/2)$ V the word line at the unselected address, potential V to the bit line at the selected address, and potential $(1/2)$ V to the bit line at the unselected address.

2. A ferroelectric memory device comprising:
   a memory cell group including:
   a plurality of field-effect transistors set like a matrix and respectively having a ferroelectric thin film at its gate portion,
   a word line connected in common to each gate electrode of the field-effect transistors arranged in same row out of the field-effect transistors,
   a first bit line to be connected in common to each first electrode serving as a source or drain of each of the field-effect transistors arranged in same column out of the field-effect transistors, and
   a second bit line to be connected in common to a second electrode serving as a drain or source of each of the field-effect transistors arranged in the same column out of the field-effect transistors;
   a write circuit for applying voltages equal to or higher than a coercive electric field of the ferroelectric thin film between the first bit line and the word line and between the second bit line and the word line at different timings when writing data in one of the field-effect transistors at a selected address;
   a read circuit for applying voltage equal to or lower than the coercive electric field of the ferroelectric thin film between the first bit line and the word line at the first read timing to detect a current flowing between the first bit line and the second bit line and applying voltage equal to or lower than the coercive electric field of the ferroelectric thin film between the second bit line and the word line at the second read timing different from the first read timing to detect a current flowing between the second bit line and the first bit line when reading data from the one of the field-effect transistors at the selected address; and
   a selection and control circuit for selecting the one of the field-effect transistors at a desired address when the write circuit performs the write operation and controlling voltage so that voltage equal to or higher than the coercive electric field of the ferroelectric thin film is applied between a word line and a bit line of the selected field-effect transistor and the voltage equal to or lower than the coercive electric field of the ferroelectric thin film is applied to remaining word lines and bit lines other than the word line and the bit line, while for selecting the one of the field-effect transistors at the desired address when the read circuit performs the read operation and controlling the voltage so that the voltage equal to or lower than the coercive electric field of the ferroelectric thin film is applied to the word lines and the bit lines of all of the field-effect transistors,
   the one of the field-effect transistors being an N-type field-effect transistor,
   the voltage being supplied from the selection and control circuit to the N-type field-effect transistor ranges between 0 and V, and a coercive voltage corresponding to the coercive electric field of the ferroelectric thin film ranges between $(1/3)$ V and $(2/3)$ V, and when writing data 1 in the N-type field-effect transistor at the selected address, the selection and control circuit supplying potential V to the word line at the selected address, potential ($\frac{1}{3}$) V to a word line at an unselected address, potential ($\frac{1}{3}$) to the bit line at the selected address, and potential ($\frac{2}{3}$) V to a bit line at the unselected address, and when writing data 0 in the N-type field-effect transistor at the selected address, the selection and control circuit supplying potential 0V to the word line at the selected address, potential ($\frac{2}{3}$) V to the word line at the unselected address, potential ($\frac{2}{3}$) V to the bit line at the selected address and potential ($\frac{1}{3}$) V to the bit line at the unselected address.

3. A ferroelectric memory device comprising:

a memory cell group including:
- a plurality of field-effect transistors set like a matrix and respectively having a ferroelectric thin film at its gate portion,
- a word line connected in common to each gate electrode of the field-effect transistors arranged in same row out of the field-effect transistors,
- a first bit line to be connected in common to each first electrode serving as a source or drain of each of the field-effect transistors arranged in same column out of the field-effect transistors, and
- a second bit line to be connected in common to a second electrode serving as a drain or source of each of the field-effect transistors arranged in the same column out of the field-effect transistors;

a write circuit for applying voltages equal to or higher than a coercive electric field of the ferroelectric thin film between the first bit line and the word line and between the second bit line and the word line at different timings when writing data in one of the field-effect transistors at a selected address;

a read circuit for applying voltage equal to or lower than the coercive electric field of the ferroelectric thin film between the first bit line and the word line at the first read timing to detect a current flowing between the first bit line and the second bit line and applying voltage equal to or lower than the coercive electric field of the ferroelectric thin film between the second bit line and the word line at the second read timing different from the first read timing to detect a current flowing between the second bit line and the first bit line when reading data from the one of the field-effect transistors at the selected address; and a selection and control circuit for selecting the one of the field-effect transistors at a desired address when the write circuit performs the write operation and controlling voltage so that voltage equal to or higher than the coercive electric field of the ferroelectric thin film is applied between a word line and a bit line of the selected field-effect transistor and the voltage equal to or lower than the coercive electric field of the ferroelectric thin film is applied to remaining word lines and bit lines other than the word line and the bit line, while for selecting the one of the field-effect transistors at the desired address when the read circuit performs the read operation and controlling the voltage so that the voltage equal to or lower than the coercive electric field of the ferroelectric thin film is applied to the word lines and the bit lines of all of the field-effect transistors, the one of the field-effect transistors being an N-type field-effect transistor, the voltage being supplied from the selection and control circuit to the N-type field-effect transistor ranges between 0 and V and coercive voltage corresponding to the coercive electric field of the ferroelectric thin film ranges between ($\frac{1}{4}$) V and ($\frac{3}{4}$) V, when writing data 1 in the N-type field-effect transistor at the selected address, the selection and control circuit supplying potential V to the word line at the selected address, potential ($\frac{2}{4}$) V to a word line at a unselected address, potential ($\frac{1}{4}$) V to the bit line at the selected address, and potential ($\frac{3}{4}$) V to a bit line at the unselected address, and when writing data 0 in the N-type field-effect transistor at the selected address, the selection and control circuit supplying potential 0V to the word line at the selected address, potential ($\frac{2}{4}$) V to the word line at the unselected address, potential ($\frac{3}{4}$) V to the bit line at the selected address, and potential ($\frac{1}{4}$) V to the bit line at the unselected address.

4. The ferroelectric memory device according to claim 1, when reading data from the N-type field-effect transistor at the selected address, the selection and control circuit supplying potential ($\frac{1}{2}$) V to the word line at the selected address, potential 0V to the bit line, and potential ($\frac{1}{2}$) V to another bit line to be paired with the bit line and supplying potential 0V to the word line at the unselected address and unselected-address bit lines other than the paired bit lines.

5. The ferroelectric memory device according to claim 2, when reading data from the N-type field-effect transistor at the selected address, the selection and control circuit supplying potential ($\frac{1}{3}$) V to the word line at the selected address, potential 0V to the bit line, and potential ($\frac{1}{3}$) V to another bit line to be paired with the bit line and supplying potential 0V to the word line at the unselected address and unselected bit lines other than paired bit lines.

6. The ferroelectric memory device according to claim 3, when reading data from the N-type field-effect transistor at the selected address, the selection and control circuit supplying potential ($\frac{1}{4}$) V to the word line at the selected address, potential 0V to the bit line, and potential ($\frac{1}{4}$) V to another bit line to be paired with the bit line and potential 0V to the word line at the unselected address and unselected bit lines other than paired bit lines.

7. A ferroelectric memory device comprising:

a memory cell group including:
- a plurality of field-effect transistors set like a matrix and respectively having a ferroelectric thin film at its gate portion,
- a word line connected in common to each gate electrode of the field-effect transistors arranged in same row out of the field-effect transistors,
- a first bit line to be connected in common to each first electrode serving as a source or drain of each of the field-effect transistors arranged in same column out of the field-effect transistors, and
- a second bit line to be connected in common to a second electrode serving as a drain or source of each of the field-effect transistors arranged in the same column out of the field-effect transistors;

a write circuit for applying voltages equal to or higher than a coercive electric field of the ferroelectric thin film between the first bit line and the word line and between the second bit line and the word line at different timings when writing data in one of the field-effect transistors at a selected address;

a read circuit for applying voltage equal to or lower than the coercive electric field of the ferroelectric thin film between the first bit line and the word line at the first read timing to detect a current flowing between the first bit line and the second bit line and applying voltage equal to or lower than the coercive electric field of the ferroelectric thin film between the second bit line and the word line at the second read timing different from the first read timing to detect a current flowing between the second bit line and the first bit line when reading data from the one of the field-effect transistors at the selected address; and a selection and control circuit for selecting the one of the field-effect transistors at a desired address when the write circuit performs the write operation and controlling voltage so that voltage equal to or higher than the coercive electric field of the ferroelectric thin film is applied between a word line and a bit line of the selected field-effect transistor and the voltage equal to or lower than the coercive electric field of the ferroelectric thin film is applied to remaining word lines and bit lines other than the word line and the bit line, while for selecting the one of the field-effect transistors at the desired address when the read circuit performs the read operation and controlling the voltage so that the voltage equal to or lower than the coercive electric field of the ferroelectric thin film is applied to the word lines and the bit lines of all of the field-effect transistors, the one of the field-effect transistors being a P-type field-effect transistor, the voltage being supplied from the selection and control circuit to the P-type field-effect transistor ranges between 0 and V and coercive voltage corresponding to the coercive electric field of the ferroelectric thin film ranges between ($\frac{1}{2}$) V and V, when writing data 1 in the P-type field-effect transistor at the selected address, the selection and control circuit supplying potential 0V to the word line at the selected address, potential ($\frac{1}{2}$) V to a word line at an unselected address, potential V to the bit line at the selected address and potential ($\frac{1}{2}$) V to a bit line at the unselected address, and when writing data 0 in the P-type field-effect transistor at the selected address, the selected and control circuit supplying potential V to the word line at the selected address, potential ($\frac{1}{2}$) V to the word line at the unselected address, potential 0V to the bit line at the selected address, and potential ($\frac{1}{2}$) V to the bit line at the unselected address.

8. A ferroelectric memory device comprising:
a memory cell group including:
   a plurality of field-effect transistors set like a matrix and respectively having a ferroelectric thin film at its gate portion.
   a word line connected in common to each gate electrode of the field-effect transistors arranged in same row out of the field-effect transistors,
   a first bit line to be connected in common to each first electrode serving as a source or drain of each of the field-effect transistors arranged in same column out of the field-effect transistors, and
   a second bit line to be connected in common to a second electrode serving as a drain or source of each of the field-effect transistors arranged in the same column out of the field-effect transistors;

a write circuit for applying voltages equal to or higher than a coercive electric field of the ferroelectric thin film between the first bit line and the word line and between the second bit line and the word line at different timings when writing data in one of the field-effect transistors at a selected address;

a read circuit for applying voltage equal to or lower than the coercive electric field of the ferroelectric thin film between the first bit line and the word line at the first read timing to detect a current flowing between the first bit line and the second bit line and applying voltage equal to or lower than the coercive electric field of the ferroelectric thin film between the second bit line and the word line at the second read timing different from the first read timing to detect a current flowing between the second bit line and the first bit line when reading data from the one of the field-effect transistors at the selected address; and a selection and control circuit for selecting the one of the field-effect transistors at a desired address when the write circuit performs the write operation and controlling voltage so that voltage equal to or higher than the coercive electric field of the ferroelectric thin film is applied between a word line and a bit line of the selected field-effect transistor and the voltage equal to or lower than the coercive electric field of the ferroelectric thin film is applied to remaining word lines and bit lines other than the word line and the bit line, while for selecting the one of the field-effect transistors at the desired address when the read circuit performs the read operation and controlling the voltage so that the voltage equal to or lower than the coercive electric field of the ferroelectric thin film is applied to the word lines and the bit lines of all of the field-effect transistors, the one of the field-effect transistors being a P-type field-effect transistor, the voltage being supplied from the selection and control circuit to the P-type field-effect transistor ranges between 0 and V and coercive voltage corresponding to the coercive electric field of the ferroelectric thin film ranges between ($\frac{1}{3}$) V and ($\frac{2}{3}$) V, when writing data 1 in the P-type field-effect transistor at the selected address, the selection and control circuit supplying potential 0V to the word line at the selected address, potential ($\frac{2}{3}$) V to a word line at an unselected address, potential ($\frac{2}{3}$) V to the bit line at the selected address, and potential ($\frac{1}{3}$) V to a bit line at the unselected address, and when writing data 0 in the P-type field-effect transistor at the selected address, the selection and control circuit supplying potential V to the word line at the selected address, potential ($\frac{1}{3}$) V to the word line at the unselected address, potential ($\frac{1}{3}$) V to the bit line at the selected address, and potential ($\frac{2}{3}$) V to the bit line at the unselected address.

9. A ferroelectric memory device comprising:
a memory cell group including:
   a plurality of field-effect transistors set like a matrix and respectively having a ferroelectric thin film at its gate portion.
   a word line connected in common to each gate electrode of the field-effect transistors arranged in same row out of the field-effect transistors.
   a first bit line to be connected in common to each first electrode serving as a source or drain of each of the field-effect transistors arranged in same column out of the field-effect transistors, and a second bit line to be connected in common to a second electrode serving as a drain or source of each of the field-effect transistors arranged in the same column out of the field-effect transistors;

a write circuit for applying voltages equal to or higher than a coercive electric field of the ferroelectric thin film between the first bit line and the word line and between the second bit line and the word line at different timings when writing data in one of the field-effect transistors at a selected address;

a read circuit for applying voltage equal to or lower than the coercive electric field of the ferroelectric thin film between the first bit line and the word line at the first read timing to detect a current flowing between the first bit line and the second bit line and applying voltage equal to or lower than the coercive electric field of the ferroelectric thin film between the second bit line and the word line at the second read timing different from the first read timing to detect a current flowing between the second bit line and the first bit line when reading data from the one of the field-effect transistors at the selected address; and a selection and control circuit for selecting the one of the field-effect transistors at a desired address when the write circuit performs the write operation and controlling voltage so that voltage equal to or higher than the coercive electric field of the ferroelectric thin film is applied between a word line and a bit line of the selected field-effect transistor and the voltage equal to or lower than the coercive electric field of the ferroelectric thin film is applied to remaining word lines and bit lines other than the word line and the bit line, while for selecting the one of the field-effect transistors at the desired address when the read circuit performs the read operation and controlling the voltage so that the voltage equal to or lower than the coercive electric field of the ferroelectric thin film is applied to the word lines and the bit lines of all of the field-effect transistors.

the one of field-effect transistors being a P-type field-effect transistor, the voltage being supplied from the selection and control circuit to the P-type field-effect transistor ranges between 0 and V and coercive voltage corresponding to the coercive electric field of the ferroelectric thin film ranges between ($\frac{1}{4}$) V and ($\frac{3}{4}$) V, when writing data 1 in the P-type field-effect transistor at the selected address, the selection and control circuit supplying potential 0V to the word line at the selected address, potential ($\frac{2}{4}$) V to a word line at an unselected address, potential ($\frac{3}{4}$) V to the bit line at the selected address, and potential ($\frac{1}{4}$) V to the bit line at the unselected address, and when writing data 0 in the P-type field-effect transistor at the selected address, the selection and control circuit supplying potential V to the word line at the selected address, potential ($\frac{2}{4}$) V to the word line at the unselected address, potential ($\frac{1}{4}$) V to the bit line at the selected address, and potential ($\frac{3}{4}$) V to the bit line at the unselected address.

10. The ferroelectric memory device according to claim 7, when reading data from the P-type field-effect transistor at the selected address, the selection and control circuit supplying potential ($\frac{1}{2}$) V to the word line at the selected address, potential V to the bit line, and potential ($\frac{1}{2}$) V to another bit line to be paired with the bit line and supplying potential V to the word line at the unselected address and unselected bit lines other than paired bit lines.

11. The ferroelectric memory device according to claim 8, when reading data from the P-type field-effect transistor at the selected address, the selection and control circuit supplying potential (2/3) V to the word line at the selected address, potential V to the bit line, and potential (2/3) V to another bit line to be paired with the bit line, and supplying potential V to the word line at the unselected address and unselected bit lines other than paired bit lines.

12. The ferroelectric memory device according to claim 9, when reading data from the P-type field-effect transistor at the selected address, the selection and control circuit supplying potential ($\frac{3}{4}$) V to the word line at the selected address, potential V to the bit line, and potential ($\frac{3}{4}$) V to another bit line to be paired with the bit line, and supplying V to the word line at the unselected address and unselected bit lines other than paired bit lines.

* * * * *